US011094582B2

(12) United States Patent
Zhu

(10) Patent No.: US 11,094,582 B2
(45) **Date of Patent: *Aug. 17, 2021**

(54) SELECTIVE DEPOSITION METHOD TO FORM AIR GAPS

(71) Applicant: ASM IP Holding B.V., Almere (NL)

(72) Inventor: Chiyu Zhu, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,787

(22) Filed: Nov. 15, 2019

(65) Prior Publication Data

US 2020/0105579 A1 Apr. 2, 2020

Related U.S. Application Data

(63) Continuation of application No. 15/836,547, filed on Dec. 8, 2017, now Pat. No. 10,541,173, which is a continuation of application No. 15/205,890, filed on Jul. 8, 2016, now Pat. No. 9,859,151.

(51) Int. Cl.

*H01L 21/76* (2006.01)
*H01L 21/768* (2006.01)
*H01L 21/02* (2006.01)

(52) U.S. Cl.

CPC ...... *H01L 21/7682* (2013.01); *H01L 21/0228* (2013.01); *H01L 21/02164* (2013.01); *H01L 21/02167* (2013.01); *H01L 21/02175* (2013.01); *H01L 21/02271* (2013.01); *H01L 21/76832* (2013.01)

(58) Field of Classification Search

None

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |
| 2,059,480 | A | 11/1936 | Obermaier |
| 2,161,626 | A | 6/1939 | Loughner et al. |
| 2,240,163 | A | 4/1941 | Pick |
| 2,266,416 | A | 12/1941 | Duclos |
| 2,280,778 | A | 4/1942 | Andersen |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Notice of Allowance dated May 22, 2020 in Application No. 201610028064.1.

(Continued)

*Primary Examiner* — Bilkis Jahan

(74) *Attorney, Agent, or Firm* — Snell & Wilmer LLP

(57) ABSTRACT

A method for depositing a film to form an air gap within a semiconductor device is disclosed. An exemplary method comprises pulsing a metal halide precursor onto the substrate and pulsing an oxygen precursor onto a selective deposition surface. The method can be used to form an air gap to, for example, reduce a parasitic resistance of the semiconductor device.

20 Claims, 12 Drawing Sheets

(56) References Cited

U.S. PATENT DOCUMENTS

D142,841 S 11/1945 D'Algodt
2,410,420 A 11/1946 Bennett
2,441,253 A 5/1948 Sarver
2,480,557 A 8/1949 Cummins
2,563,931 A 8/1951 Harrison
2,660,061 A 11/1953 Lewis
2,745,640 A 5/1956 Cushman
2,847,320 A 8/1958 Bulloff
2,990,045 A 6/1961 Root
3,038,951 A 6/1962 Mead
3,089,507 A 5/1963 Drake et al.
3,094,396 A 6/1963 Flugge et al.
3,232,437 A 2/1966 Hultgren
3,263,502 A 8/1966 Springfield
3,332,286 A 7/1967 Strong
3,410,349 A 11/1968 Troutman
3,420,622 A 1/1969 Donges et al.
3,588,192 A 6/1971 Drutchas et al.
3,647,387 A 3/1972 Benson
3,647,716 A 3/1972 Koches
3,713,899 A 1/1973 Sebestyen
3,718,429 A 2/1973 Williamson
3,796,182 A 3/1974 Rosler
3,814,128 A 6/1974 Grantham
3,833,492 A 9/1974 Bollyky
3,854,443 A 12/1974 Baerg
3,862,397 A 1/1975 Anderson et al.
3,867,205 A 2/1975 Schley
3,885,504 A 5/1975 Baermann
3,887,790 A 6/1975 Ferguson
3,904,371 A 9/1975 Neti
3,913,058 A 10/1975 Nishio et al.
3,913,617 A 10/1975 van Laar
3,947,685 A 3/1976 Meinel
3,960,559 A 6/1976 Suzuki
3,962,004 A 6/1976 Sonneborn
3,997,638 A 12/1976 Manning et al.
4,048,110 A 9/1977 Vanderspurt
4,054,071 A 10/1977 Patejak
4,058,430 A 11/1977 Suntola et al.
4,079,944 A 3/1978 Durley et al.
4,093,491 A 6/1978 Whelpton et al.
D249,341 S 9/1978 Mertz
4,126,027 A 11/1978 Smith et al.
4,134,425 A 1/1979 Gussefeld et al.
4,145,699 A 3/1979 Hu et al.
4,149,237 A 4/1979 Freitas
4,152,760 A 5/1979 Freitas et al.
4,157,751 A 6/1979 Grundken et al.
4,164,959 A 8/1979 Wurzburger
4,176,630 A 12/1979 Elmer
4,179,530 A 12/1979 Koppl et al.
4,181,330 A 1/1980 Kojima
4,194,536 A 3/1980 Stine et al.
4,217,463 A 8/1980 Swearingen
4,229,064 A 10/1980 Vetter et al.
4,234,449 A 11/1980 Wolson et al.
4,314,763 A 2/1982 Steigmeier et al.
4,322,592 A 3/1982 Martin
4,324,611 A 4/1982 Vogel et al.
4,333,735 A 6/1982 Hardy
4,355,912 A 10/1982 Haak
4,389,973 A 6/1983 Suntola et al.
D269,850 S 7/1983 Preisler et al.
4,393,013 A 7/1983 McMenamin
4,401,507 A 8/1983 Engle
4,413,022 A 11/1983 Suntola et al.
4,414,492 A 11/1983 Harslet
4,436,674 A 3/1984 McMenamin
4,444,990 A 4/1984 Villar
D274,122 S 6/1984 Stahel et al.
4,454,370 A 6/1984 Voznick
4,455,193 A 6/1984 Jeuch et al.
4,465,716 A 8/1984 Baber et al.
4,466,766 A 8/1984 Geren et al.
4,479,831 A 10/1984 Sandow
4,484,061 A 11/1984 Zelinka et al.
4,488,506 A 12/1984 Heinecke et al.
4,495,024 A 1/1985 Bok
4,499,354 A 2/1985 Hill et al.
4,504,439 A 3/1985 Elter et al.
4,512,113 A 4/1985 Budinger
4,512,841 A 4/1985 Cunningham et al.
4,527,005 A 7/1985 McKelvey et al.
4,534,816 A 8/1985 Chen et al.
4,537,001 A 8/1985 Uppstrom
4,548,688 A 10/1985 Mathews
4,560,590 A 12/1985 Bok
4,570,328 A 2/1986 Price et al.
4,575,408 A 3/1986 Bok
4,575,636 A 3/1986 Caprari
4,578,560 A 3/1986 Tanaka et al.
4,579,080 A 4/1986 Martin et al.
4,579,378 A 4/1986 Snyders
4,579,623 A 4/1986 Suzuki et al.
4,581,520 A 4/1986 Vu et al.
4,590,326 A 5/1986 Woldy
4,611,966 A 9/1986 Johnson
4,620,998 A 11/1986 Lalvani
4,622,918 A 11/1986 Bok
4,624,728 A 11/1986 Bithell et al.
D288,556 S 3/1987 Wallgren
4,653,541 A 3/1987 Oehlschlaeger et al.
4,654,226 A 3/1987 Jackson et al.
4,655,592 A 4/1987 Allemand
4,662,987 A 5/1987 Bok
4,664,769 A 5/1987 Cuomo et al.
4,670,126 A 6/1987 Messer et al.
4,681,134 A 7/1987 Paris
4,693,211 A 9/1987 Ogami et al.
4,707,815 A 11/1987 Yamasaki
4,717,461 A 1/1988 Strahl et al.
4,718,637 A 1/1988 Contin
4,720,407 A 1/1988 Sculke
4,721,533 A 1/1988 Phillippi et al.
4,721,534 A 1/1988 Phillippi et al.
4,722,298 A 2/1988 Rubin et al.
4,724,272 A 2/1988 Raniere et al.
4,725,204 A 2/1988 Powell
4,735,259 A 4/1988 Vincent
4,738,618 A 4/1988 Massey et al.
4,738,748 A 4/1988 Kisa
4,747,367 A 5/1988 Posa
4,749,416 A 6/1988 Greenspan
4,750,520 A 6/1988 Heim et al.
4,753,192 A 6/1988 Goldsmith et al.
4,753,856 A 6/1988 Haluska et al.
4,756,794 A 7/1988 Yoder
4,764,076 A 8/1988 Layman et al.
4,770,590 A 9/1988 Hugues et al.
4,771,015 A 9/1988 Kanai
4,775,281 A 10/1988 Prentakis
4,776,744 A 10/1988 Stonestreet et al.
4,780,169 A 10/1988 Stark et al.
4,781,511 A 11/1988 Harada et al.
4,789,294 A 12/1988 Sato et al.
4,790,258 A 12/1988 Drage et al.
4,802,441 A 2/1989 Waugh
4,808,387 A 2/1989 Datta et al.
4,812,201 A 3/1989 Sakai et al.
4,812,217 A 3/1989 George et al.
4,821,674 A 4/1989 deBoer et al.
4,827,430 A 5/1989 Aid et al.
4,828,224 A 5/1989 Crabb et al.
4,830,515 A 5/1989 Cortes
4,837,113 A 6/1989 Luttmer et al.
4,837,185 A 6/1989 Yau et al.
4,854,263 A 8/1989 Chang et al.
4,854,266 A 8/1989 Simson et al.
4,857,137 A 8/1989 Tachi et al.
4,857,382 A 8/1989 Liu et al.
4,858,557 A 8/1989 Pozzetti et al.
4,863,374 A 9/1989 Vukovich
4,867,629 A 9/1989 Iwasawa et al.

(56) References Cited

U.S. PATENT DOCUMENTS 4,871,523 A 10/1989 Datta et al.
4,874,273 A 10/1989 Tokisue et al.
4,882,199 A 11/1989 Sadoway et al.
4,916,091 A 4/1990 Freeman et al.
4,917,556 A 4/1990 Stark et al.
4,920,918 A 5/1990 Adams et al.
4,925,388 A 5/1990 Iseki et al.
4,934,831 A 6/1990 Volbrecht
4,938,815 A 7/1990 McNeilly
D309,702 S 8/1990 Hall
4,949,848 A 8/1990 Kos
4,950,624 A 8/1990 Inuzima et al.
4,956,538 A 9/1990 Moslehi
4,958,061 A 9/1990 Wakabayashi et al.
D311,126 S 10/1990 Crowley
4,962,063 A 10/1990 Maydan et al.
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,102 A 1/1991 Nguyen et al.
4,987,856 A 1/1991 Hey
4,989,992 A 2/1991 Piai
4,991,614 A 2/1991 Hammel
5,002,632 A 3/1991 Loewenstein et al.
5,013,691 A 5/1991 Lory et al.
5,022,961 A 6/1991 Izumi et al.
5,027,746 A 7/1991 Frijlink
5,028,366 A 7/1991 Harakal et al.
D320,148 S 9/1991 Andrews
5,049,029 A 9/1991 Mitsui et al.
5,053,247 A 10/1991 Moore
5,057,436 A 10/1991 Ball
5,060,322 A 10/1991 Delepine
5,061,083 A 10/1991 Grimm et al.
5,062,386 A 11/1991 Christensen
5,064,337 A 11/1991 Asakawa et al.
5,065,698 A 11/1991 Koike
5,067,437 A 11/1991 Watanabe et al.
5,069,591 A 12/1991 Kinoshita
5,071,258 A 12/1991 Usher et al.
5,074,017 A 12/1991 Toya et al.
5,082,517 A 1/1992 Moslehi
5,084,126 A 1/1992 McKee
5,088,444 A 2/1992 Ohmine et al.
5,097,890 A 3/1992 Nakao
5,098,638 A 3/1992 Sawada
5,098,865 A 3/1992 MacHado
5,104,514 A 4/1992 Quartarone
5,107,170 A 4/1992 Ishikawa et al.
5,108,192 A 4/1992 Mailliet et al.
5,110,407 A 5/1992 Ono et al.
5,114,683 A 5/1992 Hirase
5,116,018 A 5/1992 Friemoth et al.
D327,534 S 6/1992 Manville
5,119,760 A 6/1992 McMillan et al.
5,125,358 A 6/1992 Ueda et al.
5,130,003 A 7/1992 Conrad
5,134,965 A 8/1992 Tokuda et al.
5,137,286 A 8/1992 Whitford
5,151,296 A 9/1992 Tokunaga
5,154,301 A 10/1992 Kos
5,158,128 A 10/1992 Inoue et al.
D330,900 S 11/1992 Wakegijig
5,167,716 A 12/1992 Boitnott et al.
5,167,761 A 12/1992 Westendorp et al.
5,174,881 A 12/1992 Iwasaki et al.
5,176,451 A 1/1993 Sasada
5,178,639 A 1/1993 Nishi
5,178,682 A 1/1993 Tsukamoto et al.
5,180,273 A 1/1993 Sakaya et al.
5,180,435 A 1/1993 Markunas et al.
5,181,779 A 1/1993 Shia et al.
5,182,232 A 1/1993 Chhabra et al.
5,183,511 A 2/1993 Yamazaki et al.
D333,606 S 3/1993 Kanemitsu et al.
5,192,717 A 3/1993 Kawakami
5,193,912 A 3/1993 Saunders
5,193,969 A 3/1993 Rush et al.
5,194,401 A 3/1993 Adams et al.
5,199,603 A 4/1993 Prescott
5,213,650 A 5/1993 Wang et al.
5,221,556 A 6/1993 Hawkins et al.
5,225,366 A 7/1993 Yoder
5,226,383 A 7/1993 Bhat
5,226,713 A 7/1993 Matsumura
5,226,967 A 7/1993 Chen et al.
5,228,114 A 7/1993 Suzuki
5,232,508 A 8/1993 Arena et al.
5,234,526 A 8/1993 Chen et al.
5,242,539 A 9/1993 Kumihashi et al.
5,243,195 A 9/1993 Nishi
5,243,202 A 9/1993 Mori et al.
5,246,218 A 9/1993 Yap et al.
5,246,500 A 9/1993 Samata et al.
5,249,960 A 10/1993 Monoe
5,259,881 A 11/1993 Edwards et al.
5,261,167 A 11/1993 Sakata
5,266,526 A 11/1993 Aoyama
5,268,989 A 12/1993 Moslehi et al.
5,271,967 A 12/1993 Kramer et al.
5,273,609 A 12/1993 Moslehi
5,277,932 A 1/1994 Spencer
5,278,494 A 1/1994 Obigane
5,279,886 A 1/1994 Kawai et al.
5,279,986 A 1/1994 Maloney et al.
5,281,274 A 1/1994 Yoder
5,284,519 A 2/1994 Gadgil
5,288,684 A 2/1994 Yamazaki et al.
5,294,572 A 3/1994 Granneman et al.
5,294,778 A 3/1994 Carman et al.
5,305,417 A 4/1994 Najm et al.
5,306,666 A 4/1994 Izumi
5,306,946 A 4/1994 Yamamoto
5,308,650 A 5/1994 Krummel et al.
5,310,456 A 5/1994 Kadomura
5,312,245 A 5/1994 Brannen et al.
5,313,061 A 5/1994 Drew et al.
5,314,538 A 5/1994 Maeda et al.
5,314,570 A 5/1994 Ikegaya et al.
5,315,092 A 5/1994 Takahashi et al.
5,320,218 A 6/1994 Yamashita et al.
5,326,427 A 7/1994 Jerbic
5,328,810 A 7/1994 Lowrey et al.
5,335,309 A 8/1994 Fujii et al.
5,336,327 A 8/1994 Lee
5,338,362 A 8/1994 Imahashi
5,340,261 A 8/1994 Oosawa et al.
5,346,961 A 9/1994 Shaw et al.
5,348,774 A 9/1994 Golecki et al.
5,350,480 A 9/1994 Gray
5,354,433 A 10/1994 Granneman et al.
5,354,580 A 10/1994 Goela et al.
5,356,478 A 10/1994 Chen et al.
5,356,672 A 10/1994 Schmitt et al.
5,360,269 A 11/1994 Ogawa et al.
5,364,667 A 11/1994 Rhieu
D353,452 S 12/1994 Groenhoff
5,374,315 A 12/1994 Deboer et al.
D354,898 S 1/1995 Nagy
5,380,367 A 1/1995 Bertone
5,382,311 A 1/1995 Ishikawa et al.
5,387,265 A 2/1995 Kakizaki et al.
5,388,945 A 2/1995 Garric et al.
5,393,577 A 2/1995 Uesugi et al.
5,397,395 A 3/1995 Sano et al.
5,403,630 A 4/1995 Matsui et al.
5,404,082 A 4/1995 Hernandez et al.
5,407,449 A 4/1995 Zinger
5,407,867 A 4/1995 Iwasaki et al.
5,413,813 A 5/1995 Cruse et al.
5,414,221 A 5/1995 Gardner
5,415,753 A 5/1995 Hurwitt et al.

(56) References Cited

U.S. PATENT DOCUMENTS 5,418,382 A 5/1995 Blackwood et al.
5,421,893 A 6/1995 Perlov
5,422,139 A 6/1995 Fischer
5,423,942 A 6/1995 Robbins et al.
5,426,137 A 6/1995 Allen
5,427,824 A 6/1995 Inushima et al.
5,430,011 A 7/1995 Tanaka et al.
5,431,734 A 7/1995 Chapple-Sokol et al.
5,443,646 A 8/1995 Yamada et al.
5,443,648 A 8/1995 Ohkase
5,443,686 A 8/1995 Jones et al.
5,444,217 A 8/1995 Moore
5,447,294 A 9/1995 Sakata et al.
5,453,124 A 9/1995 Moslehi et al.
D363,464 S 10/1995 Fukasawa
5,456,207 A 10/1995 Gedridge et al.
5,461,214 A 10/1995 Peck et al.
5,462,899 A 10/1995 Ikeda
5,463,176 A 10/1995 Eckert
5,464,313 A 11/1995 Ohsawa
5,474,410 A 12/1995 Ozawa et al.
5,474,612 A 12/1995 Sato et al.
5,480,488 A 1/1996 Bittner et al.
5,480,818 A 1/1996 Matsumoto et al.
5,482,559 A 1/1996 Imai et al.
5,484,484 A 1/1996 Yamaga et al.
5,494,439 A 2/1996 Goldstein et al.
5,494,494 A 2/1996 Mizuno et al.
5,496,408 A 3/1996 Motoda et al.
5,501,740 A 3/1996 Besen et al.
5,503,875 A 4/1996 Imai et al.
5,504,042 A 4/1996 Cho et al.
5,510,277 A 4/1996 Cunningham et al.
5,512,102 A 4/1996 Yamazaki
5,514,439 A 5/1996 Sibley
5,518,549 A 5/1996 Hellwig
5,519,234 A 5/1996 Paz de Araujo
5,520,743 A 5/1996 Takahashi et al.
5,523,616 A 6/1996 Yasuhide
5,527,111 A 6/1996 Lysen et al.
5,527,417 A 6/1996 Iida et al.
5,531,218 A 7/1996 Krebs
5,531,835 A 7/1996 Fodor et al.
5,537,311 A 7/1996 Stevens
5,540,059 A 7/1996 Yokokawa
5,540,898 A 7/1996 Davidson
5,554,557 A 9/1996 Koh
5,556,275 A 9/1996 Sakata et al.
5,558,717 A 9/1996 Zhao et al.
5,559,046 A 9/1996 Oishi et al.
5,562,383 A 10/1996 Iwai et al.
5,562,947 A 10/1996 White et al.
5,562,952 A 10/1996 Nakahigashi et al.
5,569,402 A 10/1996 Meisser et al.
5,574,247 A 11/1996 Nishitani et al.
5,576,629 A 11/1996 Turner
5,577,331 A 11/1996 Suzuki
5,583,736 A 12/1996 Anderson et al.
5,586,585 A 12/1996 Bonora et al.
5,589,002 A 12/1996 Su
5,589,110 A 12/1996 Motoda et al.
5,595,606 A 1/1997 Fujikawa et al.
5,601,641 A 2/1997 Stephens
5,602,060 A 2/1997 Kobayashi et al.
5,604,410 A 2/1997 Vollkommer et al.
5,611,448 A 3/1997 Chen
5,616,264 A 4/1997 Nishi et al.
5,616,947 A 4/1997 Tamura
5,621,982 A 4/1997 Yamashita
5,632,919 A 5/1997 MacCracken et al.
D380,527 S 7/1997 Velez
5,650,013 A 7/1997 Yamazaki
5,650,351 A 7/1997 Wu
5,653,807 A 8/1997 Crumbaker
5,656,093 A 8/1997 Burkhart et al.
5,662,470 A 9/1997 Huussen et al.
5,663,899 A 9/1997 Zvonar et al.
5,665,608 A 9/1997 Chapple-Sokol et al.
5,667,592 A 9/1997 Boitnott et al.
5,670,786 A 9/1997 Meyer et al.
5,679,215 A 10/1997 Barnes et al.
5,681,779 A 10/1997 Pasch et al.
D386,076 S 11/1997 Moore
5,683,517 A 11/1997 Shan
5,685,912 A 11/1997 Nishizaka
5,685,914 A 11/1997 Hills et al.
5,695,567 A 12/1997 Kordina
5,697,706 A 12/1997 Ciaravino et al.
5,698,036 A 12/1997 Ishii et al.
5,700,729 A 12/1997 Lee et al.
5,708,825 A 1/1998 Sotomayor
5,709,745 A 1/1998 Larkin et al.
5,711,811 A 1/1998 Suntola et al.
5,716,133 A 2/1998 Hosokawa et al.
5,718,574 A 2/1998 Shimazu
5,720,927 A 2/1998 Cripe et al.
D392,855 S 3/1998 Pillow
5,724,748 A 3/1998 Brooks
5,728,223 A 3/1998 Murakarni et al.
5,728,425 A 3/1998 Ebe et al.
5,730,801 A 3/1998 Tepman et al.
5,730,802 A 3/1998 Ishizumi et al.
5,732,597 A 3/1998 Devenyi
5,732,744 A 3/1998 Barr et al.
5,736,314 A 4/1998 Hayes et al.
5,753,835 A 5/1998 Gustin
5,754,390 A 5/1998 Sandhu et al.
5,759,281 A 6/1998 Gurary et al.
5,761,328 A 6/1998 Solberg et al.
5,766,365 A 6/1998 Umutoy et al.
5,768,125 A 6/1998 Zinger et al.
5,769,952 A 6/1998 Komino
5,775,889 A 7/1998 Kobayashi et al.
5,777,838 A 7/1998 Tamagawa et al.
5,779,203 A 7/1998 Edlinger
5,781,693 A 7/1998 Ballance et al.
5,782,979 A 7/1998 Kaneno
5,790,750 A 8/1998 Anderson
5,791,782 A 8/1998 Wooten et al.
5,792,272 A 8/1998 Van Os et al.
5,796,074 A 8/1998 Edelstein et al.
5,801,104 A 9/1998 Schuegraf et al.
5,801,945 A 9/1998 Comer
5,806,980 A 9/1998 Berrian
5,813,851 A 9/1998 Nakao
5,818,716 A 10/1998 Chin et al.
5,819,092 A 10/1998 Ferguson et al.
5,819,434 A 10/1998 Herchen et al.
5,820,366 A 10/1998 Lee
5,820,685 A 10/1998 Kurihra et al.
5,820,686 A 10/1998 Moore
5,826,129 A 10/1998 Hasebe et al.
5,827,420 A 10/1998 Shirazi et al.
5,827,435 A 10/1998 Samukawa
5,827,757 A 10/1998 Robinson, Jr. et al.
5,836,483 A 11/1998 Disel
5,837,058 A 11/1998 Chen et al.
5,837,320 A 11/1998 Hampden-Smith et al.
5,844,683 A 12/1998 Pavloski et al.
5,846,332 A 12/1998 Zhao et al.
5,851,294 A 12/1998 Young et al.
5,851,299 A 12/1998 Cheng et al.
5,852,445 A 12/1998 Yoshikawa et al.
5,852,879 A 12/1998 Schumaier
5,853,484 A 12/1998 Jeong
D403,949 S 1/1999 Nakamura
D404,370 S 1/1999 Kimura
D404,372 S 1/1999 Ishii
5,855,680 A 1/1999 Soininen et al.
5,855,681 A 1/1999 Maydan et al.
5,855,726 A 1/1999 Soraoka et al.
5,857,777 A 1/1999 Schuh
5,861,233 A 1/1999 Sekine et al.
5,862,302 A 1/1999 Okase

(56) References Cited

U.S. PATENT DOCUMENTS 5,863,123 A 1/1999 Lee et al.
5,865,205 A 2/1999 Wilmer
5,866,795 A 2/1999 Wang et al.
5,872,065 A 2/1999 Sivaramakrishnan
5,873,942 A 2/1999 Park
5,877,095 A 3/1999 Tamura et al.
5,879,128 A 3/1999 Tietz et al.
5,879,459 A 3/1999 Gadgil et al.
5,880,980 A 3/1999 Rothacher et al.
5,882,165 A 3/1999 Maydan et al.
5,884,640 A 3/1999 Fishkin et al.
5,891,251 A 4/1999 MacLeish et al.
5,893,741 A 4/1999 Huang
5,897,348 A 4/1999 Wu
5,897,378 A 4/1999 Eriguchi
5,897,379 A 4/1999 Ulrich et al.
D409,894 S 5/1999 McClurg
5,904,170 A 5/1999 Harvey et al.
D411,516 S 6/1999 Imafuku et al.
5,908,672 A 6/1999 Ryu
5,915,200 A 6/1999 Tokumasu et al.
5,915,562 A 6/1999 Nyseth et al.
5,916,365 A 6/1999 Sherman
D412,270 S 7/1999 Fredrickson
5,920,798 A 7/1999 Higuchi et al.
5,928,426 A 7/1999 Aitchison
D412,512 S 8/1999 Boisvert
5,937,142 A 8/1999 Moslehi et al.
5,937,323 A 8/1999 Orczyk et al.
5,939,886 A 8/1999 Turner et al.
5,947,718 A 9/1999 Weaver
5,950,327 A 9/1999 Peterson et al.
5,950,925 A 9/1999 Fukunaga et al.
5,954,375 A 9/1999 Trickle et al.
5,961,775 A 10/1999 Fujimura
5,968,275 A 10/1999 Lee et al.
5,970,621 A 10/1999 Bazydola
5,972,196 A 10/1999 Murphy et al.
5,975,492 A 11/1999 Brenes
5,979,506 A 11/1999 Aarseth
5,982,931 A 11/1999 Ishimaru
5,984,391 A 11/1999 Vanderpot et al.
5,987,480 A 11/1999 Donohue et al.
5,989,342 A 11/1999 Ikeda et al.
5,992,453 A 11/1999 Zimmer
5,997,588 A 12/1999 Goodwin
5,997,768 A 12/1999 Scully
5,998,870 A 12/1999 Lee et al.
6,000,732 A 12/1999 Scheler et al.
6,001,183 A 12/1999 Gurary et al.
6,001,267 A 12/1999 Van Os et al.
6,004,204 A 12/1999 Luxton et al.
D419,652 S 1/2000 Hall et al.
6,013,553 A 1/2000 Wallace
6,013,920 A 1/2000 Gordon et al.
6,014,677 A 1/2000 Hayashi et al.
6,015,459 A 1/2000 Jamison et al.
6,015,465 A 1/2000 Kholodenko et al.
6,017,779 A 1/2000 Miyasaka
6,017,818 A 1/2000 Lu
6,022,802 A * 2/2000 Jang ...................... H01L 21/764 257/E21.573
6,024,799 A 2/2000 Chen et al.
6,027,163 A 2/2000 Longenecker et al.
6,029,602 A 2/2000 Bhatnagar
6,030,900 A 2/2000 Grassi et al.
6,035,101 A 3/2000 Sajoto et al.
6,035,804 A 3/2000 Arami et al.
6,039,809 A 3/2000 Toyama et al.
6,042,652 A 3/2000 Hyun
6,044,860 A 4/2000 Neu
6,045,260 A 4/2000 Schwartz et al.
6,048,154 A 4/2000 Wytman
6,050,506 A 4/2000 Guo et al.
6,053,982 A 4/2000 Halpin et al.
6,053,983 A 4/2000 Saeki et al.
6,054,013 A 4/2000 Collins et al.
6,054,678 A 4/2000 Miyazaki
6,060,691 A 5/2000 Minami et al.
6,060,721 A 5/2000 Huang
6,063,196 A 5/2000 Li et al.
6,066,204 A 5/2000 Haven
6,068,441 A 5/2000 Raaijmakers et al.
6,071,572 A 6/2000 Mosely et al.
6,072,163 A 6/2000 Armstrong et al.
6,073,973 A 6/2000 Boscaljon et al.
6,074,154 A 6/2000 Ueda et al.
6,074,443 A 6/2000 Venkatesh
6,074,514 A 6/2000 Bjorkman et al.
6,077,027 A 6/2000 Kawamura et al.
6,079,356 A 6/2000 Umotoy et al.
6,079,927 A 6/2000 Muka
6,083,321 A 7/2000 Lei et al.
6,086,677 A 7/2000 Umotoy et al.
6,090,212 A 7/2000 Mahawili
6,090,659 A 7/2000 Laibowitz et al.
6,091,062 A 7/2000 Pfahnl et al.
6,093,252 A 7/2000 Wengert et al.
6,093,253 A 7/2000 Lofgren
6,095,083 A 8/2000 Rice et al.
6,096,133 A 8/2000 Yuuki et al.
6,096,267 A 8/2000 Kishkovich
6,099,302 A 8/2000 Hong et al.
6,099,649 A 8/2000 Schmitt et al.
6,102,565 A 8/2000 Kita et al.
6,104,002 A 8/2000 Hirose et al.
6,104,011 A 8/2000 Juliano
6,104,401 A 8/2000 Parsons
6,106,625 A 8/2000 Koai et al.
6,106,678 A 8/2000 Shufflebotham
6,110,531 A 8/2000 Paz de Araujo et al.
6,113,703 A 9/2000 Anderson et al.
6,119,710 A 9/2000 Brown
6,121,061 A 9/2000 Van Bilsen et al.
6,121,158 A 9/2000 Benchikha et al.
6,122,036 A 9/2000 Yamasaki et al.
6,124,600 A 9/2000 Moroishi et al.
6,125,789 A 10/2000 Gupta et al.
6,126,744 A 10/2000 Hawkins et al.
6,126,848 A 10/2000 Li et al.
6,127,249 A 10/2000 Hu
6,129,044 A 10/2000 Zhao et al.
6,129,546 A 10/2000 Sada
6,132,207 A 10/2000 Stoutjesdijk
6,134,807 A 10/2000 Komino
6,135,460 A 10/2000 Wise et al.
6,137,240 A 10/2000 Bogdan
6,139,239 A 10/2000 Snijders
6,140,252 A 10/2000 Cho et al.
6,143,079 A 11/2000 Halpin
6,143,082 A 11/2000 McInerney et al.
6,146,463 A 11/2000 Yudovsky et al.
6,148,761 A 11/2000 Majewski et al.
6,151,446 A 11/2000 Hunter et al.
6,152,070 A 11/2000 Fairbairn et al.
6,156,151 A 12/2000 Komino et al.
6,158,941 A 12/2000 Muka et al.
6,160,244 A 12/2000 Ohashi
6,161,500 A 12/2000 Kopacz et al.
6,162,323 A 12/2000 Koshimizu
6,164,894 A 12/2000 Cheng
6,174,809 B1 1/2001 Kang et al.
6,178,918 B1 1/2001 Van Os et al.
6,179,955 B1 1/2001 Shin et al.
6,180,979 B1 1/2001 Hofman et al.
6,182,603 B1 2/2001 Shang et al.
6,183,564 B1 2/2001 Reynolds et al.
6,183,565 B1 2/2001 Granneman et al.
6,187,672 B1 2/2001 Zhao et al.
6,187,691 B1 2/2001 Fukuda
6,190,037 B1 2/2001 Das et al.
6,190,113 B1 2/2001 Bui et al.
6,190,634 B1 2/2001 Lieber et al.
6,191,399 B1 2/2001 Van Bilsen

(56) References Cited

U.S. PATENT DOCUMENTS 6,194,037 B1 2/2001 Terasaki et al.
6,200,897 B1 3/2001 Wang et al.
6,201,999 B1 3/2001 Jevtic
6,203,613 B1 3/2001 Gates et al.
6,203,618 B1 3/2001 Hashizume et al.
6,207,932 B1 3/2001 Yoo
6,207,936 B1 3/2001 de Waard
6,209,221 B1 4/2001 Beulens
6,210,485 B1 4/2001 Zhao et al.
6,212,789 B1 4/2001 Kato
6,213,708 B1 4/2001 Allen
6,214,122 B1 4/2001 Thompson
6,214,717 B1 4/2001 Yan et al.
6,217,658 B1 4/2001 Orczyk et al.
6,218,288 B1 4/2001 Li et al.
6,225,020 B1 5/2001 Jung et al.
6,225,602 B1 5/2001 Buiijze et al.
6,225,745 B1 5/2001 Srivastava
6,230,650 B1 5/2001 Yamazaki
6,231,290 B1 5/2001 Kikuchi et al.
6,235,858 B1 5/2001 Swamp et al.
6,238,734 B1 5/2001 Senzaki et al.
6,240,875 B1 6/2001 Wijck et al.
6,241,822 B1 6/2001 Ide
6,242,359 B1 6/2001 Misra
6,243,654 B1 6/2001 Johnson et al.
6,245,665 B1 6/2001 Yokoyama
6,247,245 B1 6/2001 Ishii
6,250,250 B1 6/2001 Maishev et al.
6,255,221 B1 7/2001 Hudson et al.
6,257,758 B1 7/2001 Culbertson
6,261,648 B1 7/2001 Akiba et al.
6,264,467 B1 7/2001 Lue et al.
6,265,113 B1 7/2001 Rosasco et al.
6,265,311 B1 7/2001 Hautala et al.
6,270,572 B1 8/2001 Kim et al.
6,271,148 B1 8/2001 Kao
6,274,496 B1 8/2001 Leusink et al.
6,274,878 B1 8/2001 Li et al.
6,281,098 B1 8/2001 Wang
6,281,141 B1 8/2001 Das et al.
6,283,692 B1 9/2001 Perlov et al.
6,284,050 B1 9/2001 Shi et al.
6,284,149 B1 9/2001 Li et al.
6,287,965 B1 9/2001 Kang et al.
6,287,988 B1 9/2001 Nagamine et al.
6,293,700 B1 9/2001 Lund et al.
D449,873 S 10/2001 Bronson
6,296,710 B1 10/2001 Allen et al.
6,296,711 B1 10/2001 Loan et al.
6,296,909 B1 10/2001 Spitsberg
6,297,539 B1 10/2001 Ma et al.
6,299,133 B2 10/2001 Waragai et al.
6,302,964 B1 10/2001 Umotoy et al.
6,303,523 B2 10/2001 Cheung
6,305,898 B1 10/2001 Yamagishi et al.
6,311,016 B1 10/2001 Yanagawa et al.
6,312,525 B1 11/2001 Bright et al.
6,315,512 B1 11/2001 Tabrizi et al.
6,316,162 B1 11/2001 Jung et al.
6,316,371 B1 11/2001 Oosterlaken et al.
6,320,320 B1 11/2001 Bailey et al.
6,321,680 B2 11/2001 Cook et al.
6,321,780 B1 11/2001 Iwabuchi
D451,893 S 12/2001 Robson
D452,220 S 12/2001 Robson
6,325,858 B1 12/2001 Wengert
6,326,322 B1 12/2001 Kim et al.
6,326,597 B1 12/2001 Lubomirsky et al.
6,328,561 B1 12/2001 Hasper et al.
6,329,297 B1 12/2001 Balish
6,333,275 B1 12/2001 Mayer et al.
6,335,049 B1 1/2002 Basceri
6,335,240 B1 1/2002 Kim et al.
6,342,427 B1 1/2002 Choi et al.
6,343,239 B1 1/2002 Toda et al.
6,344,084 B1 2/2002 Koinuma et al.
6,344,232 B1 2/2002 Jones et al.
6,346,419 B1 2/2002 Ryerson et al.
6,347,636 B1 2/2002 Xia
6,350,391 B1 2/2002 Livshits et al.
6,352,049 B1 3/2002 Yin et al.
6,352,945 B1 3/2002 Matsuki
6,357,984 B1 3/2002 Zinger et al.
6,363,294 B1 3/2002 Coronel et al.
D455,024 S 4/2002 Mimick et al.
6,367,410 B1 4/2002 Leahey et al.
6,368,773 B1 4/2002 Jung et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
6,375,749 B1 4/2002 Boydston et al.
6,375,750 B1 4/2002 Van Os et al.
6,379,466 B1 4/2002 Sahin et al.
D457,609 S 5/2002 Piano
6,383,300 B1 5/2002 Saito et al.
6,383,566 B1 5/2002 Zagdoun
6,383,955 B1 5/2002 Matsuki
6,387,207 B1 5/2002 Janakiraman
6,387,827 B1 5/2002 Mertens et al.
6,390,753 B1 5/2002 de Ridder et al.
6,390,754 B2 5/2002 Yamaga et al.
6,391,803 B1 5/2002 Kim et al.
6,395,650 B1 5/2002 Callegari et al.
6,398,184 B1 6/2002 Sowada et al.
6,399,022 B1 6/2002 Schuler et al.
6,402,806 B1 6/2002 Schmitt et al.
6,410,433 B1 6/2002 Hautala et al.
6,410,459 B2 6/2002 Blalock et al.
6,410,463 B1 6/2002 Matsuki
6,413,321 B1 7/2002 Kim et al.
6,413,583 B1 7/2002 Moghadam et al.
6,420,279 B1 7/2002 Ono et al.
6,423,949 B1 7/2002 Chen et al.
D461,233 S 8/2002 Whalen
D461,882 S 8/2002 Piano
6,428,859 B1 8/2002 Chiang et al.
6,429,465 B1 8/2002 Yagi et al.
6,432,206 B1 8/2002 Tolt
6,432,255 B1 8/2002 Sun et al.
6,432,479 B2 8/2002 Chang et al.
6,432,849 B1 8/2002 Endo et al.
6,433,298 B1 8/2002 Ishii
6,435,798 B1 8/2002 Satoh
6,435,865 B1 8/2002 Tseng et al.
6,436,819 B1 8/2002 Zhang
6,437,444 B2 8/2002 Andideh
6,438,502 B1 8/2002 Awtrey
6,439,822 B1 8/2002 Kimura et al.
6,440,261 B1 8/2002 Tepman et al.
6,441,350 B1 8/2002 Stoddard et al.
6,445,574 B1 9/2002 Saw et al.
6,446,573 B2 9/2002 Hirayama et al.
6,447,232 B1 9/2002 Davis et al.
6,447,651 B1 9/2002 Ishikawa et al.
6,447,937 B1 9/2002 Murakawa et al.
6,448,192 B1 9/2002 Kaushik
6,450,117 B1 9/2002 Murugesh et al.
6,450,757 B1 9/2002 Saeki
6,451,713 B1 9/2002 Tay et al.
6,454,860 B2 9/2002 Metzner et al.
6,454,909 B1 9/2002 Matsuse et al.
6,455,098 B2 9/2002 Tran et al.
6,455,225 B1 9/2002 Kong et al.
6,455,445 B2 9/2002 Matsuki
6,460,482 B1 10/2002 Kuibira et al.
6,461,435 B1 10/2002 Littau et al.
6,461,436 B1 10/2002 Campbell et al.
6,461,439 B1 10/2002 Granneman et al.
6,468,924 B2 10/2002 Lee
6,471,779 B1 10/2002 Nishio et al.
6,472,266 B1 10/2002 Yu et al.

(56) References Cited

U.S. PATENT DOCUMENTS 6,475,276 B1 11/2002 Elers et al.
6,475,930 B1 11/2002 Junker et al.
6,478,872 B1 11/2002 Chae et al.
6,481,945 B1 11/2002 Hasper et al.
6,482,331 B2 11/2002 Lu et al.
6,482,663 B1 11/2002 Buckland
6,483,989 B1 11/2002 Okada et al.
6,488,774 B1 12/2002 Hone et al.
6,490,493 B1 12/2002 Dharnipragada
6,492,625 B1 12/2002 Boguslayskiy et al.
6,494,065 B2 12/2002 Babbitt
6,494,998 B1 12/2002 Brcka
6,496,819 B1 12/2002 Bello et al.
6,497,734 B1 12/2002 Barber et al.
6,497,767 B1 12/2002 Okase et al.
6,498,091 B1 12/2002 Chen et al.
6,499,533 B2 12/2002 Yamada
6,500,487 B1 12/2002 Holst et al.
6,502,530 B1 1/2003 Turlot et al.
6,503,079 B2 1/2003 Kogano et al.
6,503,330 B1 1/2003 Sneh et al.
6,503,365 B1 1/2003 Kim et al.
6,503,562 B1 1/2003 Saito et al.
6,503,826 B1 1/2003 Oda
6,506,009 B1 1/2003 Nulman et al.
6,506,253 B2 1/2003 Sakuma
6,507,410 B1 1/2003 Robertson et al.
6,511,539 B1 1/2003 Raaijmakers
6,514,313 B1 2/2003 Spiegelman
6,514,666 B1 2/2003 Choi et al.
6,521,295 B1 2/2003 Remington
6,521,547 B1 2/2003 Chang et al.
6,527,884 B1 3/2003 Takakuwa et al.
6,528,171 B1 3/2003 Endler et al.
6,528,430 B2 3/2003 Kwan
6,528,752 B1 3/2003 Ishii et al.
6,528,767 B2 3/2003 Bagley et al.
6,530,994 B1 3/2003 Mahawili
6,531,193 B2 3/2003 Fonash et al.
6,531,412 B2 3/2003 Conti et al.
6,534,133 B1 3/2003 Kaloyeros et al.
6,534,395 B2 3/2003 Werkhoven et al.
6,536,950 B1 3/2003 Green
6,539,891 B1 4/2003 Kang et al.
6,540,469 B2 4/2003 Matsunaga et al.
6,540,838 B2 4/2003 Sneh et al.
6,544,906 B2 4/2003 Rotondaro et al.
6,552,209 B1 4/2003 Lei et al.
6,558,517 B2 5/2003 Basceri
6,558,755 B2 5/2003 Berry et al.
6,559,026 B1 5/2003 Rossman et al.
6,562,094 B2 5/2003 Denker et al.
6,565,763 B1 5/2003 Asakawa et al.
6,566,278 B1 5/2003 Harvey et al.
6,569,239 B2 5/2003 Arai et al.
6,569,971 B2 5/2003 Roh et al.
6,573,030 B1 6/2003 Fairbairn et al.
6,574,644 B2 6/2003 Hsu et al.
6,576,062 B2 6/2003 Matsuse
6,576,064 B2 6/2003 Griffiths et al.
6,576,300 B1 6/2003 Berry et al.
6,576,564 B2 6/2003 Agarwal
6,578,589 B1 6/2003 Mayusumi
6,579,833 B1 6/2003 McNallan et al.
6,580,050 B1 6/2003 Miller et al.
6,582,174 B1 6/2003 Hayashi
6,583,048 B1 6/2003 Vincent et al.
6,583,572 B2 6/2003 Veltrop et al.
6,587,108 B1 7/2003 Guerlain et al.
6,589,352 B1 7/2003 Yudovsky et al.
6,589,707 B2 7/2003 Lee et al.
6,589,868 B2 7/2003 Rossman
6,590,251 B2 7/2003 Kang et al.
6,594,550 B1 7/2003 Okrah
6,596,653 B2 7/2003 Tan
6,598,559 B1 7/2003 Vellore et al.
6,602,806 B1 8/2003 Xia et al.
6,607,602 B1 8/2003 Granneman et al.
6,607,868 B2 8/2003 Choi
6,607,948 B1 8/2003 Sugiyama et al.
6,608,745 B2 8/2003 Tsuruta et al.
6,610,375 B2 8/2003 Akiba et al.
6,613,685 B1 9/2003 Granneman et al.
6,616,986 B2 9/2003 Sherman
6,617,253 B1 9/2003 Chu et al.
6,620,251 B2 9/2003 Kitano
6,624,064 B1 9/2003 Sahin
6,627,268 B1 9/2003 Fair et al.
6,627,503 B2 9/2003 Ma et al.
6,630,030 B1 10/2003 Suntola et al.
6,632,478 B2 10/2003 Gaillard et al.
6,633,364 B2 10/2003 Hayashi
6,635,115 B1 10/2003 Fairbairn et al.
6,635,117 B1 10/2003 Kinnard et al.
6,635,578 B1 10/2003 Xu et al.
6,638,839 B2 10/2003 Deng et al.
6,640,145 B2 10/2003 Hoffberg et al.
6,645,304 B2 11/2003 Yamaguchi
6,648,974 B1 11/2003 Ogliari et al.
6,649,921 B1 11/2003 Cekic et al.
6,652,924 B2 11/2003 Sherman
6,656,281 B1 12/2003 Ueda
6,656,282 B2 12/2003 Kim et al.
6,660,662 B2 12/2003 Ishikawa et al.
6,662,817 B2 12/2003 Yamagishi
6,663,332 B1 12/2003 Sluijk et al.
6,673,196 B1 1/2004 Oyabu
6,676,290 B1 1/2004 Lu
6,679,194 B2 1/2004 Ham et al.
6,682,971 B2 1/2004 Tsuneda et al.
6,682,973 B1 1/2004 Paton et al.
6,683,274 B1 1/2004 Kwon et al.
D486,891 S 2/2004 Cronce
6,684,659 B1 2/2004 Tanaka et al.
6,684,719 B2 2/2004 Gehner et al.
6,686,281 B2 2/2004 Yamazaki et al.
6,688,784 B1 2/2004 Templeton
6,689,220 B1 2/2004 Nguyen
6,692,575 B1 2/2004 Omstead et al.
6,692,576 B2 2/2004 Halpin et al.
6,696,367 B1 2/2004 Aggarwal
6,699,003 B2 3/2004 Saeki
6,699,399 B1 3/2004 Qian et al.
6,700,089 B1 3/2004 Hirooka
6,709,989 B2 3/2004 Ramdani et al.
6,710,364 B2 3/2004 Guldi et al.
6,710,857 B2 3/2004 Kondo
6,713,824 B1 3/2004 Mikata
6,715,949 B1 4/2004 Fisher et al.
6,716,571 B2 4/2004 Gabriel
6,719,499 B1 4/2004 Kuznetsov et al.
6,720,260 B1 4/2004 Fair et al.
6,720,531 B1 4/2004 Jacobson et al.
6,722,837 B2 4/2004 Inui
6,723,642 B1 4/2004 Lim et al.
6,730,614 B1 5/2004 Lim et al.
6,732,006 B2 5/2004 Haanstra et al.
6,734,090 B2 5/2004 Agarwala et al.
6,734,631 B2 5/2004 Juestel et al.
6,737,716 B1 5/2004 Matsuo et al.
6,740,853 B1 5/2004 Johnson et al.
6,743,475 B2 6/2004 Skarp et al.
6,743,738 B2 6/2004 Todd et al.
6,745,095 B1 6/2004 Ben-Dov
6,746,240 B2 6/2004 de Ridder et al.
6,746,308 B1 6/2004 Bode et al.
6,749,671 B2 6/2004 Holst et al.
6,753,507 B2 6/2004 Fure et al.
6,755,221 B2 6/2004 Jeong et al.
6,756,085 B2 6/2004 Waklfried
6,756,293 B2 6/2004 Li et al.
6,756,318 B2 6/2004 Nguyen et al.
6,759,098 B2 7/2004 Han
6,760,981 B2 7/2004 Leap

(56) References Cited

U.S. PATENT DOCUMENTS 6,767,447 B2 7/2004 Uno et al.
D494,552 S 8/2004 Tezuka et al.
6,780,704 B1 8/2004 Raaijmakers et al.
6,783,875 B2 8/2004 Yamada et al.
6,784,033 B1 8/2004 Yamazaki
6,784,108 B1 8/2004 Donohoe et al.
D496,008 S 9/2004 Takahashi et al.
6,786,997 B1 9/2004 Yamazaki
D497,536 S 10/2004 Fujiwam
D497,977 S 11/2004 Engelbrektsson
6,811,960 B2 11/2004 Lee et al.
6,812,157 B1 11/2004 Gadgil
6,815,350 B2 11/2004 Kim et al.
6,815,352 B1 11/2004 Tamura et al.
6,818,864 B2 11/2004 Ptak
6,820,570 B2 11/2004 Kilpela et al.
6,821,910 B2 11/2004 Adomaitis et al.
6,824,665 B2 11/2004 Shelnut et al.
6,825,134 B2 11/2004 Law et al.
D499,620 S 12/2004 Horner-Richardson et al.
6,827,789 B2 12/2004 Lee et al.
6,828,235 B2 12/2004 Takano
6,831,004 B2 12/2004 Byun
6,833,024 B2 12/2004 Holst et al.
6,835,039 B2 12/2004 Van Den Berg
6,838,122 B2 1/2005 Basceri et al.
6,841,201 B2 1/2005 Shanov et al.
6,843,202 B2 1/2005 Kusuda
6,846,146 B2 1/2005 Inui
6,846,515 B2 1/2005 Vrtis
6,846,742 B2 1/2005 Rossman
6,847,014 B1 1/2005 Benjamin et al.
6,849,241 B2 2/2005 Dauelsberg et al.
6,849,857 B2 2/2005 Ichiki et al.
6,858,524 B2 2/2005 Haukka et al.
6,858,547 B2 2/2005 Metzner
6,861,642 B2 3/2005 Ichiki et al.
6,863,019 B2 3/2005 Shamouilian
6,863,281 B2 3/2005 Endou et al.
6,864,041 B2 3/2005 Brown
6,867,859 B1 3/2005 Powell
6,872,258 B2 3/2005 Park et al.
6,872,259 B2 3/2005 Strang
D504,142 S 4/2005 Horner-Richardson et al.
6,874,247 B1 4/2005 Hsu
6,874,480 B1 4/2005 Ismailov
6,875,477 B2 4/2005 Trickett et al.
6,875,677 B1 4/2005 Conley, Jr. et al.
6,876,017 B2 4/2005 Goodner
6,876,191 B2 4/2005 de Ridder
6,878,206 B2 4/2005 Tzu et al.
6,878,402 B2 4/2005 Chiang et al.
6,883,733 B1 4/2005 Lind
6,884,066 B2 4/2005 Nguyen et al.
6,884,295 B2 4/2005 Ishii
6,884,319 B2 4/2005 Kim
6,884,475 B2 4/2005 Basceri
D505,590 S 5/2005 Greiner
6,889,211 B1 5/2005 Yoshiura et al.
6,889,864 B2 5/2005 Lindfors et al.
6,890,596 B2 5/2005 Sarigiannis et al.
6,895,158 B2 5/2005 Alyward et al.
6,899,507 B2 5/2005 Yamagishi et al.
6,902,395 B2 6/2005 Oosterlaken et al.
6,909,839 B2 6/2005 Wang et al.
6,911,092 B2 6/2005 Sneh
6,913,152 B2 7/2005 Zuk
6,913,796 B2 7/2005 Albano et al.
6,916,398 B2 7/2005 Chen et al.
6,916,559 B2 7/2005 Murakawa et al.
6,917,755 B2 7/2005 Nguyen et al.
6,924,078 B2 8/2005 Lee et al.
6,928,890 B2 8/2005 Gehner et al.
6,929,699 B2 8/2005 Whitesell
6,929,700 B2 8/2005 Tan et al.
6,930,041 B2 8/2005 Agarwal
6,930,059 B2 8/2005 Conley, Jr. et al.
6,935,269 B2 8/2005 Lee et al.
6,939,579 B2 9/2005 Bondestam et al.
6,939,817 B2 9/2005 Sandhu et al.
6,942,753 B2 9/2005 Choi et al.
6,949,204 B1 9/2005 Lenz et al.
6,951,587 B1 10/2005 Narushima
6,952,656 B1 10/2005 Cordova et al.
6,953,609 B2 10/2005 Carollo
6,955,741 B2 10/2005 Yamagishi
6,955,836 B2 10/2005 Kumagai et al.
6,955,928 B1 10/2005 Brennan
6,963,052 B2 11/2005 Kuibira et al.
6,972,055 B2 12/2005 Sferlazzo
6,972,478 B1 12/2005 Waite et al.
6,974,781 B2 12/2005 Timmermans et al.
6,975,921 B2 12/2005 Verhaar
6,976,822 B2 12/2005 Woodruff
6,981,832 B2 1/2006 Zinger et al.
6,982,046 B2 1/2006 Srivastava et al.
6,982,103 B2 1/2006 Basceri et al.
6,984,591 B1 1/2006 Buchanan et al.
6,984,595 B1 1/2006 Yamazaki
6,985,788 B2 1/2006 Haanstra et al.
6,986,914 B2 1/2006 Elers et al.
6,987,155 B2 1/2006 Roh et al.
6,990,430 B2 1/2006 Hosek
7,005,227 B2 2/2006 Yueh et al.
7,005,391 B2 2/2006 Min
7,008,879 B2 3/2006 Lee et al.
7,010,580 B1 3/2006 Fu et al.
7,017,514 B1 3/2006 Shepherd et al.
7,018,941 B2 3/2006 Cui et al.
7,021,330 B2 4/2006 Maula et al.
7,021,881 B2 4/2006 Yamagishi
7,036,453 B2 5/2006 Ishikawa et al.
7,041,609 B2 5/2006 Vaartstra
7,045,430 B2 5/2006 Ahn et al.
7,049,226 B2 5/2006 Chung et al.
7,049,247 B2 5/2006 Gates et al.
7,052,584 B2 5/2006 Basceri
7,053,009 B2 5/2006 Conley, Jr. et al.
7,055,263 B2 6/2006 Wu et al.
7,055,875 B2 6/2006 Bonora
7,062,161 B2 6/2006 Kusuda et al.
7,070,178 B2 7/2006 Van Der Toorn et al.
7,071,051 B1 7/2006 Jeon et al.
7,073,834 B2 7/2006 Matsumoto et al.
7,074,690 B1 7/2006 Gauri et al.
7,077,614 B1 7/2006 Hasper et al.
7,080,545 B2 7/2006 Dimeo et al.
7,084,060 B1 8/2006 Furukawa
7,084,079 B2 8/2006 Conti et al.
7,085,623 B2 8/2006 Siegers
7,086,347 B2 8/2006 Howald et al.
7,088,003 B2 8/2006 Gates et al.
7,090,394 B2 8/2006 Hashikura et al.
7,092,287 B2 8/2006 Beulens et al.
7,098,149 B2 8/2006 Lukas
7,098,150 B2 8/2006 Misra et al.
7,100,459 B2 9/2006 Gehner et al.
7,101,763 B1 9/2006 Anderson et al.
7,108,753 B2 9/2006 Wood
7,109,098 B1 9/2006 Ramaswamy et al.
7,109,114 B2 9/2006 Chen et al.
7,111,232 B1 9/2006 Bascom
7,115,305 B2 10/2006 Bronikowski et al.
7,115,838 B2 10/2006 Kurara et al.
7,122,085 B2 10/2006 Shero et al.
7,122,222 B2 10/2006 Xiao et al.
7,129,165 B2 10/2006 Basol et al.
7,132,360 B2 11/2006 Schaeffer et al.
7,135,421 B2 11/2006 Ahn et al.
7,140,558 B2 11/2006 McCracken et al.
7,141,499 B2 11/2006 Raaijmakers
7,143,897 B1 12/2006 Guzman et al.
7,144,809 B2 12/2006 Elers et al.
7,147,766 B2 12/2006 Uzoh et al.

(56) References Cited

U.S. PATENT DOCUMENTS 7,153,542 B2 12/2006 Nguyen et al.
7,156,380 B2 1/2007 Soininen
7,163,393 B2 1/2007 Adachi et al.
7,163,721 B2 1/2007 Zhang et al.
7,163,900 B2 1/2007 Weber
7,168,852 B2 1/2007 Linnarsson
7,172,497 B2 2/2007 Basol et al.
7,173,216 B2 2/2007 Ptak
7,183,229 B2 2/2007 Yamanaka
7,186,648 B1 3/2007 Rozbicki
7,192,824 B2 3/2007 Ahn et al.
7,192,892 B2 3/2007 Ahn et al.
7,195,479 B2 3/2007 Beatty et al.
7,195,693 B2 3/2007 Cowans
D541,125 S 4/2007 Gaudron
7,198,447 B2 4/2007 Morimitsu et al.
7,199,513 B2 4/2007 Huber et al.
7,201,943 B2 4/2007 Park et al.
7,202,148 B2 4/2007 Chen et al.
7,202,512 B2 4/2007 Chen et al.
7,204,886 B2 4/2007 Chen et al.
7,204,887 B2 4/2007 Kawamura et al.
7,205,246 B2 4/2007 MacNeil et al.
7,205,247 B2 4/2007 Lee et al.
7,207,763 B2 4/2007 Lee
7,208,198 B2 4/2007 Basceri et al.
7,208,389 B1 4/2007 Tipton et al.
7,210,925 B2 5/2007 Adachi
7,211,524 B2 5/2007 Ryu et al.
7,211,525 B1 5/2007 Shanker
7,214,630 B1 5/2007 Varadarajan et al.
7,217,617 B2 5/2007 Basceri
7,223,014 B2 5/2007 Lojen
7,208,413 B2 6/2007 Byun et al.
7,234,476 B2 6/2007 Arai
7,235,137 B2 6/2007 Kitayama et al.
7,235,482 B2 6/2007 Wu
7,235,501 B2 6/2007 Ahn et al.
7,238,596 B2 7/2007 Kouvetakis et al.
7,238,616 B2 7/2007 Agarwal
7,238,653 B2 7/2007 Lee et al.
7,256,375 B2 8/2007 Oosterlaken
7,265,061 B1 9/2007 Cho et al.
7,274,867 B2 9/2007 Peukert
D553,104 S 10/2007 Oohashi et al.
7,279,256 B2 10/2007 Son
7,290,813 B2 11/2007 Bonora
7,294,581 B2 11/2007 Haverkort et al.
7,296,460 B2 11/2007 Dimeo et al.
7,297,641 B2 11/2007 Todd et al.
7,298,009 B2 11/2007 Yan et al.
7,301,623 B1 11/2007 Madsen et al.
D556,704 S 12/2007 Nakamura et al.
D557,226 S 12/2007 Uchino et al.
D558,021 S 12/2007 Lawrence
7,307,028 B2 12/2007 Goto et al.
7,307,178 B2 12/2007 Kiyomori et al.
7,312,148 B2 12/2007 Ramaswamy et al.
7,312,162 B2 12/2007 Ramaswamy et al.
7,312,494 B2 12/2007 Ahn et al.
D559,993 S 1/2008 Nagakubo et al.
D559,994 S 1/2008 Nagakubo et al.
7,320,544 B2 1/2008 Hsieh
7,323,401 B2 1/2008 Ramaswamy et al.
7,326,656 B2 2/2008 Brask et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,351,057 B2 4/2008 Berenbak et al.
7,354,482 B2 4/2008 Konishi et al.
7,354,847 B2 4/2008 Chan et al.
7,354,873 B2 4/2008 Fukazawa et al.
7,356,762 B2 4/2008 van Driel
7,357,138 B2 4/2008 Ji et al.
7,361,447 B2 4/2008 Jung
7,375,035 B2 5/2008 Heden et al.
7,376,520 B2 5/2008 Wong
7,378,618 B1 5/2008 Sorabji et al.
7,379,785 B2 5/2008 Higashi et al.
D571,383 S 6/2008 Ota et al.
D571,831 S 6/2008 Ota et al.
7,381,644 B1 6/2008 Soubramonium et al.
7,387,685 B2 6/2008 Choi et al.
7,393,207 B2 7/2008 Imai
7,393,418 B2 7/2008 Yokogawa
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,399,570 B2 7/2008 Lee et al.
7,402,534 B2 7/2008 Mahajani
7,405,166 B2 7/2008 Liang et al.
7,405,454 B2 7/2008 Ahn et al.
D575,713 S 8/2008 Ratcliffe
7,408,225 B2 8/2008 Shinriki et al.
7,410,290 B2 8/2008 Tanaka
7,410,666 B2 8/2008 Elers
7,411,352 B2 8/2008 Madocks
7,414,281 B1 8/2008 Fastow
D576,001 S 9/2008 Brunderman
7,422,635 B2 9/2008 Zheng et al.
7,422,636 B2 9/2008 Ishizaka
7,422,653 B2 9/2008 Blahnik et al.
7,422,775 B2 9/2008 Ramaswamy et al.
7,425,224 B2 9/2008 Nguyen
7,427,571 B2 9/2008 Lindeboom et al.
7,429,532 B2 9/2008 Ramaswamy et al.
7,431,966 B2 10/2008 Derderian et al.
7,432,476 B2 10/2008 Morita et al.
7,437,060 B2 10/2008 Wang et al.
7,442,275 B2 10/2008 Cowans
7,456,429 B2 11/2008 Levy
D583,395 S 12/2008 Ueda
7,467,632 B2 12/2008 Lee et al.
7,473,655 B2 1/2009 Wang et al.
7,475,588 B2 1/2009 Dimeo et al.
7,476,291 B2 1/2009 Wang et al.
7,479,198 B2 1/2009 Guffrey
7,482,247 B1 1/2009 Papasouliotis
7,482,283 B2 1/2009 Yamasaki et al.
D585,968 S 2/2009 Elkins et al.
7,489,389 B2 2/2009 Shibazaki et al.
7,494,882 B2 2/2009 Vitale
7,497,614 B2 3/2009 Gaff
7,498,242 B2 3/2009 Kumar et al.
7,501,292 B2 3/2009 Matsushita et al.
7,501,355 B2 3/2009 Bhatia et al.
7,503,980 B2 3/2009 Kida et al.
7,504,344 B2 3/2009 Matsuki et al.
D590,933 S 4/2009 Vansell
7,514,058 B1 4/2009 Hitzman et al.
7,514,375 B1 4/2009 Shanker et al.
D593,585 S 6/2009 Ota et al.
D593,969 S 6/2009 Li
7,541,297 B2 6/2009 Mallick et al.
7,544,398 B1 6/2009 Chang et al.
7,547,363 B2 6/2009 Tomiyasu et al.
7,547,633 B2 6/2009 Ranish et al.
7,550,396 B2 6/2009 Frohberg et al.
D596,476 S 7/2009 Welch
7,561,982 B2 7/2009 Rund et al.
7,563,715 B2 7/2009 Haukka et al.
7,566,891 B2 7/2009 Rocha-Alvarez et al.
7,569,193 B2 8/2009 Ferron et al.
7,575,968 B2 8/2009 Sadaka et al.
7,579,285 B2 8/2009 Zimmerman et al.
7,579,785 B2 8/2009 Shinmen et al.
D600,223 S 9/2009 Aggarwal
7,582,555 B1 9/2009 Lang
7,582,575 B2 9/2009 Fukazawa et al.
7,589,003 B2 9/2009 Kouvetakis et al.
7,589,028 B1 9/2009 Cho et al.
7,589,029 B2 9/2009 Derderian et al.

(56) References Cited

U.S. PATENT DOCUMENTS 7,591,601 B2 9/2009 Matsuoka et al.
7,591,907 B2 9/2009 Chen et al.
D602,575 S 10/2009 Breda
7,598,513 B2 10/2009 Kouvetakis et al.
7,601,223 B2 10/2009 Lindfors et al.
7,601,225 B2 10/2009 Tuominen et al.
7,601,652 B2 10/2009 Singh et al.
7,611,640 B1 11/2009 Howald et al.
7,611,751 B2 11/2009 Elers
7,611,980 B2 11/2009 Wells et al.
7,618,226 B2 11/2009 Takizawa
7,621,672 B2 11/2009 Ripley
7,622,369 B1 11/2009 Lee et al.
7,622,378 B2 11/2009 Liu et al.
7,623,940 B2 11/2009 Huskamp et al.
D606,952 S 12/2009 Lee
7,625,820 B1 12/2009 Papasouliotis
7,629,277 B2 12/2009 Ghatnagar
7,632,549 B2 12/2009 Goundar
7,638,951 B2 12/2009 DeVincentis et al.
7,640,142 B2 12/2009 Tachikawa et al.
7,645,341 B2 1/2010 Kennedy et al.
7,645,484 B2 1/2010 Ishizaka
7,648,895 B2 1/2010 Kurokawa et al.
7,648,927 B2 1/2010 Singh et al.
7,651,269 B2 1/2010 Comendant
7,651,583 B2 1/2010 Kent et al.
7,651,955 B2 1/2010 Ranish et al.
7,651,959 B2 1/2010 Fukazawa et al.
7,651,961 B2 1/2010 Clark
D609,652 S 2/2010 Nagasaka et al.
D609,655 S 2/2010 Sugimoto
7,661,299 B2 2/2010 Kusunoki
7,670,432 B2 3/2010 Li
7,674,726 B2 3/2010 Hasper et al.
7,678,197 B2 3/2010 Maki
7,678,715 B2 3/2010 Mungekar et al.
7,682,454 B2 3/2010 Sneh
7,682,657 B2 3/2010 Sherman
D613,829 S 4/2010 Griffin et al.
D614,153 S 4/2010 Fondurulia et al.
D614,267 S 4/2010 Breda
D614,268 S 4/2010 Breda
D614,593 S 4/2010 Lee
7,690,881 B2 4/2010 Yamagishi
7,691,205 B2 4/2010 Ikedo
7,692,171 B2 4/2010 Kaszuba et al.
7,695,808 B2 4/2010 Tuma
D616,390 S 5/2010 Sato
D616,394 S 5/2010 Sato
7,712,435 B2 5/2010 Yoshizaki et al.
7,713,874 B2 5/2010 Milligan
7,716,993 B2 5/2010 Ozawa et al.
7,718,930 B2 5/2010 Kawasaki et al.
7,720,560 B2 5/2010 Menser et al.
7,723,648 B2 5/2010 Tsukamoto et al.
7,725,012 B2 5/2010 Aggarwal et al.
7,727,864 B2 6/2010 Elers
7,727,880 B1 * 6/2010 Chattopadhyay .......................... H01L 21/76849 438/622
7,732,343 B2 6/2010 Niroomand et al.
7,736,437 B2 6/2010 Cadwell et al.
7,736,528 B2 6/2010 Okita et al.
7,736,600 B2 6/2010 Clark et al.
7,737,035 B1 6/2010 Lind et al.
7,740,437 B2 6/2010 de Ridder et al.
7,740,705 B2 6/2010 Li
7,745,346 B2 6/2010 Hausmann et al.
7,748,760 B2 7/2010 Kushida
7,749,563 B2 7/2010 Zheng et al.
7,753,584 B2 7/2010 Gambino et al.
7,754,621 B2 7/2010 Putjkonen
7,758,698 B2 7/2010 Bang et al.
7,763,869 B2 7/2010 Matsushita et al.
7,767,262 B2 8/2010 Clark
7,771,796 B2 8/2010 Kohno et al.
7,780,440 B2 8/2010 Shibagaki et al.
7,780,789 B2 8/2010 Wu et al.
7,781,352 B2 8/2010 Fukazawa et al.
7,789,559 B2 9/2010 Waser et al.
7,789,965 B2 9/2010 Matsushita et al.
7,790,633 B1 9/2010 Tarafdar et al.
7,794,546 B2 9/2010 Li
7,798,096 B2 9/2010 Mahajani et al.
7,799,300 B2 9/2010 Lindfors et al.
7,799,706 B2 9/2010 Yeom et al.
7,803,722 B2 9/2010 Liang
D625,977 S 10/2010 Watson et al.
7,795,160 B2 10/2010 Wang et al.
7,806,587 B2 10/2010 Kobayashi
7,807,566 B2 10/2010 Tsuji et al.
7,807,578 B2 10/2010 Bencher et al.
7,816,278 B2 10/2010 Reed et al.
7,824,492 B2 11/2010 Tois et al.
7,825,040 B1 11/2010 Fukazawa et al.
7,829,460 B2 11/2010 Streck et al.
7,833,348 B2 11/2010 Wada et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,850,449 B2 12/2010 Yang et al.
7,851,019 B2 12/2010 Tuominen et al.
7,851,232 B2 12/2010 van Schravendijk et al.
7,858,519 B2 12/2010 Liu et al.
7,858,533 B2 12/2010 Liu et al.
7,865,070 B2 1/2011 Nakamura
7,871,198 B2 1/2011 Rempe et al.
7,874,726 B2 1/2011 Jacobs et al.
7,884,918 B2 2/2011 Hattori
7,888,233 B1 2/2011 Gauri
7,894,474 B1 2/2011 Bell
D634,329 S 3/2011 Wastrom
D634,719 S 3/2011 Yasuda et al.
7,897,215 B1 3/2011 Fair et al.
7,897,217 B2 3/2011 Faguet
7,902,009 B2 3/2011 Simonelli et al.
7,902,582 B2 3/2011 Forbes et al.
7,906,174 B1 3/2011 Wu et al.
7,910,288 B2 3/2011 Abatchev et al.
7,910,452 B2 3/2011 Roh et al.
7,910,494 B2 3/2011 Dip et al.
7,915,139 B1 3/2011 Lang
7,915,667 B2 3/2011 Knoefler et al.
7,919,142 B2 4/2011 Yeom et al.
7,919,416 B2 4/2011 Lee et al.
7,923,382 B2 4/2011 Huotari et al.
7,925,378 B2 4/2011 Gilchrist et al.
7,935,940 B1 5/2011 Smargiassi
7,939,447 B2 5/2011 Bauer et al.
7,942,969 B2 5/2011 Riker et al.
7,946,762 B2 5/2011 Yednak
7,951,262 B2 5/2011 Koshiishi et al.
7,955,516 B2 6/2011 Chandrachood
7,955,646 B2 6/2011 Cruse et al.
7,955,650 B2 6/2011 Tsuji
7,957,708 B2 6/2011 Karschnia et al.
7,963,736 B2 6/2011 Takizawa et al.
7,967,913 B2 6/2011 Hua et al.
7,972,980 B2 7/2011 Lee et al.
7,977,256 B2 7/2011 Liu et al.
7,981,751 B2 7/2011 Zhu et al.
D643,055 S 8/2011 Takahashi
7,989,365 B2 8/2011 Park et al.
7,989,736 B2 8/2011 Park et al.
7,992,318 B2 8/2011 Kawaji
7,993,457 B1 8/2011 Krotov et al.
7,994,070 B1 8/2011 Dip et al.
7,994,721 B2 8/2011 Espiau et al.
7,997,795 B2 8/2011 Schwagerman et al.
7,998,875 B2 8/2011 DeYoung
8,003,174 B2 8/2011 Fukazawa

(56) References Cited

U.S. PATENT DOCUMENTS 8,003,919 B2 8/2011 Goto et al.
8,004,198 B2 8/2011 Bakre et al.
8,020,315 B2 9/2011 Nishimura
8,030,129 B2 10/2011 Jeong
8,033,771 B1 10/2011 Gage et al.
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,046,193 B2 10/2011 Yetter et al.
8,047,711 B2 11/2011 Ploechinger
8,048,783 B2 11/2011 Chung et al.
8,051,799 B2 11/2011 Itagaki et al.
8,052,794 B2 11/2011 Sumakeris et al.
8,055,378 B2 11/2011 Numakura
8,060,252 B2 11/2011 Gage et al.
8,083,853 B2 11/2011 Choi et al.
RE43,023 E 12/2011 Nakashima et al.
D649,986 S 12/2011 Fujikata et al.
D651,291 S 12/2011 Liebson et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.
8,100,583 B2 1/2012 Aggarwal
D653,734 S 2/2012 Sisk
D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Hera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,267,633 B2 9/2012 Obikane
8,272,516 B2 9/2012 Salvador
8,278,176 B2 10/2012 Bauer et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,440,259 B2 5/2013 Chiang et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.
8,562,272 B2 10/2013 Lenz
8,563,443 B2 10/2013 Fukazawa
8,569,184 B2 10/2013 Oka
D693,200 S 11/2013 Saunders
8,573,152 B2 11/2013 de la Llera et al.
8,573,154 B2 11/2013 Yorozuya
8,586,484 B2 11/2013 Matsuyama et al.
8,591,659 B1 11/2013 Fang et al.
8,592,005 B2 11/2013 Ueda

(56) References Cited

U.S. PATENT DOCUMENTS

D694,790 S 12/2013 Matsumoto et al.
D695,240 S 12/2013 Iida et al.
8,608,885 B2 12/2013 Goto et al.
8,614,047 B2 12/2013 Ayothi et al.
8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
D698,904 S 2/2014 Milligan et al.
8,642,488 B2 2/2014 Liu et al.
8,647,439 B2 2/2014 Sanchez et al.
8,647,722 B2 2/2014 Kobayashi et al.
8,647,993 B2 2/2014 Lavoie et al.
8,651,788 B1 2/2014 Budde
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee
8,703,002 B2 4/2014 Matsudo et al.
8,709,162 B2 4/2014 Leung et al.
8,710,580 B2 4/2014 Sakuma et al.
8,711,338 B2 4/2014 Liu et al.
D705,745 S 5/2014 Kurs et al.
D705,762 S 5/2014 Yu
8,664,127 B2 5/2014 Bhatia et al.
8,720,965 B2 5/2014 Hino et al.
8,721,791 B2 5/2014 Choi et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,728,956 B2 5/2014 Lavoie et al.
8,741,062 B2 6/2014 Lindfors et al.
8,741,065 B2 6/2014 Odagiri et al.
8,742,668 B2 6/2014 Nakano et al.
8,758,512 B2 6/2014 Lee
8,759,223 B2 6/2014 Sapre et al.
D709,536 S 7/2014 Yoshimura et al.
D709,537 S 7/2014 Kuwabara et al.
8,764,085 B2 7/2014 Urabe
8,771,791 B2 7/2014 Lee et al.
8,771,807 B2 7/2014 Xiao et al.
8,779,502 B2 7/2014 Sakuma et al.
8,784,950 B2 7/2014 Fukazawa et al.
8,784,951 B2 7/2014 Fukazawa et al.
8,785,215 B2 7/2014 Kobayashi et al.
8,785,311 B2 7/2014 Miyoshi
8,790,743 B1 7/2014 Omari
8,790,749 B2 7/2014 Omori et al.
8,802,201 B2 8/2014 Raisanen et al.
8,809,170 B2 8/2014 Bauer
D712,358 S 9/2014 Allen et al.
D712,359 S 9/2014 Allen et al.
8,820,809 B2 9/2014 Ando et al.
8,821,640 B2 9/2014 Cleary et al.
8,821,985 B2 9/2014 Shao et al.
8,823,672 B2 9/2014 Kim
8,828,886 B2 9/2014 Samukawa et al.
8,841,182 B1 9/2014 Chen et al.
8,845,806 B2 9/2014 Aida et al.
8,846,502 B2 9/2014 Haukka et al.
D715,410 S 10/2014 Lohmann
8,859,368 B2 10/2014 Deniz
8,860,955 B2 10/2014 Rodnick et al.
8,864,202 B1 10/2014 Schrameyer
8,864,375 B2 10/2014 Abe et al.
D716,742 S 11/2014 Jang et al.
8,876,974 B2 11/2014 Wan
8,877,300 B2 11/2014 Lee
8,877,655 B2 11/2014 Shero et al.
8,882,923 B2 11/2014 Saido et al.
8,883,270 B2 11/2014 Shero et al.
8,895,108 B2 11/2014 Lee
8,900,935 B2 12/2014 Guo et al.
8,900,999 B1 12/2014 Wu et al.
8,901,016 B2 12/2014 Jeongseok et al.
8,911,553 B2 12/2014 Baluja et al.
8,911,826 B2 12/2014 Adachi et al.
8,912,101 B2 12/2014 Tsuji et al.
D720,838 S 1/2015 Yamagishi et al.
8,927,906 B2 1/2015 Tadokoro et al.
8,932,802 B2 1/2015 Wu et al.
8,933,375 B2 1/2015 Dunn et al.
8,940,646 B1 1/2015 Chandrasekharan
D723,153 S 2/2015 Borkholder
8,945,305 B2 2/2015 Marsh
8,945,306 B2 2/2015 Tsuda
8,945,339 B2 2/2015 Kakimoto
8,946,830 B2 2/2015 Jung et al.
8,956,971 B2 2/2015 Huakka
8,956,983 B2 2/2015 Swaminathan
D723,330 S 3/2015 York
D724,553 S 3/2015 Choi
D724,701 S 3/2015 Yamagishi et al.
D725,168 S 3/2015 Yamagishi
8,967,608 B2 3/2015 Mitsumori et al.
8,974,868 B2 3/2015 Ishikawa et al.
8,980,006 B2 3/2015 Huh et al.
8,986,456 B2 3/2015 Fondurulia et al.
8,991,214 B2 3/2015 Hoshino et al.
8,991,887 B2 3/2015 Shin et al.
8,993,054 B2 3/2015 Jung et al.
8,993,457 B1 3/2015 Ramkumar et al.
D726,365 S 4/2015 Weigensberg
D726,884 S 4/2015 Yamagishi et al.
8,999,102 B2 4/2015 Miyoshi et al.
9,004,744 B1 4/2015 Kemp
9,005,539 B2 4/2015 Halpin et al.
9,017,481 B1 4/2015 Pettinger et al.
9,017,933 B2 4/2015 Liu et al.
9,018,093 B2 4/2015 Tsuji et al.
9,018,111 B2 4/2015 Milligan et al.
9,018,567 B2 4/2015 de Ridder et al.
9,021,985 B2 5/2015 Alokozai et al.
9,023,737 B2 5/2015 Beynet et al.
9,023,738 B2 5/2015 Kato et al.
9,029,244 B2 5/2015 Won et al.
9,029,253 B2 5/2015 Milligan et al.
9,029,272 B1 5/2015 Nakano
D732,145 S 6/2015 Yamagishi
D732,644 S 6/2015 Yamagishi et al.
D733,257 S 6/2015 Schoenherr et al.
D733,261 S 6/2015 Yamagishi et al.
D733,262 S 6/2015 Kang
9,057,388 B2 6/2015 Comeau et al.
9,064,815 B2 6/2015 Zhang et al.
D733,843 S 7/2015 Yamagishi
D734,377 S 7/2015 Hirakida
9,076,635 B2 7/2015 Gross et al.
9,076,726 B2 7/2015 Kauerauf et al.
D735,836 S 8/2015 Yamagishi et al.
D736,348 S 8/2015 Tan
9,095,869 B2 8/2015 Kilpi et al.
9,096,931 B2 8/2015 Yednak et al.
9,099,423 B2 8/2015 Weeks et al.
9,099,505 B2 8/2015 Kusakabe et al.
9,111,972 B2 8/2015 Takeshita et al.
9,117,657 B2 8/2015 Nakano et al.
9,117,866 B2 8/2015 Marquardt et al.
D739,222 S 9/2015 Chadbourne
9,123,510 B2 9/2015 Nakano et al.
9,123,577 B2 9/2015 Fujimoto et al.
9,127,358 B2 9/2015 Inoue et al.
9,127,362 B2 9/2015 Scheible et al.
9,129,897 B2 9/2015 Pore et al.
9,136,108 B2 9/2015 Matsushita et al.
9,136,180 B2 9/2015 Machkaoutsan
9,142,393 B2 9/2015 Okabe et al.
9,142,437 B2 9/2015 Fosnight et al.

(56) References Cited

U.S. PATENT DOCUMENTS 9,142,764 B1 9/2015 Wang
9,153,441 B2 10/2015 Takamure et al.
9,163,310 B2 10/2015 Lee
9,166,012 B2 10/2015 Sim et al.
9,169,975 B2 10/2015 Sarin et al.
9,171,714 B2 10/2015 Mori
9,171,715 B2 10/2015 Matero
9,171,716 B2 10/2015 Fukuda
D742,202 S 11/2015 Cyphers et al.
D743,357 S 11/2015 Vyne
D743,513 S 11/2015 Yamagishi
9,174,178 B2 11/2015 Berger et al.
9,175,394 B2 11/2015 Yudovsky et al.
9,177,784 B2 11/2015 Raisanen et al.
9,184,047 B2 11/2015 Liu et al.
9,184,054 B1 11/2015 Huang et al.
9,190,263 B2 11/2015 Ishikawa et al.
9,190,264 B2 11/2015 Yuasa et al.
9,196,483 B1 11/2015 Lee et al.
D745,641 S 12/2015 Blum
9,202,727 B2 12/2015 Dunn et al.
9,214,333 B1 12/2015 Sims et al.
9,219,006 B2 12/2015 Chatterjee
9,223,203 B2 12/2015 Farm et al.
9,228,259 B2 1/2016 Haukka et al.
9,240,412 B2 1/2016 Xie et al.
9,245,742 B2 1/2016 Haukka
9,252,024 B2 2/2016 Lam et al.
9,252,238 B1 2/2016 Trevino et al.
9,257,274 B2 2/2016 Kang et al.
9,263,298 B2 2/2016 Matsumoto et al.
9,267,204 B2 2/2016 Honma
9,267,850 B2 2/2016 Aggarwal
D751,176 S 3/2016 Schoenherr et al.
9,275,834 B1 3/2016 Park et al.
9,281,277 B2 3/2016 Baek et al.
9,284,642 B2 3/2016 Nakano
9,287,273 B2 3/2016 Ragnarsson et al.
9,297,705 B2 3/2016 Aggarwal
9,299,557 B2 3/2016 Tolle et al.
9,299,595 B2 3/2016 Dunn et al.
D753,269 S 4/2016 Yamagishi et al.
D753,629 S 4/2016 Plattard
9,305,836 B1 4/2016 Gates et al.
9,309,598 B2 4/2016 Wang et al.
9,309,978 B2 4/2016 Hatch et al.
9,310,684 B2 4/2016 Meyers et al.
9,312,155 B2 4/2016 Mori
9,315,897 B2 4/2016 Byun
9,324,811 B2 4/2016 Weeks
9,324,846 B1 4/2016 Camillo
D756,929 S 5/2016 Harck et al.
9,331,200 B1 5/2016 Wang et al.
9,337,054 B2 5/2016 Hunks et al.
9,337,057 B2 5/2016 Park et al.
9,341,296 B2 5/2016 Yednak
9,343,297 B1 5/2016 Fukazawa et al.
9,343,308 B2 5/2016 Isii
9,343,343 B2 5/2016 Mori
9,343,350 B2 5/2016 Arai
9,349,620 B2 5/2016 Kamata et al.
9,353,440 B2 5/2016 Ge et al.
9,353,441 B2 5/2016 Chung
9,355,876 B2 5/2016 Reuter et al.
9,355,882 B2 5/2016 Wu et al.
D759,137 S 6/2016 Hassan
9,362,107 B2 6/2016 Thadani et al.
9,362,137 B2 6/2016 Kang et al.
9,362,180 B2 6/2016 Lee et al.
9,365,924 B2 6/2016 Nonaka
9,368,352 B2 6/2016 Takamure et al.
9,370,863 B2 6/2016 Tsuji et al.
9,378,969 B2 6/2016 Hsu et al.
9,384,987 B2 7/2016 Jung et al.
9,390,909 B2 7/2016 Pasquale et al.
9,394,608 B2 7/2016 Shero et al.
9,396,934 B2 7/2016 Tolle
9,396,956 B1 7/2016 Fukazawa
9,399,228 B2 7/2016 Breiling et al.
D764,196 S 8/2016 Handler et al.
9,404,587 B2 8/2016 Shugrue
9,412,564 B2 8/2016 Milligan
9,412,581 B2 8/2016 Thadani et al.
9,412,582 B2 8/2016 Sasaki et al.
9,418,885 B2 8/2016 Sung et al.
9,425,078 B2 8/2016 Tang et al.
9,443,725 B2 9/2016 Liu et al.
9,447,498 B2 9/2016 Shiba et al.
9,449,793 B2 9/2016 Shaji et al.
9,449,795 B2 9/2016 Sabri et al.
9,455,138 B1 9/2016 Fukazawa
9,455,177 B1 9/2016 Park et al.
9,464,352 B2 10/2016 Nakano et al.
9,472,432 B1 10/2016 Blank
9,474,163 B2 10/2016 Tolle et al.
9,478,414 B2 10/2016 Kobayashi et al.
9,478,415 B2 10/2016 Kimura
D770,993 S 11/2016 Yoshida et al.
9,484,191 B2 11/2016 Winkler
9,496,225 B1 11/2016 Adusumilli et al.
9,514,927 B2 12/2016 Tolle et al.
9,514,932 B2 12/2016 Mallick et al.
9,520,289 B2 12/2016 Park et al.
9,523,148 B1 12/2016 Pore et al.
D777,546 S 1/2017 Ishii et al.
9,543,180 B2 1/2017 Kamiya
9,556,516 B2 1/2017 Takamure
9,558,931 B2 1/2017 Tang
9,564,312 B2 2/2017 Henri et al.
9,564,314 B2 2/2017 Takamure et al.
9,570,302 B1 2/2017 Chang et al.
9,574,268 B1 2/2017 Dunn et al.
9,576,952 B2 2/2017 Joshi et al.
9,583,333 B2 2/2017 Chatterjee
9,583,345 B2 2/2017 Chen et al.
D782,419 S 3/2017 Willette
9,589,770 B2 3/2017 Winkler
9,605,342 B2 3/2017 Alokozai et al.
9,605,343 B2 3/2017 Winkler
9,607,837 B1 3/2017 Namba
D783,351 S 4/2017 Fujino et al.
9,613,801 B2 4/2017 Carcasi et al.
9,627,221 B1 4/2017 Zaitsu et al.
D785,766 S 5/2017 Sato
D787,458 S 5/2017 Kim et al.
9,640,416 B2 5/2017 Arai
9,640,448 B2 5/2017 Ikegawa et al.
9,640,542 B2 5/2017 Lee et al.
9,644,266 B2 5/2017 Nasu et al.
9,647,114 B2 5/2017 Margetis
9,657,845 B2 5/2017 Shugrue
9,659,799 B2 5/2017 Lawson
9,663,857 B2 5/2017 Nakano et al.
9,666,528 B1 5/2017 Bergendahl et al.
D789,888 S 6/2017 Jang et al.
D790,041 S 6/2017 Jang et al.
9,680,268 B1 6/2017 Finona
9,684,234 B2 6/2017 Darling et al.
9,685,320 B2 6/2017 Kang et al.
9,691,668 B2 6/2017 Chang et al.
9,691,771 B2 6/2017 Lansalot-Matras
9,698,031 B2 7/2017 Kobayashi et al.
9,708,707 B2 7/2017 Ditizio et al.
9,708,708 B2 7/2017 Isobe et al.
9,711,345 B2 7/2017 Shiba et al.
D793,352 S 8/2017 Hill
D793,572 S 8/2017 Kozuka et al.
D793,976 S 8/2017 Fukushima et al.
D795,208 S 8/2017 Sasaki et al.
9,735,024 B2 8/2017 Zaitsu
9,741,546 B2 8/2017 Carducci et al.
9,741,559 B2 8/2017 Shimura et al.
9,745,658 B2 8/2017 Kang et al.
9,748,145 B1 8/2017 Kannan et al.

(56) References Cited

U.S. PATENT DOCUMENTS

D796,458 S 9/2017 Jang et al.
D796,670 S 9/2017 Dolk et al.
9,754,779 B1 9/2017 Ishikawa
9,754,818 B2 9/2017 Shiu et al.
9,759,489 B2 9/2017 Kaneko
9,765,432 B2 9/2017 Ge et al.
9,773,818 B2 9/2017 Kimura
9,778,561 B2 10/2017 Marks et al.
9,780,225 B2 10/2017 Venkatasubramanian et al.
9,786,491 B2 10/2017 Suzuki et al.
9,786,570 B2 10/2017 Kang et al.
9,790,595 B2 10/2017 Jung et al.
9,793,115 B2 10/2017 Tolle
9,793,135 B1 10/2017 Zaitsu et al.
9,793,148 B2 10/2017 Yamagishi et al.
9,798,308 B2 10/2017 Mimura
9,799,736 B1 10/2017 Ebrish et al.
D802,546 S 11/2017 Jang et al.
9,808,246 B2 11/2017 Shelton et al.
9,812,319 B1 11/2017 Fukazawa et al.
9,812,320 B1 11/2017 Pore et al.
9,820,289 B1 11/2017 Pawar et al.
9,824,884 B1 11/2017 Sims et al.
9,824,893 B1 11/2017 Smith et al.
9,837,355 B2 * 12/2017 Briggs .............. H01L 21/76831
9,847,221 B1 12/2017 McLaughlin et al.
D808,254 S 1/2018 Deleu
9,859,151 B1 1/2018 Niskanen
9,865,455 B1 1/2018 Sims et al.
9,865,456 B1 1/2018 Pandey et al.
9,865,815 B2 1/2018 Hausmann
9,868,131 B2 1/2018 Kilpi et al.
9,870,964 B1 1/2018 Yoshino et al.
9,875,891 B2 1/2018 Henri et al.
9,875,893 B2 1/2018 Takamure et al.
9,881,788 B2 1/2018 Kim et al.
D810,705 S 2/2018 Krishnan et al.
9,887,082 B1 2/2018 Pore et al.
9,890,456 B2 2/2018 Tolle et al.
9,891,521 B2 2/2018 Kang et al.
9,892,908 B2 2/2018 Pettinger et al.
9,892,913 B2 2/2018 Margetis et al.
9,895,715 B2 2/2018 Haukka et al.
9,899,291 B2 2/2018 Kato
9,899,405 B2 2/2018 Kim
9,905,420 B2 2/2018 Margetis et al.
9,905,492 B2 2/2018 Tang et al.
9,909,214 B2 3/2018 Suemori
9,909,492 B2 3/2018 Jeswine
9,911,676 B2 3/2018 Tang
9,916,980 B1 3/2018 Knaepen
9,920,451 B2 3/2018 Sivaramakrishnan et al.
9,922,824 B2 3/2018 Okada
9,929,005 B1 3/2018 Shimamoto et al.
9,929,011 B2 3/2018 Hawryluk et al.
9,951,421 B2 4/2018 Lind
9,960,033 B1 5/2018 Nozawa
9,960,072 B2 5/2018 Coomer
9,966,299 B2 5/2018 Tang et al.
9,984,869 B1 5/2018 Blanquart
D819,580 S 6/2018 Krishnan et al.
9,987,747 B2 6/2018 Hwang et al.
9,991,138 B2 6/2018 Lin et al.
9,996,004 B2 6/2018 Smith et al.
9,997,357 B2 6/2018 Arghavani et al.
9,997,373 B2 6/2018 Hudson
10,032,628 B2 6/2018 Xie et al.
10,014,212 B2 7/2018 Chen et al.
10,017,856 B1 7/2018 Arnepalli et al.
10,018,920 B2 7/2018 Chang et al.
10,023,960 B2 7/2018 Alokozai
10,032,792 B2 7/2018 Kim et al.
10,043,661 B2 8/2018 Kato et al.
10,047,435 B2 8/2018 Haukka et al.
10,053,774 B2 8/2018 Tolle et al.
10,060,473 B2 8/2018 Davey et al.
D827,592 S 9/2018 Ichino et al.
10,083,836 B2 9/2018 Milligan
D830,981 S 10/2018 Jeong et al.
10,087,522 B2 10/2018 Raisanen et al.
10,087,525 B2 10/2018 Schmotzer et al.
10,090,316 B2 10/2018 Ootsuka
10,103,040 B1 10/2018 Oosterlaken et al.
10,106,892 B1 10/2018 Siddiqui et al.
RE47,145 E 11/2018 Hashimoto
10,121,671 B2 11/2018 Fu et al.
10,134,617 B2 11/2018 Gurary et al.
10,134,757 B2 11/2018 Chun et al.
RE47,170 E 12/2018 Beynet et al.
10,147,600 B2 12/2018 Takamure et al.
10,167,557 B2 1/2019 Hawkins et al.
10,177,024 B2 1/2019 Gomm et al.
10,177,025 B2 1/2019 Pore
10,179,947 B2 1/2019 Fukazawa
10,186,420 B2 1/2019 Fukazawa
10,190,213 B2 1/2019 Zhu et al.
10,190,214 B2 1/2019 Shon et al.
10,190,701 B2 1/2019 Raj et al.
10,192,734 B2 1/2019 Sanchez et al.
10,193,429 B2 1/2019 Smith et al.
D840,364 S 2/2019 Ichino et al.
10,204,788 B1 2/2019 Ye et al.
10,211,308 B2 2/2019 Zhu et al.
10,229,833 B2 3/2019 Raisanen et al.
10,229,851 B2 * 3/2019 Briggs .................. H01L 21/321
10,236,177 B1 3/2019 Kohen et al.
10,249,524 B2 4/2019 den Hartog Besselink et al.
10,249,577 B2 4/2019 Lee et al.
10,262,859 B2 4/2019 Margetis et al.
10,269,558 B2 4/2019 Blanquart et al.
10,276,355 B2 4/2019 White et al.
D849,662 S 5/2019 Rike
10,283,353 B2 5/2019 Kobayashi et al.
10,287,684 B2 5/2019 Yanai et al.
10,290,508 B1 5/2019 Kubota et al.
10,297,440 B2 5/2019 Yamazaki et al.
RE47,440 E 6/2019 Yudovsky et al.
10,312,055 B2 6/2019 Suzuki
10,312,129 B2 6/2019 Coomer
10,319,588 B2 6/2019 Mattinen et al.
10,322,384 B2 6/2019 Stumpf et al.
10,332,963 B1 6/2019 Xie
D855,089 S 7/2019 Hopkins
10,340,125 B2 7/2019 Winkler
10,340,135 B2 7/2019 Blanquart
10,343,920 B2 7/2019 Haukka
10,347,547 B2 7/2019 Varadarajan et al.
10,354,873 B2 7/2019 Ko et al.
10,361,201 B2 7/2019 Xie et al.
10,361,366 B2 7/2019 Hakamata et al.
10,367,080 B2 7/2019 Tang et al.
10,388,513 B1 8/2019 Blanquart
10,395,917 B2 8/2019 Niskanen et al.
10,395,919 B2 8/2019 Masaru et al.
D859,136 S 9/2019 Tenander et al.
10,400,335 B2 9/2019 Ge et al.
10,410,943 B2 9/2019 Jiang et al.
10,428,419 B2 10/2019 Huotari et al.
10,435,790 B2 10/2019 Fukazawa et al.
D867,867 S 11/2019 Tenander et al.
10,468,244 B2 11/2019 Li et al.
10,468,251 B2 11/2019 Ishikawa et al.
10,483,154 B1 11/2019 Smith et al.
10,510,871 B1 12/2019 More et al.
10,529,554 B2 1/2020 Ishikawa et al.
D876,504 S 2/2020 Lee et al.
10,590,531 B1 3/2020 Shirako et al.
10,600,637 B2 3/2020 Suzuki et al.
D880,437 S 4/2020 Lee et al.
10,622,196 B2 4/2020 Nagayama et al.
10,648,788 B2 5/2020 Boyd et al.
10,714,335 B2 7/2020 Kim et al.
10,763,139 B2 9/2020 Shindo
D900,036 S 10/2020 Wuester et al.

(56) References Cited

U.S. PATENT DOCUMENTS

D903,477 S 12/2020 Goratela et al.
2001/0000141 A1 4/2001 Zhou et al.
2001/0001953 A1 5/2001 Griffiths et al.
2001/0002581 A1 6/2001 Nishikawa et al.
2001/0003015 A1 6/2001 Chang et al.
2001/0003191 A1 6/2001 Kovacs et al.
2001/0004880 A1 6/2001 Cho et al.
2001/0006070 A1 7/2001 Shang
2001/0007246 A1 7/2001 Ueda et al.
2001/0007645 A1 7/2001 Honma
2001/0014267 A1 8/2001 Yamaga et al.
2001/0014514 A1 8/2001 Geusic
2001/0015343 A1 8/2001 Sprey et al.
2001/0016273 A1 8/2001 Narasimhan et al.
2001/0017103 A1 8/2001 Takeshita et al.
2001/0018267 A1 8/2001 Shinriki et al.
2001/0019777 A1 9/2001 Tanaka et al.
2001/0019900 A1 9/2001 Hasegawa
2001/0020715 A1 9/2001 Yamasaki
2001/0021591 A1 9/2001 Srinivasan et al.
2001/0022215 A1 9/2001 Donohoe
2001/0027026 A1 10/2001 Dhindsa et al.
2001/0028924 A1 10/2001 Sherman
2001/0031535 A1 10/2001 Agnello et al.
2001/0031541 A1 10/2001 Madan et al.
2001/0034097 A1 10/2001 Lim et al.
2001/0038783 A1 11/2001 Nakashima et al.
2001/0039922 A1 11/2001 Nakahara
2001/0039966 A1 11/2001 Walpole et al.
2001/0040511 A1 11/2001 Bushner et al.
2001/0041250 A1 11/2001 Werkhoven et al.
2001/0042511 A1 11/2001 Liu et al.
2001/0042594 A1 11/2001 Shamouilian et al.
2001/0046765 A1 11/2001 Cappellani et al.
2001/0047761 A1 12/2001 Wijck et al.
2001/0048981 A1 12/2001 Suzuki
2001/0049080 A1 12/2001 Asano
2001/0049202 A1 12/2001 Maeda et al.
2001/0054388 A1 12/2001 Qian
2002/0000195 A1 1/2002 Bang et al.
2002/0000202 A1 1/2002 Yuda et al.
2002/0001971 A1 1/2002 Cho
2002/0001974 A1 1/2002 Chan
2002/0001976 A1 1/2002 Danek
2002/0005400 A1 1/2002 Gat et al.
2002/0005943 A1 1/2002 Voinalovich
2002/0008270 A1 1/2002 Marsh
2002/0009119 A1 1/2002 Matthew et al.
2002/0009560 A1 1/2002 Ozono
2002/0009861 A1 1/2002 Narwankar et al.
2002/0011210 A1 1/2002 Satoh et al.
2002/0011211 A1 1/2002 Halpin
2002/0011310 A1 1/2002 Kamarehi et al.
2002/0013792 A1 1/2002 Imielinski et al.
2002/0014204 A1 2/2002 Pyo
2002/0014483 A1 2/2002 Suzuki et al.
2002/0016829 A1 2/2002 Defosse
2002/0020429 A1 2/2002 Selbrede et al.
2002/0023677 A1 2/2002 Zheng
2002/0025688 A1 2/2002 Kato
2002/0027945 A1 3/2002 Hirano et al.
2002/0030047 A1 3/2002 Shao et al.
2002/0031644 A1 3/2002 Malofsky et al.
2002/0041931 A1 4/2002 Suntola et al.
2002/0043337 A1 4/2002 Goodman et al.
2002/0045336 A1 4/2002 Locati et al.
2002/0048634 A1 4/2002 Basceri
2002/0050648 A1 5/2002 Kishida et al.
2002/0062633 A1 5/2002 Denker et al.
2002/0064592 A1 5/2002 Datta et al.
2002/0064598 A1 5/2002 Wang et al.
2002/0066532 A1 6/2002 Shih et al.
2002/0068458 A1 6/2002 Chiang et al.
2002/0069222 A1 6/2002 McNeely
2002/0073922 A1 6/2002 Frankel et al.
2002/0073923 A1 6/2002 Saito et al.
2002/0076490 A1 6/2002 Chiang et al.
2002/0076507 A1 6/2002 Chiang et al.
2002/0076944 A1 6/2002 Wang et al.
2002/0078893 A1 6/2002 Van Os et al.
2002/0079714 A1 6/2002 Soucy et al.
2002/0081826 A1 6/2002 Rotondaro et al.
2002/0086501 A1 7/2002 O'Donnell et al.
2002/0088542 A1 7/2002 Nishikawa et al.
2002/0090735 A1 7/2002 Kishkovich et al.
2002/0094378 A1 7/2002 O'Donnell et al.
2002/0094388 A1 7/2002 Fonash et al.
2002/0096211 A1 7/2002 Zheng
2002/0098627 A1 7/2002 Pomarede et al.
2002/0099470 A1 7/2002 Zinger et al.
2002/0100418 A1 8/2002 Sandhu et al.
2002/0104481 A1 8/2002 Chiang et al.
2002/0104751 A1 8/2002 Drewery et al.
2002/0108670 A1 8/2002 Baker et al.
2002/0108714 A1 8/2002 Doering et al.
2002/0109115 A1 8/2002 Cederstav et al.
2002/0110695 A1 8/2002 Yang et al.
2002/0110991 A1 8/2002 Li
2002/0112114 A1 8/2002 Blair et al.
2002/0114886 A1 8/2002 Chou et al.
2002/0115252 A1 8/2002 Haukka et al.
2002/0117113 A1 8/2002 Tsuruno et al.
2002/0122885 A1 9/2002 Ahn
2002/0123200 A1 9/2002 Yamamoto et al.
2002/0123230 A1 9/2002 Hubacek
2002/0123237 A1 9/2002 Nguyen et al.
2002/0124883 A1 9/2002 Zheng
2002/0124906 A1 9/2002 Suzuki et al.
2002/0127350 A1 9/2002 Ishikawa
2002/0129768 A1 9/2002 Carpenter et al.
2002/0132408 A1 9/2002 Ma et al.
2002/0134511 A1 9/2002 Ushioda et al.
2002/0136214 A1 9/2002 Do et al.
2002/0136909 A1 9/2002 Yang
2002/0139775 A1 10/2002 Chang
2002/0146512 A1 10/2002 Rossman
2002/0151327 A1 10/2002 Levitt
2002/0152244 A1 10/2002 Dean et al.
2002/0155219 A1 10/2002 Wang et al.
2002/0155708 A1 10/2002 Lo et al.
2002/0157611 A1 10/2002 Bondestam et al.
2002/0160112 A1 10/2002 Sakai et al.
2002/0164420 A1 11/2002 Derderian et al.
2002/0164423 A1 11/2002 Chiang et al.
2002/0168870 A1 11/2002 Matsuki
2002/0170676 A1 11/2002 Mitrovic et al.
2002/0172768 A1 11/2002 Endo et al.
2002/0174106 A1 11/2002 Martin
2002/0179011 A1 12/2002 Jonnalagadda et al.
2002/0181612 A1 12/2002 Warble et al.
2002/0184111 A1 12/2002 Swanson
2002/0187650 A1 12/2002 Blalock et al.
2002/0187656 A1 12/2002 Tan et al.
2002/0188376 A1 12/2002 Derderian et al.
2002/0192370 A1 12/2002 Metzner et al.
2002/0197402 A1 12/2002 Chiang et al.
2002/0197849 A1 12/2002 Mandal
2003/0000647 A1 1/2003 Yudovsky et al.
2003/0002562 A1 1/2003 Yerlikaya et al.
2003/0003607 A1 1/2003 Kagoshima
2003/0003635 A1 1/2003 Paranjpe et al.
2003/0003696 A1 1/2003 Gelatos et al.
2003/0003719 A1 1/2003 Lim et al.
2003/0008528 A1 1/2003 Xia et al.
2003/0010355 A1 1/2003 Nowak et al.
2003/0010451 A1 1/2003 Tzu
2003/0010452 A1 1/2003 Park et al.
2003/0012632 A1 1/2003 Saeki
2003/0015141 A1 1/2003 Takagi
2003/0015294 A1 1/2003 Wang
2003/0015596 A1 1/2003 Evans
2003/0017265 A1 1/2003 Basceri et al.
2003/0017266 A1 1/2003 Basceri et al.
2003/0017268 A1 1/2003 Hu

(56) References Cited

U.S. PATENT DOCUMENTS

2003/0019428 A1 1/2003 Ku et al.
2003/0019580 A1 1/2003 Strang
2003/0022468 A1 1/2003 Shioya et al.
2003/0022523 A1 1/2003 Irino et al.
2003/0023338 A1 1/2003 Chin et al.
2003/0024901 A1 2/2003 Ishikawa
2003/0025146 A1 2/2003 Narwankar et al.
2003/0026904 A1 2/2003 Yadav et al.
2003/0027431 A1 2/2003 Sneh et al.
2003/0029303 A1 2/2003 Hasegawa et al.
2003/0029381 A1 2/2003 Nishibayashi
2003/0029475 A1 2/2003 Hua et al.
2003/0032297 A1 2/2003 Lindstrom et al.
2003/0035002 A1 2/2003 Moles
2003/0035705 A1 2/2003 Johnson
2003/0036272 A1 2/2003 Shamouilian et al.
2003/0037800 A1 2/2003 Bailey et al.
2003/0040120 A1 2/2003 Allen et al.
2003/0040158 A1 2/2003 Saitoh
2003/0040196 A1 2/2003 Lim et al.
2003/0040841 A1 2/2003 Nasr et al.
2003/0041971 A1 3/2003 Kido et al.
2003/0042419 A1 3/2003 Katsumata et al.
2003/0045961 A1 3/2003 Nakao
2003/0049372 A1 3/2003 Cook et al.
2003/0049375 A1 3/2003 Nguyen et al.
2003/0049499 A1 3/2003 Murakawa et al.
2003/0049937 A1 3/2003 Suzuki
2003/0054670 A1 3/2003 Wang et al.
2003/0057848 A1 3/2003 Yuasa et al.
2003/0059535 A1 3/2003 Luo et al.
2003/0059980 A1 3/2003 Chen et al.
2003/0062359 A1 4/2003 Ho et al.
2003/0065413 A1 4/2003 Liteplo et al.
2003/0066482 A1 4/2003 Pokharna et al.
2003/0066541 A1 4/2003 Sun et al.
2003/0066826 A1 4/2003 Lee et al.
2003/0070617 A1 4/2003 Kim et al.
2003/0071015 A1 4/2003 Chinn et al.
2003/0072882 A1 4/2003 Niinisto et al.
2003/0075925 A1 4/2003 Lindfors et al.
2003/0077857 A1 4/2003 Xia et al.
2003/0077883 A1 4/2003 Ohtake
2003/0082296 A1 5/2003 Elers et al.
2003/0082307 A1 5/2003 Chung et al.
2003/0085663 A1 5/2003 Horsky
2003/0091938 A1 5/2003 Fairbairn et al.
2003/0094133 A1 5/2003 Yoshidome et al.
2003/0101938 A1 6/2003 Ronsse et al.
2003/0109107 A1 6/2003 Hsieh et al.
2003/0109951 A1 6/2003 Hsiung et al.
2003/0111013 A1 6/2003 Oosterlaken et al.
2003/0111963 A1 6/2003 Tolmachev et al.
2003/0116087 A1 6/2003 Nguyen
2003/0121608 A1 7/2003 Chen
2003/0124792 A1 7/2003 Jeon et al.
2003/0124818 A1 7/2003 Luo et al.
2003/0124820 A1 7/2003 Johnsgard et al.
2003/0124842 A1 7/2003 Hytros et al.
2003/0127049 A1 7/2003 Han et al.
2003/0133854 A1 7/2003 Tabata et al.
2003/0134038 A1 7/2003 Paranjpe
2003/0140851 A1 7/2003 Janakiraman et al.
2003/0141527 A1 7/2003 Joo et al.
2003/0141820 A1 7/2003 White et al.
2003/0143328 A1 7/2003 Chen
2003/0145789 A1 8/2003 Bauch et al.
2003/0149506 A1 8/2003 Haanstra et al.
2003/0153177 A1 8/2003 Tepman et al.
2003/0153186 A1 8/2003 Bar-Gadda
2003/0157432 A1 8/2003 Rottsegge
2003/0157436 A1 8/2003 Manger et al.
2003/0159653 A1 8/2003 Dando et al.
2003/0159656 A1 8/2003 Tan
2003/0162412 A1 8/2003 Chung
2003/0168001 A1 9/2003 Sneh
2003/0168008 A1 9/2003 Ohmi et al.
2003/0168012 A1 9/2003 Tamura et al.
2003/0168699 A1 9/2003 Honda
2003/0168750 A1 9/2003 Basceri et al.
2003/0168948 A1 9/2003 Yamagishi et al.
2003/0170153 A1 9/2003 Bar-Gadda
2003/0170583 A1 9/2003 Nakashima
2003/0170945 A1 9/2003 Igeta et al.
2003/0173030 A1 9/2003 Ishii
2003/0173490 A1 9/2003 Lappen
2003/0176074 A1 9/2003 Paterson et al.
2003/0178145 A1 9/2003 Anderson et al.
2003/0180458 A1 9/2003 Sneh
2003/0183156 A1 10/2003 Dando
2003/0183856 A1 10/2003 Wieczorek et al.
2003/0188682 A1 10/2003 Tois et al.
2003/0188685 A1 10/2003 Wang
2003/0190804 A1 10/2003 Glenn et al.
2003/0192875 A1 10/2003 Bieker et al.
2003/0198587 A1 10/2003 Kaloyeros
2003/0201541 A1 10/2003 Kim
2003/0205096 A1 11/2003 Gehner et al.
2003/0205202 A1 11/2003 Funaki et al.
2003/0205327 A1 11/2003 Howald et al.
2003/0207032 A1 11/2003 Ahn et al.
2003/0209323 A1 11/2003 Yokogaki
2003/0209326 A1 11/2003 Lee et al.
2003/0209746 A1 11/2003 Horii
2003/0210901 A1 11/2003 Donald et al.
2003/0211735 A1 11/2003 Rossman
2003/0213435 A1 11/2003 Okuda et al.
2003/0213560 A1 11/2003 Wang et al.
2003/0213562 A1 11/2003 Gondhalekar et al.
2003/0215963 A1 11/2003 AmRhein et al.
2003/0217915 A1 11/2003 Ouellet
2003/0219972 A1 11/2003 Green
2003/0221780 A1 12/2003 Lei et al.
2003/0226840 A1 12/2003 Dalton
2003/0228772 A1 12/2003 Cowans
2003/0230986 A1 12/2003 Horsky et al.
2003/0231698 A1 12/2003 Yamaguchi
2003/0232138 A1 12/2003 Tuominen et al.
2003/0232491 A1 12/2003 Yamaguchi
2003/0232511 A1 12/2003 Metzner et al.
2003/0234371 A1 12/2003 Ziegler
2004/0002224 A1 1/2004 Chono et al.
2004/0005147 A1 1/2004 Wang et al.
2004/0009307 A1 1/2004 Koh et al.
2004/0009679 A1 1/2004 Yeo et al.
2004/0010772 A1 1/2004 McKenna et al.
2004/0011504 A1 1/2004 Ku et al.
2004/0013577 A1 1/2004 Ganguli et al.
2004/0013818 A1 1/2004 Moon et al.
2004/0015300 A1 1/2004 Ganguli et al.
2004/0016637 A1 1/2004 Yang
2004/0018304 A1 1/2004 Chung et al.
2004/0018307 A1 1/2004 Park et al.
2004/0018723 A1 1/2004 Byun et al.
2004/0018750 A1 1/2004 Sophie et al.
2004/0023125 A1 2/2004 Nozawa et al.
2004/0023516 A1 2/2004 Londergan et al.
2004/0025786 A1 2/2004 Kontani et al.
2004/0025787 A1 2/2004 Selbrede et al.
2004/0026372 A1 2/2004 Takenaka et al.
2004/0029052 A1 2/2004 Park et al.
2004/0031564 A1 2/2004 Gottscho et al.
2004/0035358 A1 2/2004 Basceri et al.
2004/0036129 A1 2/2004 Forbes et al.
2004/0037339 A1 2/2004 Watson et al.
2004/0037675 A1 2/2004 Zinger et al.
2004/0038525 A1 2/2004 Meng et al.
2004/0043149 A1 3/2004 Gordon et al.
2004/0043544 A1 3/2004 Asai et al.
2004/0048439 A1 3/2004 Soman
2004/0048452 A1 3/2004 Sugawara et al.
2004/0048492 A1 3/2004 Ishikawa et al.
2004/0050325 A1 3/2004 Samoilov
2004/0050496 A1 3/2004 Iwai

(56) References Cited

U.S. PATENT DOCUMENTS

2004/0052972 A1 3/2004 Schmitt
2004/0056017 A1 3/2004 Renken
2004/0062081 A1 4/2004 Drewes
2004/0063289 A1 4/2004 Ohta
2004/0065255 A1 4/2004 Yang et al.
2004/0069226 A1 4/2004 Yoshida et al.
2004/0071897 A1 4/2004 Verplancken et al.
2004/0077182 A1 4/2004 Lim et al.
2004/0079286 A1 4/2004 Lindfors
2004/0079960 A1 4/2004 Shakuda
2004/0080697 A1 4/2004 Song
2004/0082171 A1 4/2004 Shin et al.
2004/0083961 A1 5/2004 Basceri
2004/0083964 A1 5/2004 Ingle et al.
2004/0083975 A1 5/2004 Tong et al.
2004/0087141 A1 5/2004 Ramanathan et al.
2004/0087168 A1 5/2004 Granneman et al.
2004/0089078 A1 5/2004 Gehner et al.
2004/0089236 A1 5/2004 Yokogawa et al.
2004/0092073 A1 5/2004 Cabral et al.
2004/0092120 A1 5/2004 Wicker
2004/0093963 A1 5/2004 Gehner et al.
2004/0094206 A1 5/2004 Ishida
2004/0094402 A1 5/2004 Gopalraja
2004/0095074 A1 5/2004 Ishii et al.
2004/0099213 A1 5/2004 Adomaitis et al.
2004/0101622 A1 5/2004 Park et al.
2004/0103914 A1 6/2004 Cheng et al.
2004/0105738 A1 6/2004 Ahn et al.
2004/0106249 A1 6/2004 Huotari
2004/0115936 A1 6/2004 DePetrillo et al.
2004/0121620 A1 6/2004 Pomarede et al.
2004/0124131 A1 7/2004 Aitchison
2004/0124549 A1 7/2004 Curran
2004/0126213 A1 7/2004 Pelzmann et al.
2004/0126990 A1 7/2004 Ohta
2004/0127069 A1 7/2004 Yamazaki et al.
2004/0129211 A1 7/2004 Blonigan et al.
2004/0129671 A1 7/2004 Ji et al.
2004/0134429 A1 7/2004 Yamanaka
2004/0137756 A1 7/2004 Li et al.
2004/0142577 A1 7/2004 Sugawara et al.
2004/0144311 A1 7/2004 Chen
2004/0144323 A1 7/2004 Kai
2004/0144980 A1 7/2004 Ahn et al.
2004/0146644 A1 7/2004 Xia et al.
2004/0151844 A1 8/2004 Zhang et al.
2004/0151845 A1 8/2004 Nguyen et al.
2004/0152287 A1 8/2004 Sherrill et al.
2004/0159343 A1 8/2004 Shimbara et al.
2004/0168627 A1 9/2004 Conley et al.
2004/0168742 A1 9/2004 Kim et al.
2004/0168769 A1 9/2004 Matsuoka et al.
2004/0169032 A1 9/2004 Murayama et al.
2004/0185177 A1 9/2004 Basceri et al.
2004/0187304 A1 9/2004 Chen et al.
2004/0187777 A1 9/2004 Okamoto et al.
2004/0187784 A1 9/2004 Sferlazzo
2004/0187790 A1 9/2004 Bader
2004/0187928 A1 9/2004 Ambrosina
2004/0198069 A1 10/2004 Metzner et al.
2004/0200499 A1 10/2004 Harvey et al.
2004/0202786 A1 10/2004 Wongsenakhum et al.
2004/0203251 A1 10/2004 Kawaguchi et al.
2004/0206305 A1 10/2004 Choi et al.
2004/0208228 A1 10/2004 Hashikura et al.
2004/0209477 A1 10/2004 Buxbaum et al.
2004/0211357 A1 10/2004 Gadgil
2004/0212947 A1 10/2004 Nguyen
2004/0213921 A1 10/2004 Leu
2004/0214399 A1 10/2004 Ahn et al.
2004/0214445 A1 10/2004 Shimizu et al.
2004/0217217 A1 11/2004 Han et al.
2004/0219793 A1 11/2004 Hishiya et al.
2004/0220699 A1 11/2004 Heden et al.
2004/0221807 A1 11/2004 Verghese et al.
2004/0221808 A1 11/2004 Kawano
2004/0223893 A1 11/2004 Tabata et al.
2004/0226515 A1 11/2004 Yendler et al.
2004/0228968 A1 11/2004 Basceri
2004/0231600 A1 11/2004 Lee
2004/0231799 A1 11/2004 Lee et al.
2004/0238523 A1 12/2004 Kuibira et al.
2004/0241322 A1 12/2004 Basceri et al.
2004/0241998 A1 12/2004 Hanson
2004/0245091 A1 12/2004 Karim et al.
2004/0247779 A1 12/2004 Selvamanickam et al.
2004/0250600 A1 12/2004 Bevers et al.
2004/0253867 A1 12/2004 Matsumoto
2004/0261492 A1 12/2004 Zarkar et al.
2004/0261712 A1 12/2004 Hayashi et al.
2004/0261946 A1 12/2004 Endoh et al.
2004/0266011 A1 12/2004 Lee et al.
2005/0000428 A1 1/2005 Shero et al.
2005/0001062 A1 1/2005 McCracken et al.
2005/0003089 A1 1/2005 Won et al.
2005/0003600 A1 1/2005 Kasai et al.
2005/0003662 A1 1/2005 Jurisch et al.
2005/0008799 A1 1/2005 Tomiyasu et al.
2005/0009325 A1 1/2005 Chung et al.
2005/0016470 A1 1/2005 Kang et al.
2005/0016956 A1 1/2005 Liu et al.
2005/0017272 A1 1/2005 Yamashita et al.
2005/0019026 A1 1/2005 Wang et al.
2005/0019494 A1 1/2005 Moghadam et al.
2005/0019960 A1 1/2005 Lee et al.
2005/0020071 A1 1/2005 Sonobe et al.
2005/0023624 A1 2/2005 Ahn et al.
2005/0026402 A1 2/2005 Jurgensen
2005/0033075 A1 2/2005 Chi et al.
2005/0034664 A1 2/2005 Koh et al.
2005/0034674 A1 2/2005 Ono
2005/0037154 A1 2/2005 Koh et al.
2005/0037578 A1 2/2005 Chen et al.
2005/0037610 A1 2/2005 Cha
2005/0037619 A1 2/2005 Granneman et al.
2005/0040144 A1 2/2005 Sellers
2005/0042778 A1 2/2005 Peukert
2005/0046825 A1 3/2005 Powell et al.
2005/0048797 A1 3/2005 Fukazawa
2005/0051093 A1 3/2005 Makino et al.
2005/0051100 A1 3/2005 Chiang et al.
2005/0054175 A1 3/2005 Bauer
2005/0054198 A1 3/2005 Um
2005/0054228 A1 3/2005 March
2005/0056218 A1 3/2005 Sun et al.
2005/0056780 A1 3/2005 Miller et al.
2005/0059261 A1 3/2005 Basceri et al.
2005/0059262 A1 3/2005 Yin et al.
2005/0059264 A1 3/2005 Cheung
2005/0061964 A1 3/2005 Nagano et al.
2005/0063451 A1 3/2005 Abe et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070128 A1 3/2005 Xia et al.
2005/0070729 A1 3/2005 Kiyomori et al.
2005/0072357 A1 4/2005 Shero et al.
2005/0074576 A1 4/2005 Chaiken et al.
2005/0074983 A1 4/2005 Shinriki et al.
2005/0079124 A1 4/2005 Sanderson
2005/0079691 A1 4/2005 Kim et al.
2005/0092247 A1 5/2005 Schmidt
2005/0092249 A1 5/2005 Kilpela et al.
2005/0092733 A1 5/2005 Ito et al.
2005/0095770 A1 5/2005 Kumagai et al.
2005/0095779 A1 5/2005 Park et al.
2005/0095859 A1 5/2005 Chen et al.
2005/0098107 A1 5/2005 Du Bois et al.
2005/0100669 A1 5/2005 Kools et al.
2005/0101154 A1 5/2005 Huang
2005/0101843 A1 5/2005 Quinn et al.

(56) References Cited

U.S. PATENT DOCUMENTS

2005/0106762 A1 5/2005 Chakrapani et al.
2005/0106893 A1 5/2005 Wilk
2005/0107627 A1 5/2005 Dussarrat et al.
2005/0109461 A1 5/2005 Sun
2005/0110069 A1 5/2005 Kil et al.
2005/0112282 A1 5/2005 Gordon et al.
2005/0115946 A1 6/2005 Shim et al.
2005/0118804 A1 6/2005 Byun et al.
2005/0118837 A1 6/2005 Todd
2005/0120805 A1 6/2005 Lane
2005/0120962 A1 6/2005 Ushioda et al.
2005/0121145 A1 6/2005 Du Bois et al.
2005/0123690 A1 6/2005 Derderian et al.
2005/0130427 A1 6/2005 Seok-Jun
2005/0132957 A1 6/2005 El-Raghy
2005/0133160 A1 6/2005 Kennedy et al.
2005/0133161 A1 6/2005 Carpenter et al.
2005/0136188 A1 6/2005 Chang
2005/0139160 A1 6/2005 Lei et al.
2005/0141591 A1 6/2005 Sakano
2005/0142361 A1 6/2005 Nakanishi
2005/0145338 A1 7/2005 Park et al.
2005/0148162 A1 7/2005 Chen et al.
2005/0150601 A1 7/2005 Srivastava
2005/0151184 A1 7/2005 Lee et al.
2005/0153571 A1 7/2005 Senzaki
2005/0160987 A1 7/2005 Kasai et al.
2005/0161434 A1 7/2005 Sugawara et al.
2005/0172895 A1 8/2005 Kijima et al.
2005/0173003 A1 8/2005 Laverdiere et al.
2005/0175789 A1 8/2005 Helms
2005/0178333 A1 8/2005 Loke et al.
2005/0181535 A1 8/2005 Yun et al.
2005/0181555 A1 8/2005 Haukka et al.
2005/0183827 A1 8/2005 White et al.
2005/0186688 A1 8/2005 Basceri
2005/0187647 A1 8/2005 Wang et al.
2005/0191828 A1 9/2005 Al-Bayati et al.
2005/0193948 A1 9/2005 Oohirabaru et al.
2005/0199013 A1 9/2005 Vandroux et al.
2005/0199342 A1 9/2005 Shajii et al.
2005/0201908 A1 9/2005 Nakamura et al.
2005/0208217 A1 9/2005 Shinriki et al.
2005/0208219 A1 9/2005 Basceri
2005/0208718 A1 9/2005 Lim et al.
2005/0211167 A1 9/2005 Gunji
2005/0211384 A1 9/2005 Hayashi
2005/0212119 A1 9/2005 Shero
2005/0214457 A1 9/2005 Schmitt et al.
2005/0214458 A1 9/2005 Meiere
2005/0208778 A1 10/2005 Li
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057799 A1 3/2006 Horiguchi et al.
2006/0057828 A1 3/2006 Omura
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0118240 A1 6/2006 Holber et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130767 A1 6/2006 Herchen
2006/0137608 A1 6/2006 Choi et al.
2006/0137609 A1 6/2006 Puchacz et al.
2006/0141155 A1 6/2006 Gordon et al.

(56) References Cited

U.S. PATENT DOCUMENTS

2006/0144820 A1 7/2006 Sawin et al.
2006/0147626 A1 7/2006 Blomberg
2006/0148180 A1 7/2006 Ahn et al.
2006/0151117 A1 7/2006 Kasanami et al.
2006/0154424 A1 7/2006 Yang et al.
2006/0156981 A1 7/2006 Fondurulia
2006/0162658 A1 7/2006 Weidman
2006/0162863 A1 7/2006 Kim et al.
2006/0163612 A1 7/2006 Kouvetakis et al.
2006/0163683 A1 7/2006 Roth et al.
2006/0165892 A1 7/2006 Weidman
2006/0166428 A1 7/2006 Kamioka
2006/0172531 A1 8/2006 Lin et al.
2006/0175669 A1 8/2006 Kim et al.
2006/0177855 A1 8/2006 Utermohlen
2006/0182885 A1 8/2006 Lei et al.
2006/0185589 A1 8/2006 Zehavi et al.
2006/0188360 A1 8/2006 Bonora et al.
2006/0191555 A1 8/2006 Yoshida et al.
2006/0193979 A1 8/2006 Meiere et al.
2006/0196418 A1 9/2006 Lindfors et al.
2006/0196420 A1 9/2006 Ushakov et al.
2006/0196421 A1 9/2006 Ronsse et al.
2006/0199357 A1 9/2006 Wan et al.
2006/0205194 A1 9/2006 Bauer
2006/0205223 A1 9/2006 Smayling
2006/0205231 A1 9/2006 Chou et al.
2006/0208215 A1 9/2006 Metzner et al.
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0228898 A1 10/2006 Wajda et al.
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249253 A1 11/2006 Dando
2006/0251827 A1 11/2006 Nowak
2006/0252228 A1 11/2006 Jeng
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.
2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087579 A1 4/2007 Kitayama et al.
2007/0089670 A1 4/2007 Ikedo
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111470 A1 5/2007 Smythe
2007/0111545 A1 5/2007 Lee et al.
2007/0113788 A1 5/2007 Nozawa et al.
2007/0116872 A1 5/2007 Li et al.
2007/0116873 A1 5/2007 Li et al.
2007/0116887 A1 5/2007 Faguet
2007/0116888 A1 5/2007 Faguet
2007/0119370 A1 5/2007 Ma et al.
2007/0120275 A1 5/2007 Liu
2007/0123037 A1 5/2007 Lee et al.
2007/0123189 A1 5/2007 Saito et al.
2007/0125762 A1 6/2007 Cui et al.
2007/0128538 A1 6/2007 Fairbairn et al.
2007/0128858 A1 6/2007 Haukka et al.
2007/0128876 A1 6/2007 Fukiage
2007/0128888 A1 6/2007 Goto et al.
2007/0129621 A1 6/2007 Kellogg et al.

(56) References Cited

U.S. PATENT DOCUMENTS

2007/0131168 A1 6/2007 Gomi et al.
2007/0134919 A1 6/2007 Gunji et al.
2007/0134942 A1 6/2007 Ahn et al.
2007/0137794 A1 6/2007 Qiu et al.
2007/0146621 A1 6/2007 Yeom
2007/0148347 A1 6/2007 Hatanpaa et al.
2007/0148350 A1 6/2007 Rahtu
2007/0148990 A1 6/2007 Deboer et al.
2007/0153625 A1 6/2007 Lundgren et al.
2007/0155138 A1 7/2007 Tomasini et al.
2007/0157466 A1 7/2007 Kida et al.
2007/0157683 A1 7/2007 Li
2007/0158026 A1 7/2007 Amikura
2007/0163440 A1 7/2007 Kim et al.
2007/0163625 A1 7/2007 Lee
2007/0163996 A1 7/2007 Horiguchi
2007/0166457 A1 7/2007 Yamoto et al.
2007/0166966 A1 7/2007 Todd et al.
2007/0166999 A1 7/2007 Vaarstra
2007/0170372 A1 7/2007 Horsky
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0181066 A1 8/2007 Cadwell et al.
2007/0184179 A1 8/2007 Waghray et al.
2007/0186849 A1 8/2007 Furuya
2007/0186952 A1 8/2007 Honda et al.
2007/0187362 A1 8/2007 Nakagawa et al.
2007/0187363 A1 8/2007 Oka et al.
2007/0190266 A1 8/2007 Fu et al.
2007/0190362 A1 8/2007 Weidman
2007/0190744 A1 8/2007 Hiraiwa et al.
2007/0190782 A1 8/2007 Park
2007/0199510 A1 8/2007 Weiner et al.
2007/0202678 A1 8/2007 Plombon et al.
2007/0207275 A1 9/2007 Nowak et al.
2007/0209588 A1 9/2007 Li et al.
2007/0209590 A1 9/2007 Li
2007/0210890 A1 9/2007 Hsu et al.
2007/0212484 A1 9/2007 Li
2007/0212811 A1 9/2007 Hanawa et al.
2007/0212827 A1 9/2007 Girotra et al.
2007/0215048 A1 9/2007 Suzuki et al.
2007/0215580 A1 9/2007 Koshiishi et al.
2007/0218200 A1 9/2007 Suzuki et al.
2007/0218705 A1 9/2007 Matsuki et al.
2007/0224777 A1 9/2007 Hamelin
2007/0224833 A1 9/2007 Morisada et al.
2007/0227665 A1 10/2007 Matsumoto et al.
2007/0231488 A1 10/2007 Von Kaenel
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0238305 A1 10/2007 Delgadino et al.
2007/0241688 A1 10/2007 DeVancentis et al.
2007/0243317 A1 10/2007 Du Bois et al.
2007/0247075 A1 10/2007 Kim et al.
2007/0248767 A1 10/2007 Okura
2007/0249131 A1 10/2007 Allen et al.
2007/0251444 A1 11/2007 Gros-Jean et al.
2007/0251456 A1 11/2007 Herchen et al.
2007/0252233 A1 11/2007 Yamazaki et al.
2007/0252244 A1 11/2007 Srividya et al.
2007/0252532 A1 11/2007 DeVancentis et al.
2007/0254414 A1 11/2007 Miyanami
2007/0258506 A1 11/2007 Schwagerman et al.
2007/0258855 A1 11/2007 Turcot et al.
2007/0259778 A1 11/2007 Spencer et al.
2007/0261868 A1 11/2007 Gross
2007/0264807 A1 11/2007 Leone et al.
2007/0266932 A1 11/2007 Hiramatsu
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281496 A1 12/2007 Ingle et al.
2007/0286957 A1 12/2007 Suzuki et al.
2007/0289534 A1 12/2007 Lubomirsky et al.
2007/0292974 A1 12/2007 Mizuno et al.
2007/0295602 A1 12/2007 Tiller et al.
2007/0298362 A1 12/2007 Rocha-Alvarez et al.
2007/0298565 A1 12/2007 Nieh et al.
2008/0003425 A1 1/2008 Spencer et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026162 A1 1/2008 Dickey et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0035055 A1 2/2008 Dip et al.
2008/0035306 A1 2/2008 White et al.
2008/0035607 A1 2/2008 O'Hara et al.
2008/0036354 A1 2/2008 Letz et al.
2008/0038485 A1 2/2008 Fukazawa et al.
2008/0038934 A1 2/2008 Vrtis et al.
2008/0042165 A1 2/2008 Sugizaki
2008/0042192 A1 2/2008 Park et al.
2008/0043803 A1 2/2008 Bandoh
2008/0044938 A1 2/2008 England et al.
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0063798 A1 3/2008 Kher et al.
2008/0066778 A1 3/2008 Matsushita et al.
2008/0067146 A1 3/2008 Onishi et al.
2008/0069955 A1 3/2008 Hong et al.
2008/0072821 A1 3/2008 Dalton et al.
2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.
2008/0102630 A1 5/2008 Saito
2008/0105276 A1 5/2008 Yeh et al.
2008/0113094 A1 5/2008 Casper
2008/0113096 A1 5/2008 Mahajani
2008/0113097 A1 5/2008 Mahajani et al.
2008/0118334 A1 5/2008 Bonora
2008/0121177 A1 5/2008 Bang et al.
2008/0121626 A1 5/2008 Thomas et al.

(56) References Cited

U.S. PATENT DOCUMENTS

2008/0121962 A1 5/2008 Forbes et al.
2008/0124197 A1 5/2008 van der Meulen et al.
2008/0124908 A1 5/2008 Forbes et al.
2008/0124945 A1 5/2008 Miya et al.
2008/0124946 A1 5/2008 Xiao et al.
2008/0128726 A1 6/2008 Sakata et al.
2008/0129209 A1 6/2008 Deakins et al.
2008/0132046 A1 6/2008 Walther
2008/0133154 A1 6/2008 Krauss et al.
2008/0134887 A1 6/2008 Sherer
2008/0142483 A1 6/2008 Hua
2008/0146033 A1 6/2008 Park
2008/0149031 A1 6/2008 Chu et al.
2008/0149593 A1 6/2008 Bai et al.
2008/0152463 A1 6/2008 Chidambaram et al.
2008/0153308 A1 6/2008 Ogawa et al.
2008/0153311 A1 6/2008 Padhi et al.
2008/0156769 A1 7/2008 Weiner et al.
2008/0157157 A1 7/2008 Tonomura
2008/0157365 A1 7/2008 Ott et al.
2008/0173237 A1 7/2008 Collins
2008/0173238 A1 7/2008 Nakashima et al.
2008/0173240 A1 7/2008 Furukawahara
2008/0173326 A1 7/2008 Gu et al.
2008/0176335 A1 7/2008 Alberti et al.
2008/0176375 A1 7/2008 Erben et al.
2008/0176412 A1 7/2008 Komeda
2008/0178608 A1 7/2008 Tandou et al.
2008/0178805 A1 7/2008 Paterson et al.
2008/0179104 A1 7/2008 Zhang
2008/0179291 A1 7/2008 Collins et al.
2008/0179715 A1 7/2008 Coppa
2008/0182075 A1 7/2008 Chopra
2008/0182390 A1 7/2008 Lemmi et al.
2008/0182411 A1 7/2008 Elers
2008/0191193 A1 8/2008 Li et al.
2008/0193643 A1 8/2008 Dip
2008/0194105 A1 8/2008 Dominguez et al.
2008/0194169 A1 8/2008 Sterling et al.
2008/0199977 A1 8/2008 Weigel et al.
2008/0202416 A1 8/2008 Provencher
2008/0202689 A1 8/2008 Kim
2008/0203487 A1 8/2008 Hohage et al.
2008/0205483 A1 8/2008 Rempe et al.
2008/0210278 A1 9/2008 Orii et al.
2008/0211423 A1 9/2008 Shinmen et al.
2008/0211526 A1 9/2008 Shinma
2008/0213696 A1 9/2008 Meeus et al.
2008/0214003 A1 9/2008 Xia et al.
2008/0216077 A1 9/2008 Emani et al.
2008/0216742 A1 9/2008 Takebayashi
2008/0216958 A1 9/2008 Goto et al.
2008/0220619 A1 9/2008 Matsushita et al.
2008/0223130 A1 9/2008 Snell et al.
2008/0224240 A1 9/2008 Ahn et al.
2008/0228306 A1 9/2008 Yetter et al.
2008/0230371 A1 9/2008 McHugh
2008/0233288 A1 9/2008 Clark
2008/0237572 A1 10/2008 Chui et al.
2008/0241052 A1 10/2008 Hooper et al.
2008/0241384 A1 10/2008 Jeong
2008/0241387 A1 10/2008 Keto
2008/0242116 A1 10/2008 Clark
2008/0248310 A1 10/2008 Kim et al.
2008/0248597 A1 10/2008 Qin et al.
2008/0257102 A1 10/2008 Packer
2008/0257494 A1 10/2008 Hayashi et al.
2008/0260345 A1 10/2008 Mertesdorf et al.
2008/0260963 A1 10/2008 Yoon et al.
2008/0261405 A1 10/2008 Yang et al.
2008/0261413 A1 10/2008 Mahajani
2008/0264337 A1 10/2008 Sano et al.
2008/0264443 A1 10/2008 Shrinivasan et al.
2008/0267598 A1 10/2008 Nakamura
2008/0268171 A1 10/2008 Ma et al.
2008/0268635 A1 10/2008 Yu et al.
2008/0272424 A1 11/2008 Kim et al.
2008/0274369 A1 11/2008 Lee et al.
2008/0277647 A1 11/2008 Kouvetakis et al.
2008/0277656 A1 11/2008 Park et al.
2008/0277715 A1 11/2008 Ohmi et al.
2008/0282970 A1 11/2008 Heys et al.
2008/0283962 A1 11/2008 Dyer
2008/0286463 A1 11/2008 Tiner et al.
2008/0289574 A1 11/2008 Jacobs et al.
2008/0289650 A1 11/2008 Arena
2008/0289767 A1 11/2008 Tandou et al.
2008/0291964 A1 11/2008 Shrimpling
2008/0295872 A1 12/2008 Riker et al.
2008/0298945 A1 12/2008 Cox
2008/0299326 A1 12/2008 Fukazawa
2008/0299758 A1 12/2008 Harada et al.
2008/0302303 A1 12/2008 Choi et al.
2008/0303744 A1 12/2008 Hirayama et al.
2008/0305014 A1 12/2008 Honda
2008/0305246 A1 12/2008 Choi et al.
2008/0305443 A1 12/2008 Nakamura
2008/0314319 A1 12/2008 Hamano et al.
2008/0314892 A1 12/2008 Graham
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0000769 A1 1/2009 Lin et al.
2009/0004875 A1 1/2009 Shen et al.
2009/0011145 A1 1/2009 Yun
2009/0011150 A1 1/2009 Jeon et al.
2009/0011608 A1 1/2009 Nabatame
2009/0014879 A1 1/2009 Park et al.
2009/0017227 A1 1/2009 Fu et al.
2009/0017631 A1 1/2009 Bencher
2009/0017733 A1 1/2009 Takahashi et al.
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.
2009/0033907 A1 2/2009 Watson
2009/0035584 A1 2/2009 Tran et al.
2009/0035927 A1 2/2009 Olsen et al.
2009/0035947 A1 2/2009 Horii
2009/0036292 A1 2/2009 Sun et al.
2009/0039475 A1 2/2009 Shioya
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045749 A1 2/2009 Ganachev et al.
2009/0045829 A1 2/2009 Awazu
2009/0047426 A1 2/2009 Park et al.
2009/0047433 A1 2/2009 Kim et al.
2009/0047447 A1 2/2009 Sawin et al.
2009/0050621 A1 2/2009 Awazu
2009/0052498 A1 2/2009 Halpin et al.
2009/0053023 A1 2/2009 Wakabayashi
2009/0053900 A1 2/2009 Nozawa et al.
2009/0053906 A1 2/2009 Miya et al.
2009/0056112 A1 3/2009 Kobayashi
2009/0056629 A1 3/2009 Katz et al.
2009/0057269 A1 3/2009 Katz et al.
2009/0061083 A1 3/2009 Chiang et al.
2009/0061644 A1 3/2009 Chiang et al.
2009/0061647 A1 3/2009 Mallick et al.
2009/0075490 A1 3/2009 Dussarrat
2009/0075491 A1 3/2009 Liu et al.
2009/0081879 A1 3/2009 Sukekawa et al.
2009/0084317 A1 4/2009 Wu
2009/0085156 A1 4/2009 Dewey et al.
2009/0087585 A1 4/2009 Lee et al.
2009/0087964 A1 4/2009 Maeda et al.
2009/0087967 A1 4/2009 Todd
2009/0090382 A1 4/2009 Morisada
2009/0093080 A1 4/2009 Choi et al.
2009/0093094 A1 4/2009 Ye et al.

(56) References Cited

U.S. PATENT DOCUMENTS

2009/0093100 A1* 4/2009 Xia .................. H01L 21/76807 438/421
2009/0095221 A1 4/2009 Tam et al.
2009/0104351 A1 4/2009 Kakegawa
2009/0104594 A1 4/2009 Webb
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0116936 A1 5/2009 Marubayashi et al.
2009/0117717 A1 5/2009 Tomasini et al.
2009/0117746 A1 5/2009 Masuda
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136665 A1 5/2009 Choi et al.
2009/0136668 A1 5/2009 Gregg et al.
2009/0136683 A1 5/2009 Fukasawa et al.
2009/0137055 A1 5/2009 Bognar
2009/0139657 A1 6/2009 Lee et al.
2009/0142905 A1 6/2009 Yamazaki
2009/0142933 A1 6/2009 Yajima et al.
2009/0142935 A1 6/2009 Fukazawa et al.
2009/0146322 A1 6/2009 Weling et al.
2009/0147819 A1 6/2009 Goodman et al.
2009/0155488 A1 6/2009 Nakano et al.
2009/0156015 A1 6/2009 Park et al.
2009/0156017 A1 6/2009 Fukazawa et al.
2009/0159000 A1 6/2009 Aggarwal et al.
2009/0159002 A1 6/2009 Bera et al.
2009/0159424 A1 6/2009 Liu et al.
2009/0162647 A1 6/2009 Sun et al.
2009/0162996 A1 6/2009 Ramaswarmy et al.
2009/0163038 A1 6/2009 Miyoshi
2009/0165715 A1 7/2009 Oh
2009/0165721 A1 7/2009 Pitney et al.
2009/0165722 A1 7/2009 Ha
2009/0166616 A1 7/2009 Uchiyama
2009/0179365 A1 7/2009 Lerner et al.
2009/0183520 A1 7/2009 Yukimoto
2009/0186479 A1 7/2009 Okabe et al.
2009/0186571 A1 7/2009 Haro
2009/0194233 A1 8/2009 Tamura et al.
2009/0197015 A1 8/2009 Kudela et al.
2009/0197411 A1 8/2009 Dussarrat et al.
2009/0200494 A1 8/2009 Hatem
2009/0200547 A1 8/2009 Griffin et al.
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0214825 A1 8/2009 Sun et al.
2009/0217871 A1 9/2009 Kim et al.
2009/0221149 A1 9/2009 Hammond et al.
2009/0221151 A1 9/2009 Honda et al.
2009/0223441 A1 9/2009 Arena et al.
2009/0227094 A1 9/2009 Bateman
2009/0230211 A1 9/2009 Kobayashi et al.
2009/0232985 A1 9/2009 Dussarrat et al.
2009/0236014 A1 9/2009 Wilson
2009/0236276 A1 9/2009 Kurth et al.
2009/0239386 A1 9/2009 Suzaki et al.
2009/0242130 A1 10/2009 Tian et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250004 A1 10/2009 Yamada et al.
2009/0250955 A1 10/2009 Aoki
2009/0255901 A1 10/2009 Okita
2009/0256127 A1 10/2009 Feist et al.
2009/0261331 A1 10/2009 Yang et al.
2009/0266296 A1 10/2009 Tachibana et al.
2009/0267135 A1 10/2009 Tanaka et al.
2009/0267225 A1 10/2009 Eguchi
2009/0269506 A1 10/2009 Okura et al.
2009/0269507 A1 10/2009 Yu et al.
2009/0269941 A1 10/2009 Raisanen
2009/0275205 A1 11/2009 Kiehlbauch et al.
2009/0275210 A1 11/2009 Shanker et al.
2009/0277510 A1 11/2009 Shikata
2009/0277874 A1 11/2009 Rui et al.
2009/0280248 A1 11/2009 Goodman et al.
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0286405 A1 11/2009 Okesaku et al.
2009/0289300 A1 11/2009 Sasaki et al.
2009/0291208 A1 11/2009 Gordon et al.
2009/0297710 A1 12/2009 Lindfors
2009/0298257 A1 12/2009 Lee et al.
2009/0302002 A1 12/2009 Collins et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.
2009/0314208 A1 12/2009 Zhou et al.
2009/0315093 A1 12/2009 Li et al.
2009/0317214 A1 12/2009 Hsiao et al.
2009/0320754 A1 12/2009 Oya
2009/0320881 A1 12/2009 Aitchison
2009/0324971 A1 12/2009 De Vries et al.
2009/0324989 A1 12/2009 Witz et al.
2009/0325391 A1 12/2009 De Vusser et al.
2009/0325469 A1 12/2009 Koo et al.
2010/0000608 A1 1/2010 Goto et al.
2010/0001409 A1 1/2010 Humbert et al.
2010/0003406 A1 1/2010 Lam et al.
2010/0006031 A1 1/2010 Choi et al.
2010/0006923 A1 1/2010 Fujitsuka
2010/0012036 A1 1/2010 Silva et al.
2010/0014479 A1 1/2010 Kim
2010/0015813 A1 1/2010 McGinnis et al.
2010/0018460 A1 1/2010 Singh et al.
2010/0018913 A1 1/2010 Blum
2010/0022097 A1 1/2010 Yamoto et al.
2010/0024727 A1 2/2010 Kim et al.
2010/0024872 A1 2/2010 Kishimoto
2010/0025766 A1 2/2010 Nuttinck et al.
2010/0025796 A1 2/2010 Dabiran
2010/0032587 A1 2/2010 Hosch et al.
2010/0032842 A1 2/2010 Herdt et al.
2010/0034719 A1 2/2010 Dussarrat et al.
2010/0040441 A1 2/2010 Obikane
2010/0041179 A1 2/2010 Lee
2010/0041243 A1 2/2010 Cheng et al.
2010/0046321 A1 2/2010 McLaughlin et al.
2010/0050943 A1 3/2010 Kato et al.
2010/0051584 A1 3/2010 Okita et al.
2010/0051597 A1 3/2010 Morita et al.
2010/0055312 A1 3/2010 Kato et al.
2010/0055316 A1 3/2010 Honma
2010/0055318 A1 3/2010 Volf et al.
2010/0055442 A1 3/2010 Kellock
2010/0055898 A1 3/2010 Chang et al.
2010/0058984 A1 3/2010 Marubayashi
2010/0065758 A1 3/2010 Liu et al.
2010/0068009 A1 3/2010 Kimura
2010/0068383 A1 3/2010 Kato et al.
2010/0068414 A1 3/2010 Takahashi et al.
2010/0068891 A1 3/2010 Hatanaka et al.
2010/0075037 A1 3/2010 Marsh et al.
2010/0075507 A1 3/2010 Chang et al.
2010/0078601 A1 4/2010 Pallem et al.
2010/0078746 A1 4/2010 Jung
2010/0081094 A1 4/2010 Hasebe et al.

(56) References Cited

U.S. PATENT DOCUMENTS

2010/0081293 A1 4/2010 Mallick et al.
2010/0086703 A1 4/2010 Mangum et al.
2010/0087069 A1 4/2010 Miya et al.
2010/0089320 A1 4/2010 Kim
2010/0089870 A1 4/2010 Hiroshima et al.
2010/0090149 A1 4/2010 Thompson et al.
2010/0092679 A1 4/2010 Lee et al.
2010/0092696 A1 4/2010 Shinriki
2010/0093187 A1 4/2010 Lee et al.
2010/0094430 A1 4/2010 Krumdieck
2010/0098862 A1 4/2010 Xu et al.
2010/0101728 A1 4/2010 Iwasaki
2010/0102417 A1 4/2010 Ganguli et al.
2010/0105936 A1 4/2010 Tada et al.
2010/0111648 A1 5/2010 Tamura et al.
2010/0112496 A1 5/2010 Nakajima et al.
2010/0116207 A1 5/2010 Givens
2010/0116209 A1 5/2010 Kato
2010/0119439 A1 5/2010 Shindou
2010/0119727 A1 5/2010 Takagi
2010/0120261 A1 5/2010 Kim et al.
2010/0124610 A1 5/2010 Aikawa et al.
2010/0124618 A1 5/2010 Kobayashi et al.
2010/0124621 A1 5/2010 Kobayashi et al.
2010/0126415 A1 5/2010 Ishino et al.
2010/0126539 A1 5/2010 Lee et al.
2010/0126605 A1 5/2010 Stones
2010/0126666 A1 5/2010 Tandou et al.
2010/0129548 A1 5/2010 Sneh
2010/0129990 A1 5/2010 Nishizawa et al.
2010/0130015 A1 5/2010 Nakajima et al.
2010/0130017 A1 5/2010 Luo et al.
2010/0130105 A1 5/2010 Lee
2010/0134023 A1 6/2010 Mills
2010/0136216 A1 6/2010 Tsuei et al.
2010/0140221 A1 6/2010 Kikuchi et al.
2010/0140684 A1 6/2010 Ozawa
2010/0143609 A1 6/2010 Fukazawa et al.
2010/0144150 A1 6/2010 Sills et al.
2010/0144162 A1 6/2010 Lee et al.
2010/0144968 A1 6/2010 Lee et al.
2010/0145547 A1 6/2010 Darabnia et al.
2010/0151206 A1 6/2010 Wu et al.
2010/0159638 A1 6/2010 Jeong
2010/0159707 A1 6/2010 Huang et al.
2010/0162752 A1 7/2010 Tabata et al.
2010/0162956 A1 7/2010 Murakami et al.
2010/0163524 A1 7/2010 Arai
2010/0163937 A1 7/2010 Clendenning
2010/0166630 A1 7/2010 Gu et al.
2010/0168404 A1 7/2010 Girolami et al.
2010/0170441 A1 7/2010 Won et al.
2010/0170868 A1 7/2010 Lin et al.
2010/0173432 A1 7/2010 White et al.
2010/0178137 A1 7/2010 Chintalapati et al.
2010/0178423 A1 7/2010 Shimizu et al.
2010/0180819 A1 7/2010 Hatanaka et al.
2010/0183825 A1 7/2010 Becker et al.
2010/0184302 A1 7/2010 Lee et al.
2010/0186669 A1 7/2010 Shin et al.
2010/0189923 A1 7/2010 Goundar et al.
2010/0193501 A1 8/2010 Zucker et al.
2010/0193955 A1 8/2010 Milligan et al.
2010/0195392 A1 8/2010 Freeman
2010/0197107 A1 8/2010 Matsuzaki
2010/0202860 A1 8/2010 Reed
2010/0203242 A1 8/2010 Borden
2010/0206767 A1 8/2010 Odashima et al.
2010/0209598 A1 8/2010 Xu et al.
2010/0210108 A1 8/2010 Ishizaka et al.
2010/0219757 A1 9/2010 Benzerrouk et al.
2010/0221452 A1 9/2010 Kang
2010/0224130 A1 9/2010 Smith et al.
2010/0227458 A1 9/2010 Chung et al.
2010/0229795 A1 9/2010 Tanabe
2010/0229965 A1 9/2010 Kashima et al.
2010/0230051 A1 9/2010 Iizuka
2010/0230863 A1 9/2010 Moench et al.
2010/0233885 A1 9/2010 Kushibiki et al.
2010/0233886 A1 9/2010 Yang et al.
2010/0236691 A1 9/2010 Yamazaki
2010/0243166 A1 9/2010 Hayashi et al.
2010/0244688 A1 9/2010 Braun et al.
2010/0248465 A1 9/2010 Yi et al.
2010/0252434 A1 10/2010 Roy
2010/0255196 A1 10/2010 Geisler et al.
2010/0255198 A1 10/2010 Cleary et al.
2010/0255218 A1 10/2010 Oka et al.
2010/0255625 A1 10/2010 De Vries
2010/0255658 A1 10/2010 Aggarwal
2010/0259152 A1 10/2010 Yasuda et al.
2010/0266765 A1 10/2010 White et al.
2010/0267224 A1 10/2010 Choi et al.
2010/0267248 A1 10/2010 Ma
2010/0270675 A1 10/2010 Harada
2010/0246630 A1 11/2010 Kaszynski et al.
2010/0275846 A1 11/2010 Kitagawa
2010/0279008 A1 11/2010 Takagi
2010/0279512 A1 11/2010 Udea et al.
2010/0282163 A1 11/2010 Aggarwal et al.
2010/0282170 A1 11/2010 Nishizawa
2010/0282645 A1 11/2010 Wang
2010/0285237 A1 11/2010 Ditizio et al.
2010/0285319 A1 11/2010 Kwak et al.
2010/0294199 A1 11/2010 Tran et al.
2010/0297391 A1 11/2010 Kley
2010/0301752 A1 12/2010 Bakre et al.
2010/0304047 A1 12/2010 Yang et al.
2010/0307415 A1 12/2010 Shero et al.
2010/0317177 A1 12/2010 Huang et al.
2010/0317198 A1 12/2010 Antonelli
2010/0322604 A1 12/2010 Fondurulia et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 van Schravendijk
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089469 A1 4/2011 Merckling
2011/0092077 A1 4/2011 Xu et al.

(56) References Cited

U.S. PATENT DOCUMENTS

2011/0097901 A1 4/2011 Hanna et al.
2011/0098841 A1 4/2011 Tsuda
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0132542 A1 6/2011 Ilzuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171775 A1 7/2011 Yamamoto et al.
2011/0175011 A1 7/2011 Ehrne et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0192820 A1 8/2011 Yeom et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0217838 A1 9/2011 Hsieh et al.
2011/0220874 A1 9/2011 Hanrath
2011/0223334 A1 9/2011 Yudovsky et al.
2011/0226421 A1 9/2011 Hayashi
2011/0232678 A1 9/2011 Shih et al.
2011/0236201 A1 9/2011 Shende
2011/0236594 A1 9/2011 Haverkamp et al.
2011/0236600 A1 9/2011 Fox et al.
2011/0237040 A1 9/2011 Ng et al.
2011/0239936 A1 10/2011 Suzaki et al.
2011/0239940 A1 10/2011 Benvenuti et al.
2011/0244673 A1 10/2011 Cho et al.
2011/0253044 A1 10/2011 Tam et al.
2011/0254052 A1 10/2011 Kouvetakis
2011/0256675 A1 10/2011 Avouris
2011/0256724 A1 10/2011 Chandrasekharan et al.
2011/0256726 A1 10/2011 Lavoie et al.
2011/0256727 A1 10/2011 Beynet et al.
2011/0256734 A1 10/2011 Hausmann et al.
2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.
2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0291243 A1 12/2011 Seamons
2011/0294075 A1 12/2011 Chen et al.
2011/0294288 A1 12/2011 Lee et al.
2011/0298062 A1 12/2011 Ganguli et al.
2011/0300720 A1 12/2011 Fu
2011/0305102 A1 12/2011 Berger et al.
2011/0308453 A1 12/2011 Su et al.
2011/0308460 A1 12/2011 Hong et al.
2011/0312191 A1 12/2011 Ohkura et al.
2011/0318888 A1 12/2011 Komatsu et al.
2011/0318935 A1 12/2011 Oyabu et al.
2012/0001172 A1 1/2012 Shang et al.
2012/0003500 A1 1/2012 Yoshida et al.
2012/0003726 A1 1/2012 Jones et al.
2012/0003831 A1 1/2012 Kang et al.
2012/0006489 A1 1/2012 Okita
2012/0009802 A1 1/2012 Lavoie
2012/0012556 A1 1/2012 Matsumoto et al.
2012/0021252 A1 1/2012 Lee
2012/0024223 A1 2/2012 Torres et al.
2012/0024227 A1 2/2012 Takasuka et al.
2012/0024231 A1 2/2012 Horino
2012/0024478 A1 2/2012 Huang et al.
2012/0024479 A1 2/2012 Palagashvili et al.
2012/0028454 A1 2/2012 Swaminathan et al.
2012/0028469 A1 2/2012 Onizawa et al.
2012/0031333 A1 2/2012 Kurita et al.
2012/0031500 A1 2/2012 Hirose et al.
2012/0032311 A1 2/2012 Gates
2012/0033695 A1 2/2012 Hayashi et al.
2012/0034793 A1 2/2012 Narushima et al.
2012/0036732 A1 2/2012 Varadarajan
2012/0040097 A1 2/2012 Volf et al.
2012/0040528 A1 2/2012 Kim et al.
2012/0043556 A1 2/2012 Dube et al.
2012/0043617 A1 2/2012 Nakagawa et al.
2012/0046421 A1 2/2012 Darling et al.
2012/0052681 A1 3/2012 Marsh
2012/0058270 A1 3/2012 Winter et al.
2012/0058630 A1 3/2012 Quinn
2012/0064690 A1 3/2012 Hirota et al.
2012/0064726 A1 3/2012 Nozawa et al.
2012/0064764 A1 3/2012 Islam
2012/0068242 A1 3/2012 Shin et al.
2012/0070136 A1 3/2012 Koelmel et al.
2012/0070997 A1 3/2012 Larson
2012/0073400 A1 3/2012 Wang
2012/0074533 A1 3/2012 Aoyama
2012/0077349 A1 3/2012 Li et al.
2012/0080756 A1 4/2012 Suzuki
2012/0083134 A1 4/2012 Wu et al.
2012/0088031 A1 4/2012 Neel
2012/0090704 A1 4/2012 Laverdiere et al.
2012/0091522 A1 4/2012 Ozaki et al.
2012/0094468 A1 4/2012 Bhatia et al.
2012/0098107 A1 4/2012 Raisanen et al.
2012/0100464 A1 4/2012 Kageyama
2012/0103264 A1 5/2012 Choi et al.
2012/0103522 A1 5/2012 Hohenwarter
2012/0103939 A1 5/2012 Wu et al.
2012/0104514 A1 5/2012 Park et al.
2012/0107607 A1 5/2012 Takaki et al.
2012/0108039 A1 5/2012 Zajaji
2012/0108048 A1 5/2012 Lim et al.
2012/0114877 A1 5/2012 Lee
2012/0115250 A1 5/2012 Ariga et al.
2012/0115257 A1 5/2012 Matsuyam et al.
2012/0119337 A1 5/2012 Sasaki et al.
2012/0121823 A1 5/2012 Chhabra
2012/0122275 A1 5/2012 Koo et al.

(56) References Cited

U.S. PATENT DOCUMENTS

2012/0122302 A1 5/2012 Weisman et al.
2012/0122319 A1 5/2012 Shimizu
2012/0125258 A1 5/2012 Lee
2012/0126300 A1 5/2012 Park et al.
2012/0128897 A1 5/2012 Xiao et al.
2012/0135145 A1 5/2012 Je et al.
2012/0139009 A1 6/2012 Ning et al.
2012/0145078 A1 6/2012 Huang et al.
2012/0146113 A1 6/2012 Suzuki et al.
2012/0149207 A1 6/2012 Graff
2012/0149213 A1 6/2012 Nittala
2012/0156108 A1 6/2012 Fondurulia et al.
2012/0156890 A1 6/2012 Yim et al.
2012/0160172 A1 6/2012 Wamura et al.
2012/0160809 A1 6/2012 Ishibashi et al.
2012/0161126 A1 6/2012 Yamazaki
2012/0161405 A1 6/2012 Mohn
2012/0164327 A1 6/2012 Sato
2012/0164837 A1 6/2012 Tan et al.
2012/0164842 A1 6/2012 Watanabe
2012/0164846 A1 6/2012 Ha et al.
2012/0170170 A1 7/2012 Gros-Jean
2012/0171391 A1 7/2012 Won
2012/0171874 A1 7/2012 Thridandam et al.
2012/0175518 A1 7/2012 Godet et al.
2012/0175751 A1 7/2012 Gatineau et al.
2012/0180719 A1 7/2012 Inoue
2012/0180954 A1 7/2012 Yang et al.
2012/0183689 A1 7/2012 Suzuki et al.
2012/0186521 A1 7/2012 Iwasaki et al.
2012/0186573 A1 7/2012 Jdira et al.
2012/0187083 A1 7/2012 Hashizume
2012/0187305 A1 7/2012 Elam et al.
2012/0190178 A1 7/2012 Wang et al.
2012/0190185 A1 7/2012 Rogers
2012/0190208 A1 7/2012 Ozu et al.
2012/0196048 A1 8/2012 Ueda
2012/0196450 A1 8/2012 Balseanu et al.
2012/0202358 A1 8/2012 Gealy et al.
2012/0206033 A1 8/2012 Matsuyama
2012/0207456 A1 8/2012 Kim et al.
2012/0212121 A1 8/2012 Lin
2012/0213947 A1 8/2012 Lee
2012/0214318 A1 8/2012 Fukazawa et al.
2012/0216743 A1 8/2012 Itoh et al.
2012/0219824 A1 8/2012 Prolier
2012/0220139 A1 8/2012 Lee et al.
2012/0222815 A1 9/2012 Sabri et al.
2012/0225192 A1 9/2012 Yudovsky et al.
2012/0225561 A1 9/2012 Watanabe
2012/0231771 A1 9/2012 Marcus
2012/0232340 A1 9/2012 Levy et al.
2012/0238074 A1 9/2012 Santhanam et al.
2012/0240858 A1 9/2012 Taniyama et al.
2012/0241089 A1 9/2012 Dielmann et al.
2012/0241411 A1 9/2012 Darling et al.
2012/0244703 A1 9/2012 Nakayama et al.
2012/0247386 A1 10/2012 Sanchez et al.
2012/0252229 A1 10/2012 Timans et al.
2012/0258257 A1 10/2012 Nguyen et al.
2012/0263876 A1 10/2012 Haukka et al.
2012/0263887 A1 10/2012 Papasouliotis et al.
2012/0264051 A1 10/2012 Angelov et al.
2012/0264305 A1 10/2012 Nakano
2012/0267048 A1 10/2012 Moyama et al.
2012/0269967 A1 10/2012 Yudovsky et al.
2012/0270339 A1 10/2012 Xie et al.
2012/0270393 A1 10/2012 Pore et al.
2012/0273052 A1 11/2012 Ye et al.
2012/0273162 A1 11/2012 Mahadeswaraswamy
2012/0288625 A1 11/2012 Furuya et al.
2012/0289053 A1 11/2012 Holland et al.
2012/0289056 A1 11/2012 Bergman et al.
2012/0289057 A1 11/2012 DeDontney
2012/0295427 A1 11/2012 Bauer
2012/0295449 A1 11/2012 Fukazawa
2012/0302055 A1 11/2012 Pore
2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Harada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1* 12/2012 Isobayashi ........ H01L 23/53238 257/751
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011983 A1 1/2013 Tsai
2013/0011984 A1 1/2013 Wang et al.
2013/0012034 A1 1/2013 Ahn et al.
2013/0014697 A1 1/2013 Kanayama
2013/0014896 A1 1/2013 Shoji et al.
2013/0017503 A1 1/2013 de Ridder et al.
2013/0019944 A1 1/2013 Hekmatshoar-Tabari et al.
2013/0019945 A1 1/2013 Hekmatshoar-Tabari et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0061755 A1 3/2013 Frederick
2013/0062753 A1 3/2013 Nguyen et al.
2013/0064973 A1 3/2013 Chen et al.
2013/0065189 A1 3/2013 Yoshii et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0089667 A1 4/2013 Lai et al.
2013/0089716 A1 4/2013 Krishnamurthy et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.

(56) References Cited

U.S. PATENT DOCUMENTS

| | | | |
|---|---|---|---|
| 2013/0112251 | A1 | 5/2013 | Hang et al. |
| 2013/0113085 | A1 | 5/2013 | Michaelson et al. |
| 2013/0115383 | A1 | 5/2013 | Lu et al. |
| 2013/0115763 | A1 | 5/2013 | Takamure et al. |
| 2013/0115768 | A1 | 5/2013 | Pore et al. |
| 2013/0118405 | A1 | 5/2013 | Ho et al. |
| 2013/0118895 | A1 | 5/2013 | Roozeboom et al. |
| 2013/0119018 | A1 | 5/2013 | Kanarik et al. |
| 2013/0122712 | A1 | 5/2013 | Kim et al. |
| 2013/0122722 | A1 | 5/2013 | Cissell et al. |
| 2013/0126515 | A1 | 5/2013 | Shero et al. |
| 2013/0129577 | A1 | 5/2013 | Halpin et al. |
| 2013/0130490 | A1 | 5/2013 | Lee et al. |
| 2013/0134148 | A1 | 5/2013 | Tachikawa |
| 2013/0137279 | A1 | 5/2013 | Yamamoto et al. |
| 2013/0143401 | A1 | 6/2013 | Yu et al. |
| 2013/0143415 | A1 | 6/2013 | Yudovsky et al. |
| 2013/0145587 | A1 | 6/2013 | Adhiprakasha |
| 2013/0145984 | A1 | 6/2013 | Zhang et al. |
| 2013/0152933 | A1 | 6/2013 | Lischer et al. |
| 2013/0157409 | A1 | 6/2013 | Vaidya |
| 2013/0157521 | A1 | 6/2013 | Aldrich et al. |
| 2013/0160709 | A1 | 6/2013 | White et al. |
| 2013/0161629 | A1 | 6/2013 | Han et al. |
| 2013/0164458 | A1 | 6/2013 | Soininen et al. |
| 2013/0168353 | A1 | 7/2013 | Okita et al. |
| 2013/0168354 | A1 | 7/2013 | Kanarik |
| 2013/0171818 | A1 | 7/2013 | Kim et al. |
| 2013/0175596 | A1 | 7/2013 | Cheng et al. |
| 2013/0177706 | A1 | 7/2013 | Baluja et al. |
| 2013/0180448 | A1 | 7/2013 | Sakaue et al. |
| 2013/0183814 | A1 | 7/2013 | Huang et al. |
| 2013/0186340 | A1 | 7/2013 | Omori et al. |
| 2013/0189635 | A1 | 7/2013 | Lim et al. |
| 2013/0189854 | A1 | 7/2013 | Hausmann et al. |
| 2013/0196502 | A1 | 8/2013 | Haukka et al. |
| 2013/0196507 | A1 | 8/2013 | Ma et al. |
| 2013/0200518 | A1 | 8/2013 | Ahmed et al. |
| 2013/0202387 | A1 | 8/2013 | Hiroki |
| 2013/0203266 | A1 | 8/2013 | Hintze |
| 2013/0203267 | A1 | 8/2013 | Pomarede et al. |
| 2013/0209940 | A1 | 8/2013 | Sakamoto et al. |
| 2013/0210241 | A1 | 8/2013 | Lavoie et al. |
| 2013/0214232 | A1 | 8/2013 | Tendulkar et al. |
| 2013/0217239 | A1 | 8/2013 | Mallick et al. |
| 2013/0217240 | A1 | 8/2013 | Mallick et al. |
| 2013/0217241 | A1 | 8/2013 | Underwood et al. |
| 2013/0217243 | A1 | 8/2013 | Underwood et al. |
| 2013/0219853 | A1 | 8/2013 | Little et al. |
| 2013/0224964 | A1 | 8/2013 | Fukazawa |
| 2013/0228225 | A1 | 9/2013 | Leeser |
| 2013/0228902 | A1 | 9/2013 | Tomizawa et al. |
| 2013/0230814 | A1 | 9/2013 | Dunn et al. |
| 2013/0234203 | A1 | 9/2013 | Tsai et al. |
| 2013/0242287 | A1 | 9/2013 | Schlezinger |
| 2013/0256265 | A1 | 10/2013 | Darling et al. |
| 2013/0256838 | A1 | 10/2013 | Sanchez et al. |
| 2013/0256962 | A1 | 10/2013 | Ranish |
| 2013/0260371 | A1 | 10/2013 | Holt |
| 2013/0264659 | A1 | 10/2013 | Jung |
| 2013/0267045 | A1 | 10/2013 | Lee et al. |
| 2013/0269609 | A1 | 10/2013 | Leeser |
| 2013/0269612 | A1 | 10/2013 | Cheng et al. |
| 2013/0270676 | A1 | 10/2013 | Lindert et al. |
| 2013/0276978 | A1 | 10/2013 | Bluck et al. |
| 2013/0280891 | A1 | 10/2013 | Kim et al. |
| 2013/0285155 | A1 | 10/2013 | Glass |
| 2013/0287526 | A1 | 10/2013 | Bluck et al. |
| 2013/0288427 | A1 | 10/2013 | Hung et al. |
| 2013/0288471 | A1 | 10/2013 | Chi |
| 2013/0288480 | A1 | 10/2013 | Sanchez et al. |
| 2013/0288485 | A1 | 10/2013 | Liang et al. |
| 2013/0292047 | A1 | 11/2013 | Tian et al. |
| 2013/0292676 | A1 | 11/2013 | Milligan et al. |
| 2013/0292807 | A1 | 11/2013 | Raisanen et al. |
| 2013/0295779 | A1 | 11/2013 | Chandra et al. |
| 2013/0299944 | A1 | 11/2013 | Lai et al. |
| 2013/0302520 | A1 | 11/2013 | Wang et al. |
| 2013/0302999 | A1 | 11/2013 | Won et al. |
| 2013/0303803 | A1 | 11/2013 | Doerr et al. |
| 2013/0309876 | A1 | 11/2013 | Ogawa |
| 2013/0312663 | A1 | 11/2013 | Khosla et al. |
| 2013/0313656 | A1 | 11/2013 | Tong |
| 2013/0319290 | A1 | 12/2013 | Xiao et al. |
| 2013/0320429 | A1 | 12/2013 | Thomas |
| 2013/0323435 | A1 | 12/2013 | Xiao et al. |
| 2013/0323859 | A1 | 12/2013 | Chen et al. |
| 2013/0323935 | A1 | 12/2013 | Suzuki et al. |
| 2013/0330165 | A1 | 12/2013 | Wimplinger |
| 2013/0330911 | A1 | 12/2013 | Huang et al. |
| 2013/0330933 | A1 | 12/2013 | Fukazawa et al. |
| 2013/0333619 | A1 | 12/2013 | Omari |
| 2013/0337172 | A1 | 12/2013 | Lee |
| 2013/0337583 | A1 | 12/2013 | Kobayashi et al. |
| 2013/0337639 | A1 | 12/2013 | Ivanstov et al. |
| 2013/0337653 | A1 | 12/2013 | Kovalgin et al. |
| 2013/0340619 | A1 | 12/2013 | Tammera |
| 2013/0340678 | A1 | 12/2013 | Wamura et al. |
| 2013/0344248 | A1 | 12/2013 | Clark |
| 2014/0000843 | A1 | 1/2014 | Dunn et al. |
| 2014/0001520 | A1 | 1/2014 | Glass |
| 2014/0004274 | A1 | 1/2014 | Thompson |
| 2014/0007808 | A1 | 1/2014 | Okabe et al. |
| 2014/0014642 | A1 | 1/2014 | Elliot et al. |
| 2014/0014644 | A1 | 1/2014 | Akiba et al. |
| 2014/0015108 | A1 | 1/2014 | Kim et al. |
| 2014/0015186 | A1 | 1/2014 | Wessel et al. |
| 2014/0017408 | A1 | 1/2014 | Gandikota et al. |
| 2014/0017414 | A1 | 1/2014 | Fukazawa et al. |
| 2014/0017908 | A1 | 1/2014 | Beynet et al. |
| 2014/0020619 | A1 | 1/2014 | Vincent et al. |
| 2014/0020764 | A1 | 1/2014 | Woelk et al. |
| 2014/0020839 | A1 | 1/2014 | Kenney et al. |
| 2014/0023794 | A1 | 1/2014 | Mahajani et al. |
| 2014/0027884 | A1 | 1/2014 | Tang et al. |
| 2014/0030447 | A1 | 1/2014 | Lee |
| 2014/0033978 | A1 | 2/2014 | Adachi et al. |
| 2014/0034240 | A1 | 2/2014 | Kim et al. |
| 2014/0034632 | A1 | 2/2014 | Pan et al. |
| 2014/0036274 | A1 | 2/2014 | Marquardt et al. |
| 2014/0045324 | A1 | 2/2014 | Brabant et al. |
| 2014/0045342 | A1 | 2/2014 | Mallick et al. |
| 2014/0047705 | A1 | 2/2014 | Singh |
| 2014/0048765 | A1 | 2/2014 | Ma et al. |
| 2014/0053866 | A1 | 2/2014 | Baluja et al. |
| 2014/0056679 | A1 | 2/2014 | Yamabe et al. |
| 2014/0056770 | A1 | 2/2014 | Bedard et al. |
| 2014/0057454 | A1 | 2/2014 | Subramonium |
| 2014/0058179 | A1 | 2/2014 | Stevens et al. |
| 2014/0060147 | A1 | 3/2014 | Sarin et al. |
| 2014/0060572 | A1 | 3/2014 | Yasumuro et al. |
| 2014/0061770 | A1 | 3/2014 | Lee |
| 2014/0062304 | A1 | 3/2014 | Nakano et al. |
| 2014/0065841 | A1 | 3/2014 | Matero |
| 2014/0067110 | A1 | 3/2014 | Lawson et al. |
| 2014/0072710 | A1 | 3/2014 | Valle |
| 2014/0072726 | A1 | 3/2014 | Kim |
| 2014/0072925 | A1 | 3/2014 | Kaneko |
| 2014/0073082 | A1 | 3/2014 | Song |
| 2014/0073143 | A1 | 3/2014 | Alokozai et al. |
| 2014/0076861 | A1 | 3/2014 | Cornelius et al. |
| 2014/0077240 | A1 | 3/2014 | Roucka et al. |
| 2014/0084341 | A1 | 3/2014 | Weeks |
| 2014/0087490 | A1 | 3/2014 | Kahlon |
| 2014/0087544 | A1 | 3/2014 | Tolle |
| 2014/0087564 | A1 | 3/2014 | Shimizu et al. |
| 2014/0094027 | A1 | 4/2014 | Azumo et al. |
| 2014/0096716 | A1 | 4/2014 | Chung et al. |
| 2014/0097468 | A1 | 4/2014 | Okita |
| 2014/0099794 | A1 | 4/2014 | Ingle et al. |
| 2014/0099798 | A1 | 4/2014 | Tsuji |
| 2014/0103145 | A1 | 4/2014 | White et al. |
| 2014/0106574 | A1 | 4/2014 | Kang et al. |
| 2014/0110798 | A1 | 4/2014 | Cai |

(56) References Cited

U.S. PATENT DOCUMENTS

2014/0113457 A1 4/2014 Sims
2014/0116335 A1 5/2014 Tsuji et al.
2014/0117380 A1 5/2014 Loboda et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127907 A1 5/2014 Yang
2014/0130687 A1 5/2014 Shibusawa et al.
2014/0138779 A1 5/2014 Xie et al.
2014/0141165 A1 5/2014 Sato et al.
2014/0141625 A1 5/2014 Fukazawa et al.
2014/0141674 A1 5/2014 Galbreath et al.
2014/0144375 A1 5/2014 Kim et al.
2014/0144500 A1 5/2014 Cao et al.
2014/0145332 A1 5/2014 Ryan et al.
2014/0147587 A1 5/2014 Endo et al.
2014/0148924 A1 5/2014 Brak et al.
2014/0158786 A1 6/2014 Santo
2014/0159170 A1 6/2014 Raisanen et al.
2014/0162401 A1 6/2014 Kawano et al.
2014/0167187 A1 6/2014 Kuo et al.
2014/0170335 A1 6/2014 Shao et al.
2014/0174354 A1 6/2014 Arai
2014/0174357 A1 6/2014 Kim et al.
2014/0174927 A1 6/2014 Bashir et al.
2014/0175054 A1 6/2014 Carlson et al.
2014/0179091 A1 6/2014 Clark
2014/0182053 A1 7/2014 Huang
2014/0182689 A1 7/2014 Shareef et al.
2014/0187045 A1 7/2014 Hua et al.
2014/0191389 A1 7/2014 Lee et al.
2014/0193983 A1 7/2014 Lavoie
2014/0202382 A1 7/2014 Kim et al.
2014/0202386 A1 7/2014 Taga
2014/0202388 A1 7/2014 Um et al.
2014/0209976 A1 7/2014 Yang et al.
2014/0213061 A1 7/2014 Huang et al.
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.
2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0339981 A1 11/2014 Komatsu et al.
2014/0346142 A1 11/2014 Chapuis et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024609 A1 1/2015 Milligan et al.
2015/0030766 A1 1/2015 Lind et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa
2015/0064923 A1 3/2015 Matsumoto et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.
2015/0087139 A1 3/2015 O'Neill et al.
2015/0087154 A1 3/2015 Guha et al.
2015/0091057 A1 4/2015 Xie et al.
2015/0091134 A1 4/2015 Amaratunga et al.
2015/0094470 A1 4/2015 Sanchez et al.
2015/0096973 A1 4/2015 Dunn et al.
2015/0099065 A1 4/2015 Canizares et al.
2015/0099072 A1 4/2015 Takamure et al.
2015/0099123 A1 4/2015 Barbee et al.
2015/0099342 A1 4/2015 Tsai
2015/0099374 A1 4/2015 Kakimoto et al.
2015/0099375 A1 4/2015 Haripin et al.
2015/0102466 A1 4/2015 Colinge
2015/0104574 A1 4/2015 Lee et al.
2015/0110147 A1 4/2015 Mizuno
2015/0111374 A1 4/2015 Bao
2015/0111395 A1 4/2015 Hashimoto et al.
2015/0114295 A1 4/2015 Kim et al.
2015/0118009 A1 4/2015 Hsieh et al.
2015/0118846 A1 4/2015 Isii
2015/0118863 A1 4/2015 Rathod et al.
2015/0122180 A1 5/2015 Chang et al.
2015/0125628 A1 5/2015 Kim et al.
2015/0132212 A1 5/2015 Winkler et al.
2015/0140210 A1 5/2015 Jung et al.
2015/0144060 A1 5/2015 Park
2015/0147482 A1 5/2015 Kang et al.

(56) References Cited

U.S. PATENT DOCUMENTS

2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155177 A1 6/2015 Zhang et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Bank et al.
2015/0167165 A1 6/2015 Lindfors
2015/0167705 A1 6/2015 Lee et al.
2015/0170914 A1 6/2015 Haukka et al.
2015/0170945 A1 6/2015 Segawa et al.
2015/0170947 A1 6/2015 Bluck
2015/0170954 A1 6/2015 Agarwal
2015/0170975 A1 6/2015 Blatchford et al.
2015/0171177 A1 6/2015 Cheng et al.
2015/0174768 A1 6/2015 Rodnick
2015/0175467 A1 6/2015 Denifl et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins
2015/0267301 A1 9/2015 Hill et al.
2015/0270140 A1 9/2015 Gupta et al.
2015/0270146 A1 9/2015 Yoshihara et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0307982 A1 10/2015 Firouzdor et al.
2015/0308586 A1 10/2015 Shugrue et al.
2015/0311151 A1* 10/2015 Chi .................... H01L 21/7682
257/773
2015/0303056 A1 11/2015 Varadarajan et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005839 A1 1/2016 Yieh et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0087028 A1 3/2016 Hirota et al.
2016/0097123 A1 4/2016 Shugrue et al.
2016/0099150 A1 4/2016 Tsai
2016/0099166 A1 4/2016 Yudovsky

(56) References Cited

U.S. PATENT DOCUMENTS

2016/0099250 A1 4/2016 Rabkin et al.
2016/0102214 A1 4/2016 Dietz et al.
2016/0111272 A1 4/2016 Girard
2016/0111438 A1 4/2016 Tsutsumi et al.
2016/0115590 A1 4/2016 Haukka et al.
2016/0118224 A1 4/2016 Kohno et al.
2016/0133307 A1 5/2016 Lee et al.
2016/0133628 A1 5/2016 Xie
2016/0141172 A1 5/2016 Kang
2016/0145738 A1 5/2016 Liu et al.
2016/0148800 A1 5/2016 Henri et al.
2016/0148801 A1 5/2016 Yabe et al.
2016/0148806 A1 5/2016 Henri et al.
2016/0148811 A1 5/2016 Nakatani et al.
2016/0148821 A1 5/2016 Singh
2016/0153088 A1 6/2016 Tsuji et al.
2016/0155629 A1 6/2016 Hawryluk et al.
2016/0163556 A1 6/2016 Briggs et al.
2016/0163558 A1 6/2016 Hudson et al.
2016/0163561 A1 6/2016 Hudson et al.
2016/0163711 A1 6/2016 Arndt et al.
2016/0163972 A1 6/2016 Swaminathan et al.
2016/0168699 A1 6/2016 Fukazawa et al.
2016/0172189 A1 6/2016 Tapily
2016/0172296 A1 6/2016 Lim et al.
2016/0175805 A1 6/2016 Catchpole et al.
2016/0177448 A1 6/2016 Ikeda
2016/0181117 A1 6/2016 Arghavani et al.
2016/0181128 A1 6/2016 Mori
2016/0181368 A1 6/2016 Weeks
2016/0190137 A1 6/2016 Tsai et al.
2016/0195331 A1 7/2016 Hyon et al.
2016/0196969 A1 7/2016 Beny et al.
2016/0196970 A1 7/2016 Takamure et al.
2016/0203995 A1 7/2016 Kanarik et al.
2016/0211135 A1 7/2016 Noda et al.
2016/0211147 A1 7/2016 Fukazawa
2016/0217857 A1 7/2016 Paudel
2016/0218028 A1 7/2016 Schaller et al.
2016/0222504 A1 8/2016 Haukka et al.
2016/0222509 A1 8/2016 Honma
2016/0222516 A1 8/2016 Ikeda
2016/0225607 A1 8/2016 Yamamoto et al.
2016/0225632 A1 8/2016 Shaikh et al.
2016/0245704 A1 8/2016 Osaka et al.
2016/0256187 A1 9/2016 Shelton et al.
2016/0268102 A1 9/2016 White
2016/0268107 A1 9/2016 White
2016/0273101 A1 9/2016 Komori et al.
2016/0273106 A1 9/2016 Kanjolia et al.
2016/0276148 A1 9/2016 Qian et al.
2016/0276212 A1 9/2016 Horikoshi
2016/0281223 A1 9/2016 Sowa et al.
2016/0281230 A1 9/2016 Varadarajan et al.
2016/0284517 A1 9/2016 Saido
2016/0284542 A1 9/2016 Noda et al.
2016/0289828 A1 10/2016 Shero et al.
2016/0293398 A1 10/2016 Danek et al.
2016/0305015 A1 10/2016 Nakamura et al.
2016/0307739 A1 10/2016 Lee et al.
2016/0307766 A1 10/2016 Jongbloed et al.
2016/0312360 A1 10/2016 Rasheed et al.
2016/0314962 A1 10/2016 Higashino et al.
2016/0314964 A1 10/2016 Tang et al.
2016/0314967 A1 10/2016 Tolle
2016/0315168 A1 10/2016 Dussarrat et al.
2016/0334709 A1 11/2016 Huli et al.
2016/0336178 A1 11/2016 Swaminathan et al.
2016/0336392 A1 11/2016 Tominaga et al.
2016/0345384 A1 11/2016 Zhang et al.
2016/0351413 A1 12/2016 Schmidt et al.
2016/0351747 A1 12/2016 Forrest et al.
2016/0358772 A1 12/2016 Xie
2016/0362783 A1 12/2016 Tolle et al.
2016/0362813 A1 12/2016 Bao et al.
2016/0365280 A1 12/2016 Brink et al.
2016/0365414 A1 12/2016 Peng et al.
2016/0372321 A1 12/2016 Krishnan et al.
2016/0372365 A1 12/2016 Tang et al.
2016/0372744 A1 12/2016 Essaki et al.
2016/0376700 A1 12/2016 Haukka
2016/0376704 A1 12/2016 Raisanen
2016/0379826 A9 12/2016 Arghavani et al.
2016/0379851 A1 12/2016 Swaminathan et al.
2016/0381732 A1 12/2016 Moench et al.
2017/0009347 A1 1/2017 Jang et al.
2017/0009367 A1 1/2017 Harris et al.
2017/0011889 A1 1/2017 Winkler et al.
2017/0011926 A1 1/2017 Harada et al.
2017/0011950 A1 1/2017 Schmotzer
2017/0018477 A1 1/2017 Kato
2017/0018570 A1 1/2017 Lue et al.
2017/0025280 A1 1/2017 Milligan
2017/0025291 A1 1/2017 Lin
2017/0029945 A1 2/2017 Kamakura
2017/0032942 A1 2/2017 Walfried
2017/0032943 A1 2/2017 Spaulding et al.
2017/0032992 A1 2/2017 Hoechbauer
2017/0033004 A1 2/2017 Siew et al.
2017/0037513 A1 2/2017 Haukka
2017/0040164 A1 2/2017 Wang et al.
2017/0040206 A1 2/2017 Schmotzer et al.
2017/0044664 A1 2/2017 Dussarrat et al.
2017/0044665 A1 2/2017 Shon et al.
2017/0044666 A1 2/2017 Jang et al.
2017/0047446 A1 2/2017 Margetis et al.
2017/0051402 A1 2/2017 Mori
2017/0051405 A1 2/2017 Fukazawa et al.
2017/0051406 A1 2/2017 Mori et al.
2017/0051408 A1 2/2017 Kosuke et al.
2017/0053811 A1 2/2017 Fung et al.
2017/0058402 A1 3/2017 Wenxu et al.
2017/0062204 A1 3/2017 Suzuki et al.
2017/0062209 A1 3/2017 Shiba
2017/0062210 A1 3/2017 Visser et al.
2017/0062218 A1 3/2017 Duan et al.
2017/0062224 A1 3/2017 Fu et al.
2017/0062258 A1 3/2017 Bluck
2017/0069725 A1 3/2017 Bhimarasetti et al.
2017/0091320 A1 3/2017 Psota et al.
2017/0092469 A1 3/2017 Kurita et al.
2017/0092531 A1 3/2017 Coomer
2017/0092535 A1 3/2017 Kimihiko et al.
2017/0092847 A1 3/2017 Kim et al.
2017/0100742 A1 4/2017 Pore et al.
2017/0103907 A1 4/2017 Chu et al.
2017/0104061 A1 4/2017 Peng et al.
2017/0107621 A1 4/2017 Suemori
2017/0110313 A1 4/2017 Tang et al.
2017/0110601 A1 4/2017 Blomberg et al.
2017/0114460 A1 4/2017 Kim et al.
2017/0114464 A1 4/2017 Iriuda et al.
2017/0114465 A1 4/2017 Kalutarage et al.
2017/0117141 A1 4/2017 Zhu et al.
2017/0117202 A1 4/2017 Tang et al.
2017/0117203 A1 4/2017 Tang et al.
2017/0117222 A1 4/2017 Kim et al.
2017/0121845 A1 5/2017 Grutzmacher et al.
2017/0130332 A1 5/2017 Stumpf
2017/0136578 A1 5/2017 Yoshimura
2017/0140925 A1 5/2017 Suzuki et al.
2017/0145564 A1 5/2017 Bertuch et al.
2017/0146909 A1 5/2017 Smith et al.
2017/0148918 A1 5/2017 Ye et al.
2017/0152968 A1 6/2017 Raj et al.
2017/0154757 A1 6/2017 Winkler et al.
2017/0154770 A1 6/2017 Margetis et al.
2017/0154895 A1 6/2017 Huo
2017/0159177 A1 6/2017 Monsma et al.
2017/0165624 A1 6/2017 Ravoin et al.
2017/0170033 A1 6/2017 Okabe et al.
2017/0173696 A1 6/2017 Sheinman
2017/0175290 A1 6/2017 Chen et al.
2017/0178899 A1 6/2017 Kabansky et al.

(56) References Cited

U.S. PATENT DOCUMENTS

2017/0179036 A1 6/2017 Chen et al.
2017/0186621 A1 6/2017 Zaitsu
2017/0186754 A1 6/2017 Blomberg et al.
2017/0191159 A1 7/2017 Polyak et al.
2017/0191164 A1 7/2017 Alokozai et al.
2017/0191861 A1 7/2017 Rondano et al.
2017/0196562 A1 7/2017 Shelton
2017/0200622 A1 7/2017 Shiokawa et al.
2017/0204516 A1 7/2017 Nguyen et al.
2017/0216762 A1 8/2017 Shugrue et al.
2017/0226636 A1 8/2017 Xiao
2017/0232457 A1 8/2017 Toshiki et al.
2017/0233868 A1 8/2017 Donoso et al.
2017/0243734 A1 8/2017 Ishikawa
2017/0250068 A1 8/2017 Ishikawa
2017/0250075 A1 8/2017 Caymax et al.
2017/0256417 A1 9/2017 Chou
2017/0256429 A1 9/2017 Lawson et al.
2017/0260649 A1 9/2017 Coomer
2017/0263437 A1 9/2017 Li et al.
2017/0267527 A1 9/2017 Kim et al.
2017/0267531 A1 9/2017 Huakka
2017/0271191 A1 9/2017 Yoo et al.
2017/0271256 A1 9/2017 Inatsuka
2017/0271501 A1 9/2017 Avci et al.
2017/0278705 A1 9/2017 Murakami et al.
2017/0278707 A1 9/2017 Margetis et al.
2017/0287681 A1 10/2017 Nitadori et al.
2017/0287744 A1 10/2017 Kobayashi et al.
2017/0294318 A1 10/2017 Yoshida et al.
2017/0294339 A1 10/2017 Tapily
2017/0294499 A1 10/2017 Lu et al.
2017/0301519 A1 10/2017 Naim et al.
2017/0301542 A1 10/2017 Maes et al.
2017/0303382 A1 10/2017 Smith et al.
2017/0306478 A1 10/2017 Raisanen et al.
2017/0306479 A1 10/2017 Raisanen et al.
2017/0306480 A1 10/2017 Zhu et al.
2017/0309490 A1 10/2017 Ogawa
2017/0309528 A1 10/2017 Bansal et al.
2017/0316933 A1 11/2017 Xie et al.
2017/0316940 A1 11/2017 Ishikawa et al.
2017/0317194 A1 11/2017 Tang et al.
2017/0323783 A1 11/2017 Sanchez et al.
2017/0323784 A1 11/2017 Faguet et al.
2017/0338111 A1 11/2017 Takamure et al.
2017/0338133 A1 11/2017 Tan et al.
2017/0338134 A1 11/2017 Tan et al.
2017/0338192 A1 11/2017 Lee et al.
2017/0342559 A1 11/2017 Fukazawa et al.
2017/0343896 A1 11/2017 Darling et al.
2017/0345674 A1 11/2017 Ranjan et al.
2017/0350688 A1 12/2017 Boyd et al.
2017/0358445 A1 12/2017 O'Shaughnessy et al.
2017/0358482 A1 12/2017 Chen et al.
2017/0358670 A1 12/2017 Kub et al.
2017/0362710 A1 12/2017 Ge et al.
2017/0365467 A1 12/2017 Shimamoto et al.
2017/0372884 A1 12/2017 Margetis et al.
2017/0372919 A1 12/2017 Manna et al.
2017/0373188 A1 12/2017 Mochizuki et al.
2018/0005814 A1 1/2018 Kumar et al.
2018/0010243 A1 1/2018 Lee et al.
2018/0010247 A1 1/2018 Niskanen
2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.
2018/0061851 A1 3/2018 Ootsuka
2018/0068844 A1 3/2018 Chen et al.
2018/0068862 A1 3/2018 Terakura et al.
2018/0068950 A1 3/2018 Bruley et al.
2018/0069019 A1 3/2018 Kim et al.
2018/0076021 A1 3/2018 Fukushima et al.
2018/0083435 A1 3/2018 Redler
2018/0087152 A1 3/2018 Yoshida
2018/0087154 A1 3/2018 Pore
2018/0087156 A1 3/2018 Kohei et al.
2018/0090583 A1 3/2018 Choi et al.
2018/0094351 A1 4/2018 Verghese et al.
2018/0097076 A1 4/2018 Cheng et al.
2018/0102276 A1 4/2018 Zhu et al.
2018/0105930 A1 4/2018 Kang et al.
2018/0108587 A1 4/2018 Jiang
2018/0114680 A1 4/2018 Kim et al.
2018/0119283 A1 5/2018 Fukazawa
2018/0122642 A1 5/2018 Raisanen
2018/0122709 A1 5/2018 Xie
2018/0122959 A1 5/2018 Calka et al.
2018/0126379 A1 5/2018 Ramsey et al.
2018/0127876 A1 5/2018 Tolle et al.
2018/0130652 A1 5/2018 Pettinger et al.
2018/0130701 A1 5/2018 Chun
2018/0135172 A1 5/2018 Nogami et al.
2018/0135173 A1 5/2018 Kim et al.
2018/0135179 A1 5/2018 Toshiyuki et al.
2018/0138036 A1 5/2018 Baldesseroni et al.
2018/0142353 A1 5/2018 Tetsuya et al.
2018/0142357 A1 5/2018 Yoshikazu
2018/0148832 A1 5/2018 Chatterjee et al.
2018/0151346 A1 5/2018 Blanquart
2018/0151358 A1 5/2018 Margetis et al.
2018/0151588 A1 5/2018 Tsutsumi et al.
2018/0155832 A1 6/2018 Hamalainen et al.
2018/0155836 A1 6/2018 Arai et al.
2018/0158688 A1 6/2018 Chen
2018/0158716 A1 6/2018 Konkola et al.
2018/0163305 A1 6/2018 Batzer et al.
2018/0166258 A1 6/2018 Kim et al.
2018/0166315 A1 6/2018 Coomer
2018/0171475 A1 6/2018 Maes et al.
2018/0171477 A1 6/2018 Kim et al.
2018/0172172 A1 6/2018 Oehler et al.
2018/0173109 A1 6/2018 Gronheid et al.
2018/0174801 A1 6/2018 Chen et al.
2018/0174826 A1 6/2018 Raaijmakers et al.
2018/0179625 A1 6/2018 Takagi et al.
2018/0180509 A1 6/2018 Sawachi et al.
2018/0182613 A1 6/2018 Blanquart et al.
2018/0182618 A1 6/2018 Blanquart et al.
2018/0187303 A1 7/2018 Gatineau et al.
2018/0189923 A1 7/2018 Zhong et al.
2018/0190496 A1 7/2018 Ashihara et al.
2018/0195174 A1 7/2018 Kim et al.
2018/0204733 A1 7/2018 Sherpa et al.
2018/0211834 A1 7/2018 Takamure et al.
2018/0223047 A1 8/2018 Xiao et al.
2018/0223429 A1 8/2018 Fukazawa et al.
2018/0230595 A1 8/2018 Suda et al.
2018/0233372 A1 8/2018 Vayrynen et al.
2018/0245215 A1 8/2018 Lei et al.
2018/0246101 A1 8/2018 Sasisekharan et al.
2018/0254211 A1 9/2018 Kosakai et al.
2018/0258532 A1 9/2018 Kato et al.
2018/0269057 A1 9/2018 Lei et al.
2018/0277338 A1 9/2018 Fukacla et al.

(56) References Cited

U.S. PATENT DOCUMENTS

2018/0277423 A1 9/2018 Lottes
2018/0286638 A1 10/2018 Susa
2018/0286663 A1 10/2018 Kobayashi et al.
2018/0286668 A1 10/2018 Baum et al.
2018/0286672 A1 10/2018 Van Aerde et al.
2018/0286675 A1 10/2018 Blomberg et al.
2018/0286711 A1 10/2018 Oosterlaken et al.
2018/0294187 A1 10/2018 Thombare et al.
2018/0305247 A1 10/2018 Feng et al.
2018/0308686 A1 10/2018 Xie et al.
2018/0308701 A1 10/2018 Na et al.
2018/0312966 A1 11/2018 Chan et al.
2018/0315838 A1 11/2018 Morrow et al.
2018/0323055 A1 11/2018 Woodruff et al.
2018/0323056 A1 11/2018 Woodruff et al.
2018/0323059 A1 11/2018 Bhargava et al.
2018/0325414 A1 11/2018 Marashdeh et al.
2018/0331117 A1 11/2018 Titus et al.
2018/0337087 A1 11/2018 Sandhu et al.
2018/0350587 A1 12/2018 Jia et al.
2018/0350588 A1 12/2018 Raisanen et al.
2018/0350620 A1 12/2018 Zaitsu et al.
2018/0350653 A1 12/2018 Jeong et al.
2018/0355480 A1 12/2018 Kondo
2018/0355484 A1 12/2018 Lansalot-Matras et al.
2018/0358222 A1 12/2018 Venkatasubramanian et al.
2018/0363131 A1 12/2018 Lee et al.
2018/0363139 A1 12/2018 Rajavelu et al.
2018/0366314 A1 12/2018 Niskanen et al.
2018/0371610 A1 12/2018 Banerjee et al.
2019/0003050 A1 1/2019 Dezelah et al.
2019/0003052 A1 1/2019 Shero et al.
2019/0006797 A1 1/2019 Paynter et al.
2019/0013199 A1 1/2019 Bhargava et al.
2019/0019670 A1 1/2019 Lin et al.
2019/0027573 A1 1/2019 Zhu et al.
2019/0027583 A1 1/2019 Margetis et al.
2019/0027584 A1 1/2019 Margetis et al.
2019/0027605 A1 1/2019 Tolle et al.
2019/0032209 A1 1/2019 Huggare
2019/0032998 A1 1/2019 Jdira et al.
2019/0035605 A1 1/2019 Suzuki
2019/0035647 A1 1/2019 Lee et al.
2019/0035810 A1 1/2019 Chun et al.
2019/0040529 A1 2/2019 Verbaas et al.
2019/0046947 A1 2/2019 Strohm et al.
2019/0051544 A1 2/2019 Verbaas
2019/0051548 A1 2/2019 den Hartog Besselink et al.
2019/0051555 A1 2/2019 Hill et al.
2019/0057857 A1 2/2019 Ishikawa
2019/0057858 A1 2/2019 Hausmann et al.
2019/0058043 A1 2/2019 Dewey et al.
2019/0062907 A1 2/2019 Kim et al.
2019/0062917 A1 2/2019 Sung et al.
2019/0066978 A1 2/2019 Um et al.
2019/0066997 A1 2/2019 Klaver et al.
2019/0067003 A1 2/2019 Zope et al.
2019/0067004 A1 2/2019 Kohen et al.
2019/0067014 A1 2/2019 Shrestha et al.
2019/0067016 A1 2/2019 Zhu et al.
2019/0067085 A1 2/2019 Kweskin
2019/0067094 A1 2/2019 Zope et al.
2019/0067095 A1 2/2019 Zhu et al.
2019/0080903 A1 3/2019 Abel et al.
2019/0081072 A1 3/2019 Chun et al.
2019/0085451 A1 3/2019 Lei et al.
2019/0086807 A1 3/2019 Kachel et al.
2019/0088555 A1 3/2019 Xie et al.
2019/0089143 A1 3/2019 Malone et al.
2019/0093221 A1 3/2019 Jdira et al.
2019/0096708 A1 3/2019 Sharma
2019/0106788 A1 4/2019 Hawkins et al.
2019/0109002 A1 4/2019 Mattinen et al.
2019/0109009 A1 4/2019 Longrie et al.
2019/0112711 A1 4/2019 Lyons et al.
2019/0115206 A1 4/2019 Kim et al.
2019/0115237 A1 4/2019 den Hartog Besselink et al.
2019/0131124 A1 5/2019 Kohen et al.
2019/0140067 A1 5/2019 Zhu et al.
2019/0148224 A1 5/2019 Kuroda et al.
2019/0148398 A1 5/2019 Kim
2019/0153593 A1 5/2019 Zhu et al.
2019/0157054 A1 5/2019 White et al.
2019/0157067 A1 5/2019 Bhuyan et al.
2019/0163056 A1 5/2019 Maes et al.
2019/0164763 A1 5/2019 Raisanen et al.
2019/0181002 A1 6/2019 Iijima et al.
2019/0185999 A1 6/2019 Shanbhag et al.
2019/0189447 A1 6/2019 Kamp et al.
2019/0198359 A1 6/2019 Kamimura et al.
2019/0198571 A1 6/2019 Xu et al.
2019/0204029 A1 7/2019 Tanabe
2019/0217277 A1 7/2019 Jeon et al.
2019/0221433 A1 7/2019 Raisanen et al.
2019/0229008 A1 7/2019 Rokkam et al.
2019/0233940 A1 8/2019 Guo et al.
2019/0237325 A1 8/2019 Wang et al.
2019/0237327 A1 8/2019 Kohen et al.
2019/0244803 A1 8/2019 Suzuki
2019/0249300 A1 8/2019 Hatanpaa et al.
2019/0249303 A1 8/2019 Kuroda et al.
2019/0252195 A1 8/2019 Haukka
2019/0252196 A1 8/2019 Vayrynen et al.
2019/0259611 A1 8/2019 Nakano et al.
2019/0259612 A1 8/2019 Nozawa et al.
2019/0264324 A1 8/2019 Shugrue et al.
2019/0271078 A1 9/2019 Raisanen et al.
2019/0272981 A1 9/2019 Xu et al.
2019/0272993 A1 9/2019 Mattinen et al.
2019/0273133 A1 9/2019 Agrawal et al.
2019/0276934 A1 9/2019 Verghese et al.
2019/0287769 A1 9/2019 Blomberg et al.
2019/0295837 A1 9/2019 Pore et al.
2019/0301014 A1 10/2019 Pierreux et al.
2019/0304776 A1 10/2019 Choi
2019/0304780 A1 10/2019 Kohen et al.
2019/0304790 A1 10/2019 Mousa et al.
2019/0304821 A1 10/2019 Pierreux et al.
2019/0311894 A1 10/2019 Girard et al.
2019/0311897 A1 10/2019 Kang et al.
2019/0311940 A1 10/2019 Choi et al.
2019/0318923 A1 10/2019 Blanquart et al.
2019/0322812 A1 10/2019 Wojtecki et al.
2019/0330740 A1 10/2019 Klaver
2019/0333753 A1 10/2019 Ueda et al.
2019/0333761 A1 10/2019 Tois et al.
2019/0338418 A1 11/2019 Goradia et al.
2019/0346300 A1 11/2019 Kim et al.
2019/0348261 A1 11/2019 Lin et al.
2019/0348273 A1 11/2019 Tang et al.
2019/0348515 A1 11/2019 Li et al.
2019/0363006 A1 11/2019 Min
2019/0368040 A1 12/2019 Kachel et al.
2019/0368041 A1 12/2019 Sreeram et al.
2019/0371594 A1 12/2019 Niskanen et al.
2019/0371640 A1 12/2019 Raisanen et al.
2019/0375638 A1 12/2019 Haukka
2019/0376180 A1 12/2019 Niskanen
2019/0378916 A1 12/2019 Tang et al.
2019/0385907 A1 12/2019 Gottheim et al.
2019/0390338 A1 12/2019 Raisanen et al.
2019/0390343 A1 12/2019 Min et al.
2019/0393308 A1 12/2019 Lo et al.
2020/0002811 A1 1/2020 Sreeram et al.
2020/0002812 A1 1/2020 Lee et al.
2020/0013612 A1 1/2020 Blanquart et al.
2020/0013613 A1 1/2020 Blanquart
2020/0013626 A1 1/2020 Longrie et al.
2020/0013629 A1 1/2020 de Roest et al.
2020/0018421 A1 1/2020 Shugrue
2020/0040458 A1 2/2020 Ma et al.
2020/0048768 A1 2/2020 Wiegers et al.
2020/0052056 A1 2/2020 Park et al.
2020/0056282 A1 2/2020 Raisanen et al.

(56) References Cited

U.S. PATENT DOCUMENTS

2020/0056286 A1 2/2020 Shero et al.
2020/0063262 A1 2/2020 Katou et al.
2020/0064737 A1 2/2020 de Roest
2020/0066552 A1 2/2020 Susa
2020/0080200 A1 3/2020 Um et al.
2020/0083054 A1 3/2020 Väyrynen et al.
2020/0083375 A1 3/2020 Tolle et al.
2020/0083469 A1 3/2020 Lhullier
2020/0102649 A1 4/2020 Reed
2020/0102653 A1 4/2020 Muralidhar et al.
2020/0105579 A1 4/2020 Zhu
2020/0105594 A1 4/2020 Cheng et al.
2020/0109472 A1 4/2020 Um et al.
2020/0111669 A1 4/2020 Zaitsu et al.
2020/0111690 A1 4/2020 Oosterlaken
2020/0118811 A1 4/2020 Utsuno et al.
2020/0118815 A1 4/2020 Fukazawa et al.
2020/0118817 A1 4/2020 Blomberg et al.
2020/0126771 A1 4/2020 Roh et al.
2020/0126840 A1 4/2020 Roh et al.
2020/0131634 A1 4/2020 Gao et al.
2020/0135512 A1 4/2020 Oosterlaken et al.
2020/0140995 A1 5/2020 Blanquart et al.
2020/0141003 A1 5/2020 Lee et al.
2020/0144058 A1 5/2020 Kohen
2020/0152473 A1 5/2020 Tapily et al.
2020/0152750 A1 5/2020 Morrow et al.
2020/0161129 A1 5/2020 Mattinen et al.
2020/0161438 A1 5/2020 Tang et al.
2020/0168485 A1 5/2020 Fluit
2020/0279758 A1 5/2020 Sharma
2020/0173020 A1 6/2020 Huggare
2020/0176244 A1 6/2020 Lee et al.
2020/0176246 A1 6/2020 Huotari et al.
2020/0181770 A1 6/2020 Longrie et al.
2020/0194253 A1 6/2020 Banerjee et al.
2020/0194268 A1 6/2020 Sharma
2020/0224309 A1 7/2020 Sreeram et al.
2020/0224311 A1 7/2020 Niskanen et al.
2020/0227243 A1 7/2020 Kim et al.
2020/0227250 A1 7/2020 Pore et al.
2020/0227325 A1 7/2020 Xie et al.
2020/0232096 A1 7/2020 Hatanpääet al.
2020/0234989 A1 7/2020 Jeong
2020/0251328 A1 8/2020 Zaitsu et al.
2020/0258766 A1 8/2020 Garssen et al.
2020/0266057 A1 8/2020 Lee et al.
2020/0266097 A1 8/2020 Liu et al.
2020/0266098 A1 8/2020 Pore et al.
2020/0266208 A1 8/2020 Kim et al.
2020/0270749 A1 8/2020 Li et al.
2020/0270752 A1 8/2020 Pierreux et al.
2020/0273729 A1 8/2020 Verbaas et al.
2020/0279721 A1 9/2020 White et al.
2020/0283893 A1 9/2020 Byun et al.
2020/0284467 A1 9/2020 Lindeboom et al.
2020/0286725 A1 9/2020 Sharma et al.
2020/0286726 A1 9/2020 Shero et al.
2020/0294789 A1 9/2020 Woodruff et al.
2020/0303180 A1 9/2020 Kim et al.
2020/0303196 A1 9/2020 Chen et al.
2020/0309455 A1 10/2020 Fluit
2020/0312652 A1 10/2020 Kang et al.
2020/0318237 A1 10/2020 Fukazawa
2020/0321209 A1 10/2020 Ishikawa et al.
2020/0332416 A1 10/2020 Fluit
2020/0340113 A1 10/2020 Hatanpääet al.
2020/0340138 A1 10/2020 Tolle et al.
2020/0343134 A1 10/2020 Kovalgin et al.
2020/0343358 A1 10/2020 Zhu et al.
2020/0350193 A1 11/2020 Garssen
2020/0354836 A1 11/2020 Yednak et al.
2020/0355296 A1 11/2020 Shugrue et al.
2020/0357631 A1 11/2020 Ueda
2020/0365391 A1 11/2020 Blanquart et al.
2020/0365433 A1 11/2020 de Ridder et al.
2020/0365434 A1 11/2020 de Ridder
2020/0365444 A1 11/2020 Hill et al.
2020/0373152 A1 11/2020 Blanquart
2020/0385861 A1 12/2020 Deye et al.
2020/0385867 A1 12/2020 Kim et al.
2020/0385868 A1 12/2020 Kim et al.
2020/0395209 A1 12/2020 Yoshimoto et al.
2020/0395444 A1 12/2020 Lo et al.
2021/0002762 A1 1/2021 Jun et al.
2021/0005449 A1 1/2021 Blanquart et al.
2021/0005450 A1 1/2021 Mattinen et al.
2021/0005723 A1 1/2021 Tang et al.
2021/0013010 A1 1/2021 Yoshikawa et al.
2021/0013037 A1 1/2021 Sun et al.
2021/0013042 A1 1/2021 Väyrynen et al.
2021/0013085 A1 1/2021 Roh et al.
2021/0020429 A1 1/2021 Khazaka et al.
2021/0020431 A1 1/2021 Blanquart et al.
2021/0020432 A1 1/2021 Blanquart
2021/0020467 A1 1/2021 Sekiguchi
2021/0020470 A1 1/2021 Lee
2021/0028021 A1 1/2021 Mousa et al.
2021/0017648 A1 2/2021 Kubota et al.
2021/0035785 A1 2/2021 Jeong et al.
2021/0035786 A1 2/2021 Jeong et al.
2021/0035802 A1 2/2021 Tolle et al.
2021/0035824 A1 2/2021 de Ridder
2021/0035839 A1 2/2021 de Ridder
2021/0035840 A1 2/2021 de Ridder et al.
2021/0035841 A1 2/2021 Fluit
2021/0035842 A1 2/2021 de Ridder
2021/0035854 A1 2/2021 Yoo et al.
2021/0040613 A1 2/2021 White et al.
2021/0040615 A1 2/2021 White et al.
2021/0041284 A1 2/2021 Yednak
2021/0043444 A1 2/2021 Blanquart
2021/0050231 A1 2/2021 Oosterlaken

FOREIGN PATENT DOCUMENTS

CN 2588350 11/2003
CN 1563483 1/2005
CN 1655362 8/2005
CN 1664987 9/2005
CN 1825535 8/2006
CN 101142012 3/2008
CN 101609858 12/2009
CN 101681873 3/2010
CN 102383106 3/2012
CN 103014846 4/2013
CN 103515222 1/2014
CN 102373440 7/2014
CN 104244620 12/2014
CN 105253917 1/2016
CN 104201108 11/2017
CN 108389798 8/2018
DE 8902307 8/1989
DE 3836696 12/1989
DE 3626724 6/1994
DE 10133013 1/2003
DE 102008052750 6/2009
EP 0058571 8/1982
EP 0499004 8/1992
EP 0550058 11/1998
EP 0887632 12/1998
EP 678909 7/1999
EP 1061567 12/2000
EP 1889817 2/2008
EP 2036600 3/2009
EP 2426233 7/2012
FR 686869 7/1930
FR 1408266 8/1965
FR 2233614 1/1975
FR 2517790 6/1983
FR 2610007 8/1990
GB 752-277 7/1956
GB 1186889 6/1966
GB 1514921 6/1978

(56) References Cited

FOREIGN PATENT DOCUMENTS

| | | |
|---|---|---|
| JP | 58-19462 | 4/1983 |
| JP | 59-211779 | 11/1984 |
| JP | 61038863 | 2/1986 |
| JP | S62237236 | 10/1987 |
| JP | S63136532 | 6/1988 |
| JP | H01-296613 | 11/1989 |
| JP | H01-307229 | 12/1989 |
| JP | H02-93071 | 4/1990 |
| JP | H02-185038 | 7/1990 |
| JP | H02-217469 | 8/1990 |
| JP | H03-044472 | 2/1991 |
| JP | H03-155625 | 7/1991 |
| JP | H03-248427 | 11/1991 |
| JP | H04-29313 | 1/1992 |
| JP | H04-115531 | 4/1992 |
| JP | H05-6880 | 1/1993 |
| JP | H05-23079 | 3/1993 |
| JP | 405118928 | 5/1993 |
| JP | H05-118928 | 5/1993 |
| JP | H05-171446 | 7/1993 |
| JP | H05-291142 | 11/1993 |
| JP | H06-053210 | 2/1994 |
| JP | H06-84888 | 3/1994 |
| JP | H06-140399 | 5/1994 |
| JP | H0616433 | 6/1994 |
| JP | 6204231 | 7/1994 |
| JP | H06-319177 | 11/1994 |
| JP | H06-338497 | 12/1994 |
| JP | H07-297271 | 1/1995 |
| JP | H0729836 | 1/1995 |
| JP | 07066267 | 3/1995 |
| JP | H07-74162 | 3/1995 |
| JP | H07-109576 | 4/1995 |
| JP | 07034936 | 8/1995 |
| JP | H07-034936 | 8/1995 |
| JP | H07-225214 | 8/1995 |
| JP | 7-272694 | 10/1995 |
| JP | H07-283149 | 10/1995 |
| JP | H07-209093 | 11/1995 |
| JP | H08-181135 | 7/1996 |
| JP | H08-335558 | 12/1996 |
| JP | H09-064149 | 3/1997 |
| JP | 9-89676 | 4/1997 |
| JP | H09-148322 | 6/1997 |
| JP | H10-41096 | 2/1998 |
| JP | H10-50635 | 2/1998 |
| JP | H10-50800 | 2/1998 |
| JP | H10-064696 | 3/1998 |
| JP | H10-153494 | 6/1998 |
| JP | H10-227703 | 8/1998 |
| JP | H10-0261620 | 9/1998 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004091848 | 3/2004 |
| JP | 2004113270 | 4/2004 |
| JP | 2004128019 | 4/2004 |
| JP | 2004134553 | 4/2004 |
| JP | 2004163293 | 6/2004 |
| JP | 2004244661 | 9/2004 |
| JP | 2004294638 | 10/2004 |
| JP | 3589954 | 11/2004 |
| JP | 2004310019 | 11/2004 |
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 6519897 | 5/2019 |
| KR | 1998-0026850 | 7/1998 |
| KR | 10-0253664 | 4/2000 |
| KR | 10-2000-0031098 | 6/2000 |
| KR | 10-2000-0045257 | 7/2000 |
| KR | 100273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |

(56) References Cited

FOREIGN PATENT DOCUMENTS

| | | |
|---|---|---|
| KR | 10-0547248 | 1/2006 |
| KR | 10-0593960 | 6/2006 |
| KR | 10-2006-0129566 | 12/2006 |
| KR | 10-0688484 | 2/2007 |
| KR | 10-2007-0079797 | 8/2007 |
| KR | 10-2007-0084683 | 8/2007 |
| KR | 20080058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-1347962 | 1/2014 |
| KR | 101491726 | 2/2015 |
| KR | 10-1535573 | 7/2015 |
| KR | 10-2019-0032077 | 3/2019 |
| NL | 8600255 | 9/1987 |
| NL | 8701549 | 2/1989 |
| SU | 494614 | 2/1976 |
| SU | 1408319 | 7/1988 |
| SU | 1786406 | 1/1993 |
| TW | 538327 | 6/2003 |
| TW | 540093 | 7/2003 |
| TW | M292692 | 6/2006 |
| TW | 200731357 | 8/2007 |
| TW | 200903625 | 1/2009 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | 1514509 | 12/2015 |
| TW | 201613231 | 4/2016 |
| TW | M553518 | 12/2017 |
| TW | d196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |
| WO | 2006054854 | 5/2006 |
| WO | 2006056091 | 6/2006 |
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |
| WO | 2007024720 | 3/2007 |
| WO | 2007027165 | 3/2007 |
| WO | 2007076195 | 7/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2014107290 | 7/2014 |
| WO | 2015026230 | 2/2015 |
| WO | 2015107009 | 7/2015 |
| WO | 2015112728 | 7/2015 |
| WO | 2018109553 | 6/2016 |
| WO | 2018109554 | 6/2016 |
| WO | 2017108713 | 6/2017 |
| WO | 2017108714 | 6/2017 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2019030565 | 2/2019 |
| WO | 2019103610 | 5/2019 |
| WO | 2019103613 | 5/2019 |
| WO | 2019142055 | 7/2019 |
| WO | 2019152055 | 8/2019 |
| WO | 2019158960 | 8/2019 |
| WO | 2019217749 | 11/2019 |
| WO | 2019229537 | 12/2019 |
| WO | 2020002995 | 1/2020 |
| WO | 2020003000 | 1/2020 |

OTHER PUBLICATIONS

CNIPA; Office Action dated Mar. 26, 2020 in Application No. 201610131743.1.

CNIPA; Office Action dated May 18, 2020 in Application No. 201610982040.X.

CNIPA; Office Action dated May 29, 2020 in Application No. 201710131319.1.

CNIPA; Office Action dated Jun. 1, 2020 in Application No. 201710173292.2.

CNIPA; Notice of Allowance dated May 14, 2020 in Application No. 201930615780.4.

CNIPA; Notice of Allowance dated Apr. 27, 2020 in Application No. 201930660355.7.

CNIPA; Notice of Allowance dated Jun. 2, 2020 in Application No. 202030048819.1.

CNIPA; Notice of Allowance dated May 15, 2020 in Application No. 202030048854.3.

(56) References Cited

OTHER PUBLICATIONS

CNIPA; Notice of Allowance dated May 15, 2020 in Application No. 202030053560.X.
CNIPA; Notice of Allowance dated May 20, 2020 in Application No. 202030053634.X.
KIPO; Notice of Allowance dated Apr. 23, 2020 in Application No. 10-2013-0050740.
KIPO; Office Action dated Jun. 19, 2020 in Application No. 10-2013-0098575.
KIPO; Notice of Allowance dated May 14, 2020 in Application No. 10-2013-0102026.
KIPO; Office Action dated May 21, 2020 in Application No. 10-2014-0086902.
KIPO; Office Action dated May 21, 2020 in Application No. 10-2014-0091092.
KIPO; Offie Action dated Apr. 22, 2020 in Application No. 10-2020-0009462.
TIPO; Notice of Allowance dated May 4, 2020 in Application No. 105101536.
TIPO; Office Action dated Apr. 14, 2020 in Application No. 105129977.
TIPO; Office Action dated Mar. 17, 2020 in Application No. 105130130.
TIPO; Office Action dated Feb. 21, 2020 in Application No. 108120947.
USPTO; Advisory Action dated Apr. 24, 2020 in U.S. Appl. No. 14/219,839.
USPTO; Advisory Action dated Apr. 24, 2020 in U.S. Appl. No. 14/219,879.
USPTO; Non-Final Office Action dated Apr. 28, 2020 in U.S. Appl. No. 14/444,744.
USPTO; Final Office Action dated May 15, 2020 in U.S. Appl. No. 14/457,058.
USPTO; Advisory Action dated Jun. 22, 2020 in U.S. Appl. No. 14/829,565.
USPTO; Final Office Action dated Jun. 1, 2020 in U.S. Appl. No. 15/135,258.
USPTO; Non-Final Office Action dated Apr. 16, 2020 in U.S. Appl. No. 15/286,503.
USPTO; Final Office Action dated May 13, 2020 in U.S. Appl. No. 15/377,439.
USPTO; Non-Final Office Action dated May 27, 2020 in U.S. Appl. No. 15/402,993.
USPTO; Final Office Action dated Apr. 17, 2020 in U.S. Appl. No. 15/491,726.
USPTO; Final Office Action dated Jun. 16, 2020 in U.S. Appl. No. 15/636,307.
USPTO; Notice of Allowance dated May 20, 2020 in U.S. Appl. No. 15/672,096.
USPTO; Final Office Action dated May 27, 2020 in U.S. Appl. No. 15/690,017.
USPTO; Advisory Action dated Jun. 19, 2020 in U.S. Appl. No. 15/691,241.
USPTO; Advisory Action dated May 26, 2020 in U.S. Appl. No. 15/798,201.
USPTO; Advisory Action dated May 19, 2020 in U.S. Appl. No. 15/802,154.
USPTO; Non-Final Office Action dated Apr. 24, 2020 in U.S. Appl. No. 15/815,483.
USPTO; Final Office Action dated Jun. 11, 2020 in U.S. Appl. No. 15/861,418.
USPTO; Advisory Action dated Jun. 5, 2020 in U.S. Appl. No. 15/890,037.
USPTO; Final Office Action dated Jun. 15, 2020 in U.S. Appl. No. 15/896,986.
USPTO; Non-Final Office Action dated May 1, 2020 in U.S. Appl. No. 15/917,224.
USPTO; Advisory Action dated May 15, 2020 in U.S. Appl. No. 15/923,834.
USPTO; Non-Final Office Action dated May 1, 2020 in U.S. Appl. No. 15/925,532.
USPTO; Advisory Action dated Apr. 23, 2020 in U.S. Appl. No. 15/940,759.
USPTO; Final Office Action dated Apr. 30, 2020 in U.S. Appl. No. 15/962,980.
USPTO; Non-Final Office Action dated May 15, 2020 in U.S. Appl. No. 15/974,988.
USPTO; Non-Final Office Action dated Jun. 12, 2020 in U.S. Appl. No. 15/985,539.
USPTO; Non-Final Office Action dated Feb. 20, 2020 in U.S. Appl. No. 15/996,286.
USPTO; Non-Final Office Action dated Jun. 5, 2020 in U.S. Appl. No. 16/000,125.
USPTO; Non-Final Office Action dated Apr. 22, 2020 in U.S. Appl. No. 16/000,156.
USPTO; Non-Final Office Action dated May 7, 2020 in U.S. Appl. No. 16/004,041.
USPTO; Notice of Allowance dated Jun. 24, 2020 in U.S. Appl. No. 16/014,981.
USPTO; Notice of Allowance dated May 26, 2020 in U.S. Appl. No. 16/036,692.
USPTO; Non-Final Office Action dated Apr. 30, 2020 in U.S. Appl. No. 16/055,532.
USPTO; Non-Final Office Action dated May 27, 2020 in U.S. Appl. No. 16/100,012.
USPTO; Final Office Action dated Jun. 23, 2020 in U.S. Appl. No. 16/105,745.
USPTO; Final Office Action dated Apr. 21, 2020 in U.S. Appl. No. 16/105,761.
USPTO; Final Office Action dated Jun. 26, 2020 in U.S. Appl. No. 16/105,802.
USPTO; Non-Final Office Action dated Jun. 22, 2020 in U.S. Appl. No. 16/128,282.
USPTO; Non-Final Office Action dated Apr. 21, 2020 in U.S. Appl. No. 16/130,798.
USPTO; Final Office Action dated Jun. 5, 2020 in U.S. Appl. No. 16/132,142.
USPTO; Advisory Action dated Jun. 9, 2020 in U.S. Appl. No. 16/158,077.
USPTO; Notice of Allowance dated Jun. 19, 2020 in U.S. Appl. No. 16/161,744.
USPTO; Non-Final Office Action dated May 29, 2020 in U.S. Appl. No. 16/205,899.
USPTO; Final Office Action dated Jun. 19, 2020 in U.S. Appl. No. 16/219,555.
USPTO; Final Office Action dated Jun. 15, 2020 in U.S. Appl. No. 16/242,829.
USPTO; Notice of Allowance dated May 29, 2020 in U.S. Appl. No. 16/245,006.
USPTO; Non-Final Office Action dated Apr. 24, 2020 in U.S. Appl. No. 16/251,534.
USPTO; Non-Final Office Action dated May 27, 2020 in U.S. Appl. No. 16/252,567.
USPTO; Non-Final Office Action dated Apr. 16, 2020 in U.S. Appl. No. 16/255,639.
USPTO; Non-Final Office Action dated Jun. 30, 2020 in U.S. Appl. No. 16/258,187.
USPTO; Notice of Allowance dated May 21, 2020 in U.S. Appl. No. 16/280,964.
USPTO; Notice of Allowance dated Apr. 16, 2020 in U.S. Appl. No. 16/427,288.
USPTO; Non-Final Office Action dated Apr. 16, 2020 in U.S. Appl. No. 16/454,063.
USPTO; Notice of Allowance dated Apr. 17, 2020 in U.S. Appl. No. 16/455,406.
USPTO; Non-Final Office Action dated Jun. 11, 2020 in U.S. Appl. No. 16/598,768.
USPTO; Notice of Allowance dated Apr. 21, 2020 in U.S. Appl. No. 16/674,894.
USPTO; Non-Final Office Action dated Apr. 13, 2020 in U.S. Appl. No. 16/833,279.

(56) References Cited

OTHER PUBLICATIONS

USPTO; Notice of Allowance dated Jun. 10, 2020 in U.S. Appl. No. 29/615,000.
USPTO; Non-Final Office Action dated Apr. 24, 2020 in U.S. Appl. No. 29/726,623.
WIPO; International Search Report and Written Opinion dated Apr. 29, 2019 in Application No. PCT/NL2018/050791.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Fallica et al., "Dynamic Absorption Coefficients of Chemically Amplified Resists and Nonchemically Amplified Resists at Extreme Ultraviolet", J. Micro/Nanolith. MEMS MOEMS 15(3), pp. 033506-1-033506-7 (2016).
Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Kliem et al. "Silyl Group Migrations Between Oxygen and Nitrogen in Aminosiloxanes"; Organosilicon Chemistry VI: from Molecules to Materials; pp. 216-221 (2005).
Lewis et al. "Hawley's Condensed Chemical Dictionary" 12th Edition; excerpt pp. 1027-1038 (2005).
Roddy, "Transport Reactions and Vaporization Studies of Some Vanadium Halides", Iowa State university of Science and Technology dissertation, 207 pages (1962).
Spear et al., "Chemical Transport Reactions in the Vanadium-Silicon-Oxygen System and the Ternary Phase Diagram", Journal of the Less-Common Metals, 14, pp. 69-75 (1968).
Su et al. "A Polymer Precursor Route to Metal Borides", Chem. Mater., 5, pp. 1659-1668 (1993).
TIPO; Notice of Allowance dated Jun. 12, 2014 in Application No. 98117513.
TIPO; Notice of Allowance dated Jan. 28, 2015 in Application No. 99114329.
TIPO; Notice of Allowance dated Apr. 28, 2015 in Application No. 99114330.
TIPO; Notice of Allowance dated Oct. 16, 2015 in Application No. 99114331.
TIPO; Notice of Allowance dated Oct. 2, 2015 in Application No. 100130472.
TIPO; Notice of Allowance dated Oct. 19, 2016 in Application No. 101124745.
TIPO; Notice of Allowance dated Jul. 18, 2017 in Application No. 102127065.
TIPO; Notice of Allowance dated Jan. 26, 2017 in Application No. 102131839.
TIPO; Notice of Allowance dated Oct. 20, 2017 in Application No. 103105251.
TIPO; Notice of Allowance dated Jan. 22, 2018 in Application No. 103117477.
TIPO; Notice of Allowance dated Mar. 13, 2018 in Application No. 103117478.
TIPO; Notice of Allowance dated Dec. 11, 2017 in Application No. 103127734.
TIPO; Notice of Allowance dated Jan. 30, 2019 in Application No. 103132230.
TIPO; Notice of Allowance dated Apr. 19, 2018 in Application No. 103134537.
TIPO; Notice of Allowance dated Oct. 17, 2017 in Application No. 103136251.
TIPO; Notice of Allowance dated Jun. 13, 2018 in Application No. 103138510.
TIPO; Notice of Allowance dated Sep. 27, 2019 in Application No. 104105533.
TIPO; Notice of Allowance dated May 9, 2019 in Application No. 104107876.
TIPO; Notice of Allowance dated May 8, 2019 in Application No. 104110326.
TIPO; Notice of Allowance dated Sep. 18, 2018 in Application No. 104111910.
TIPO; Notice of Allowance dated Jun. 19, 2019 in Application No. 104124377.
TIPO; Notice of Allowance dated Nov. 27, 2019 in Application No. 104141679.
TIPO; Notice of Allowance dated May 7, 2019 in Application No. 105104453.
TIPO; Notice of Allowance dated May 7, 2019 in Application No. 105114105.
CNIPA; Office Action dated Oct. 16, 2020 in Application No. 201610131743.1.
CNIPA; Office Action dated Jun. 16, 2020 in Application No. 201610897958.4.
CNIPA; Office Action dated Jul. 3, 2020 in Application No. 201610898822.5.
CNIPA; Notice of Allowance dated Oct. 9, 2020 in Application No. 201610898822.5.
CNIPA; Notice of Allowance dated Nov. 4, 2020 in Application No. 201710173292.2.
CNIPA; Office Action dated Aug. 31, 2020 in Application No. 201780044761.9.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.
CNIPA; Notice of Allowance dated Aug. 7, 2020 in Application No. 202030053609.1.
EPO; Office Action dated Jul. 29, 2008 in Application No. 00902194.0.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
JPO; Office Action dated Jun. 1, 2020 in Application No. 2016-206625.
JPO; Office Action dated Aug. 28, 2020 in Application No. 2017-139817.
JPO; Notice of Allowance dated Jul. 1, 2020 in Application No. 2019-025168.
JPO; Office Action dated Aug. 24, 2020 in Application No. 2019-119908.

(56) References Cited

OTHER PUBLICATIONS

JPO; Office Action dated Jun. 29, 2020 in Application No. 2020-502653.
KIPO; Decision of Intellectual Property Trial and Appeal Board dated Jun. 23, 2020 in Application No. 10-2012-0076564.
KIPO; Notice of Allowance dated Sep. 25, 2020 in Application No. 10-2013-0049598.
KIPO; Notice of Allowance dated Aug. 13, 2020 in Application No. 10-2013-0098575.
KIPO; Notice of Allowance dated Oct. 27, 2020 in Application No. 10-2014-0011764.
KIPO; Office Action dated Jul. 21, 2020 in Application No. 10-2014-0011765.
KIPO; Notice of Allowance dated Sep. 8, 2020 in Application No. 10-2014-0021615.
KIPO; Office Action dated Oct. 26, 2020 in Application No. 10-2014-0027217.
KIPO; Notice of Allowance dated Oct. 12, 2020 in Application No. 10-2014-0027305.
KIPO; Office Action dated Jul. 9, 2020 in Application No. 10-2014-0060120.
KIPO; Office Action dated Aug. 18, 2020 in Application No. 10-2014-0071653.
KIPO; Notice of Allowance dated Oct. 19, 2020 in Application No. 10-2014-0086902.
KIPO; Notice of Allowance dated Sep. 27, 2020 in Application No. 10-2014-0091092.
KIPO; Office Action dated Oct. 5, 2020 in Application No. 10-2014-0103853.
KIPO; Office Action dated Oct. 7, 2020 in Application No. 10-2014-0128626.
KIPO; Office Action dated Jul. 21, 2020 in Application No. 10-2017-0087308.
KIPO; Notice of Allowance dated Oct. 26, 2020 in Application No. 10-2017-0087308.
KIPO; Office Action dated Jun. 30, 2020 in Application No. 10-2019-0044213.
KIPO; Notice of Allowance dated Oct. 28, 2020 in Application No. 10-2020-0009462.
KIPO; Notice of Allowance dated Jul. 20, 2020 in Application No. 10-2020-7000992.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 22, 2020 in Application No. 30-2019-0058076.
TIPO; Notice of Allowance dated Jul. 1, 2020 in Application No. 105101537.
TIPO; Notice of Allowance dated Sep. 4, 2020 in Application No. 105111990.
TIPO; Office Action dated Sep. 7, 2020 in Application No. 105122394.
TIPO; Notice of Allowance dated Aug. 31, 2020 in Application No. 105122586.
TIPO; Office Action dated Sep. 18, 2020 in Application No. 105129977.
TIPO; Notice of Allowance dated Sep. 25, 2020 in Application No. 105130130.
TIPO; Office Action Received Aug. 25, 2020 in Application No. 105131284.
TIPO; Office Action dated Aug. 25, 2020 in Application No. 105131896.
TIPO; Office Action dated Sep. 30, 2020 in Application No. 105142668.
TIPO; Office Action dated Aug. 11, 2020 in Application No. 106100823.
TIPO; Office Action dated Jun. 17, 2020 in Application No. 106108152.
TIPO; Office Action dated Oct. 7, 2020 in Application No. 106108522.
TIPO; Office Action dated Aug. 21, 2020 in Application No. 106111548.
TIPO; Office Action dated Oct. 8, 2020 in Application No. 106111693.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Oct. 8, 2020 in Application No. 106123203.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Sep. 25, 2020 in Application No. 108307759.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.
USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.

(56) References Cited

OTHER PUBLICATIONS

USPTO; Non-Final Office Action dated May 13, 2003 in U.S. Appl. No. 10/222,229.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Notice of Allowance dated Jul. 6, 2020 in U.S. Appl. No. 13/184,351.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Advisory Action dated Nov. 10, 2015 in U.S. Appl. No. 14/079,302.
USPTO; Notice of Allowance dated Sep. 3, 2020 in U.S. Appl. No. 14/444,744.
USPTO; Notice of Allowance dated Aug. 6, 2020 in U.S. Appl. No. 14/457,058.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Aug. 3, 2020 in U.S. Appl. No. 14/829,565.
USPTO; Notice of Allowance dated Aug. 18, 2020 in U.S. Appl. No. 15/135,258.
USPTO; Non-Final Office Action dated Oct. 6, 2020 in U.S. Appl. No. 15/262,990.
USPTO; Final Office Action dated Oct. 2, 2020 in U.S. Appl. No. 15/286,503.
USPTO; Non-Final Office Action dated Sep. 2, 2020 in U.S. Appl. No. 15/377,439.
USPTO; Non-Final Office Action dated Jul. 1, 2020 in U.S. Appl. No. 15/380,909.
USPTO; Final Office Action dated Jul. 23, 2020 in U.S. Appl. No. 15/380,921.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Sep. 30, 2020 in U.S. Appl. No. 15/491,726.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Sep. 3, 2020 in U.S. Appl. No. 15/636,307.
USPTO; Notice of Allowance dated Jul. 2, 2020 in U.S. Appl. No. 15/672,096.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Oct. 6, 2020 in U.S. Appl. No. 15/691,241.
USPTO; Final Office Action dated Sep. 24, 2020 in U.S. Appl. No. 15/726,959.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Notice of Allowance dated Sep. 30, 2020 in U.S. Appl. No. 15/815,483.
USPTO; Final Office Action dated Sep. 17, 2020 in U.S. Appl. No. 15/835,328.
USPTO; Final Office Action dated Aug. 6, 2020 in U.S. Appl. No. 15/835,352.
USPTO; Notice of Allowance dated Aug. 17, 2020 in U.S. Appl. No. 15/843,899.
USPTO; Notice of Allowance dated Jun. 30, 2020 in U.S. Appl. No. 15/860,564.
USPTO; Notice of Allowance dated Aug. 19, 2020 in U.S. Appl. No. 15/861,418.
USPTO; Non-Final Office Action dated Sep. 2, 2020 in U.S. Appl. No. 15/890,037.
USPTO; Notice of Allowance dated Aug. 26, 2020 in U.S. Appl. No. 15/896,986.
USPTO; Non-Final Office Action dated Sep. 9, 2020 in U.S. Appl. No. 15/909,705.
USPTO; Final Office Action dated Sep. 24, 2020 in U.S. Appl. No. 15/917,224.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.
USPTO; Final Office Action dated Oct. 15, 2020 in U.S. Appl. No. 15/925,532.
USPTO; Non-Final Office Action dated Oct. 6, 2020 in U.S. Appl. No. 15/940,729.
USPTO; Non-Final Office Action dated Aug. 3, 2020 in U.S. Appl. No. 15/940,759.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Non-Final Office Action dated Oct. 6, 2020 in U.S. Appl. No. 15/967,146.
USPTO; Final Office Action dated Sep. 3, 2020 in U.S. Appl. No. 15/974,948.
USPTO; Notice of Allowance dated Oct. 14, 2020 in U.S. Appl. No. 15/974,988.
USPTO; Final Office Action dated Nov. 25, 2020 in U.S. Appl. No. 15/985,539.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Final Office Action dated Sep. 14, 2020 in U.S. Appl. No. 16/000,109.
USPTO; Final Office Action dated Oct. 6, 2020 in U.S. Appl. No. 16/000,125.
USPTO; Final Office Action dated Oct. 22, 2020 in U.S. Appl. No. 16/000,156.
USPTO; Final Office Action dated Oct. 15, 2020 in U.S. Appl. No. 16/004,041.
USPTO; Non-Final Office Action dated Sep. 8, 2020 in U.S. Appl. No. 16/039,817.
USPTO; Non-Final Office Action dated Aug. 4, 2020 in U.S. Appl. No. 16/042,791.
USPTO; Final Office Action dated Jul. 30, 2020 in U.S. Appl. No. 16/055,532.

(56) References Cited

OTHER PUBLICATIONS

USPTO; Final Office Action dated Nov. 3, 2020 in U.S. Appl. No. 16/055,532.
USPTO; Notice of Allowance dated Sep. 14, 2020 in U.S. Appl. No. 16/100,012.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Final Office Action dated Nov. 19, 2020 in U.S. Appl. No. 16/128,282.
USPTO; Notice of Allowance dated Aug. 5, 2020 in U.S. Appl. No. 16/130,798.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Jul. 30, 2020 in U.S. Appl. No. 16/151,074.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Notice of Allowance dated Jul. 24, 2020 in U.S. Appl. No. 16/158,077.
USPTO; Non-Final Office Action dated Jul. 23, 2020 in U.S. Appl. No. 16/167,164.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Non-Final Office Action dated Nov. 4, 2020 in U.S. Appl. No. 16/176,517.
USPTO; Non-Final Office Action dated Oct. 29, 2020 in U.S. Appl. No. 16/183,258.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Final Office Action dated Nov. 27, 2020 in U.S. Appl. No. 16/205,899.
USPTO; Non-Final Office Action dated Jul. 15, 2020 in U.S. Appl. No. 16/210,922.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Final Office Action dated Oct. 14, 2020 in U.S. Appl. No. 16/251,534.
USPTO; Final Office Action dated Nov. 18, 2020 in U.S. Appl. No. 16/252,567.
USPTO; Notice of Allowance dated Aug. 6, 2020 in U.S. Appl. No. 16/255,639.
USPTO; Notice of Allowance dated Aug. 5, 2020 in U.S. Appl. No. 16/258,187.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Non-Final Office Action dated Aug. 5, 2020 in U.S. Appl. No. 16/397,045.
USPTO; Non-Final Office Action dated Aug. 19, 2020 in U.S. Appl. No. 16/400,814.
USPTO; Notice of Allowance dated Sep. 18, 2020 in U.S. Appl. No. 16/454,063.
USPTO; Non-Final Office Action dated Nov. 27, 2020 in U.S. Appl. No. 16/468,258.
USPTO; Non-Final Office Action dated Nov. 5, 2020 in U.S. Appl. No. 16/546,543.
USPTO; Notice of Allowance dated Sep. 16, 2020 in U.S. Appl. No. 16/598,768.
USPTO; Non-Final Office Action dated Oct. 16, 2020 in U.S. Appl. No. 16/679,885.
USPTO; Non-Final Office Action dated Nov. 16, 2020 in U.S. Appl. No. 16/713,311.
USPTO; Final Office Action dated Oct. 2, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Final Office Action dated Sep. 9, 2020 in U.S. Appl. No. 29/726,623.
WIPO; International Search Report dated Oct. 13, 1998 in Application No. PCT/FI1998/000571.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.
WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.

(56) References Cited

OTHER PUBLICATIONS

WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report dated Dec. 16, 1999 in Application No. PCT/RU1999/000328.
WIPO; International Preliminary Examination Report dated Jun. 29, 2001 in Application No. PCT/RU1999/000328
Akiyama et al. "Macro- and micro-scale simulation of growth rate and composition in MOCVD of yttria-stabilized zirconia" J. Crystal Growth 241, pp. 352-362 (2002).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Atta et al. "The Catalytic Activity of Ruthenates ARuO3 (a = Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Brewin et al. "UPS to deploy Bluetooth, wireless LAN network" Internet, pp. 1-5 (2001).
Bulletin Plasma Source—12/02: Type AX7610—Downstream Plasma Source. Source location: MKS Instruments, Inc. http://www mksinst. com/. Accessed: Aug. 6, 2015. pp. 1-4 (2002).
Bulletin ASTRONe—4/02: Type AX7680—Reactive Gas Generator. Source location: MKS Instruments, Inc. http://www.mksinst. com/. Accessed: Aug. 6, 2015. pp. 1-2 (2002).
Bulletin ASTRONex-7/09: Type AX7685 - Reactive Gas Generator. Source location: MKS Instruments, Inc. http://www.mksinst.com/. Accessed: Aug. 6, 2015. pp. 1-2 (2002).
Bulletin Astron hf-s—3/05: Type AX7645—Reactive Gas Generator. Source location: MKS Instruments, Inc. http://www.mksinst. com/. Accessed: Aug. 6, 2015. pp. 1-2 (2005).
Bulletin Eng-Xstream-340-09 OM 8/06: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—9/06: Type AX7690—Remote Plasma Source. Source location: MKS Instruments, Inc. http://www.mksinst.com/. Accessed: Aug. 6, 2015. pp. 1-2 (2006).
Callaghan et al. "Magnetic Interactions in Ternary Ruthenium Oxides" Inorganic Chemistry, vol. 5, No. 9, pp. 1572-1576 (1966).
Choi et al. "UV irradiation effects on the bonding structure and electrical properties of ultra low-k SiOC(-H) thin films for 45 nm technology node" Current Applied Physics, 11, S109-S113 (2011).
Closser et al., "Molecular Layer Deposition of a Highly Stable Silicon Oxycarbide Thin Film Using an Organic Chlorosilane and Water," ACS Applied Materials & Interfaces 10, pp. 24266-24274 (2018).
Crystal IS "Application Note: Using UV Reflective Materials to Maximize Disinfection"; AN011; Jun. 16, 2016, found at https:// www.klaran com/using-uv-reflective-materials-to-maximize-disinfection.
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Esposito et al. "Preparation and characterization of lead ruthenate based composite cathodes for SOFC applications" Mater. Res. Soc. Symp. Proc., vol. 835, 6 pages (2005).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Hong et al. "Ultralow-dielectric-constant amoprhous boron nitride" Nature, vol. 582, 16 pages (2020).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Johnson et al. "A brief review of atomic layer deposition: from fundamentals to applications" Materials Today, vol. 17, Issue 5, pp. 236-246 (2014).
Juppo et al. "Deposition of molybdenum thin films by an alternate supply of MoC1 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kovalgin et al. "Hot-Wire Assisted ALD: A Study Powered by In Situ Spectroscopic Ellipsometry" Adv. Mater. Interfaces 4, 1700058, 11 pages (2017).
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).

(56) References Cited

OTHER PUBLICATIONS

Kumar et al. "Bringing the benefits of Java to Bluetooth" http://www.allembedded.com/story/OEG20020519S001, pp. 1-3 (2002).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Naslain et al. "Synthesis of highly tailored ceramic matrix composites by pressure-pulsed CVI" Solid State Ionics, 141-142, pp. 541-548 (2001).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Posseme et al. "Alternative process for thin layer etching: Application to nitride spacer etching stopping on silicon germanium" Apply. Phys. Lett. 105, 051604, pp. 1-4 (2014).
Provine et al. "Atomic Layer Deposition: Introduction to the Theory and Cambridge Nanotech Savannah & Fiji" NNIN ALD Roadshow Presentation, 49 pages (2012).
Rosemount 1199 Diaphragm Seal Systems, Product Data Sheet, 92 pages (2008).
Senateur et al. "Pulsed Injection MOCVD of Functional Electronic Oxides" Adv. Mater. Opt. Electron, 10, pp. 155-161 (2000).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).
Stannowski et al. "Growth process and properties of silicon nitride deposited by hot-wire chemical vapor deposition" J Applied Physics, vol. 93 No. 5, 9 pages (2013).
Tomozeiu et al. "Effects of UV photon irradiation on SiOx (0<x<2) structural properties" Applied Surface Science 253, pp. 376-380 (2006).
US PPA 60394086 filed Jul. 3, 2002 in the name of Jacques Schmitt, and entitled "ALD on a Rotary Susceptor" pp. 1-23 (2002).
US PPA 62293897 filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016).
Venkatesan et al. "A rugged lead-ruthenate pyrochlore membrane catalyst for highly seelctive oxidation of alcohols" J. Molecular Catalysis A: Chemical 250, pp. 87-93 (2006).
Xiao "Introduction to Semiconductor Manufacturing Technology" SPIE Press, ISBN 978-0-08194-9092-6, pp. 237-245 (2012).
Yuan et al. "A Bifunctional Air Electrode Catalyzed by Lead Ruthenate for Li-Air Batteries" ECS Transactions 69(19), pp. 23-32 (2015).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
CNIPA; Office Action dated Jan. 10, 2013 in Application No. 201080015699.9.
CNIPA; Office Action dated Aug. 01, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
Cnipa; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.
CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.
CNIPA; Office Action dated Sep. 9, 2016 in Application No. 201280057542.1.
CNIPA; Notice of Allowance dated Jan. 3, 2017 in Application No. 201280057542.1.

(56) References Cited

OTHER PUBLICATIONS

CNIPA; Office Action dated Dec. 5, 2016 in Application No. 201310412808.6.
CNIPA; Notice of Allowance dated Jul. 20, 2017 in Application No. 201310412808.6.
CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Office Action dated Mar. 14, 2019 in Application No. 201610141027.1.
CNIPA; Notice of Allowance dated Sep. 03, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Nov. 04, 2019 in Application No. 201610898822.5.
CNIPA; Office Action dated Dec. 20, 2018 in Application No. 201710738549.4.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Nov. 11, 2019 in Application No. 201810379112.0.
CNIPA; Notice of Allowance dated Oct. 24, 2018 in Application No. 201830060972.9.
CNIPA; Notice of Allowance dated Nov. 1, 2018 in Application No. 201830397219.9.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.

(56) References Cited

OTHER PUBLICATIONS

JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan, 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 03, 2016 in Application No. 10-2010-0067768.
KIPO; Office Action dated Aug. 01, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Feb. 28, 2020 in Application No. 10-2013-0049598.
KIPO; Notice of Allowance dated Feb. 27, 2020 in Application No. 10-2013-0089998.
KIPO; Office Action dated Apr. 19, 2019 in Application No. 10-2013-0101944.
KIPO; Notice of Allowance dated Mar. 4, 2020 in Application No. 10-2013-0114079.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Office Action dated Dec. 4, 2019 in Application No. 10-2013-0098575.

(56) References Cited

OTHER PUBLICATIONS

KIPO; Notice of Allowance dated Oct. 8, 2019 in Application No. 10-2013-0101944.
KIPO; Office Action dated Nov. 12, 2019 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Office Action dated Feb. 3, 2020 in Application No. 10-2014-0021615.
KIPO; Office Action dated Feb. 15, 2020 in Application No. 10-2014-0027305.
KIPO; Office Action dated Mar. 11, 2020 in Application No. 10-2014-0103853.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Nov. 09, 2016 in Application No. 10-2016-7023913.
KIPO; Notice of Allowance dated May 30, 2017 in Application No. 10-2016-7023913.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Notice of Allowance dated Nov. 29, 2019 in Application No. 10-2019-0127773.
KIPO; Office Action dated Feb. 12, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
TIPO; Office Action dated Aug. 30, 2013 in Application No. 97132391.
TIPO; Office Action dated Dec. 20, 2013 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Office Action dated Dec. 26, 2014 in Application No. 99114330.
TIPO; Office Action dated Aug. 14, 2014 in Application No. 99114331.
TIPO; Office Action dated Dec. 19, 2014 in Application No. 99127063.
TIPO; Notice of Allowance dated Mar. 14, 2016 in Application No. 99127063.
TIPO; Office Action dated Feb. 19, 2016 in Application No. 100113130.
TIPO; Notice of Allowance dated Jun. 29, 2016 in Applicaton No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 01, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 06, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Office Action dated Dec. 02, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 07, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Office Action dated Nov. 1, 2017 in Application No. 103106021.
TIPO; Notice of Allowance dated Apr. 10, 2018 in Application No. 103106021.

(56) References Cited

OTHER PUBLICATIONS

TIPO; Office Action dated Oct. 31, 2017 in Application No. 103106022.
TIPO; Notice of Allowance dated Apr. 10, 2018 in Application No. 103106022.
TIPO; Office Action dated Jul. 05, 2017 in Application No. 103117477.
TIPO; Office Action dated Nov. 22, 2017 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.
TIPO; Office Action dated Sep. 19, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
Tipo; Office Action dated Aug. 24, 2017 in Application No. 103136251.
Tipo; Office Action dated Feb. 26, 2018 in Application No. 103138510.
Tipo; Office Action dated May 21, 2018 in Application No. 103139014.
Tipo; Notice of Allowance dated Sep. 11, 2018 in Application No. 103139014.
Tipo; Office Action dated Jun. 22, 2018 in Application No. 104105533.
Tipo; Office Action dated Feb. 22, 2019 in Application No. 104105533.
Tipo; Office Action dated Nov. 19, 2018 in Application No. 104105965.
Tipo; Notice of Allowance dated Sep. 23, 2019 in Application No. 104105965.
Tipo; Office Action dated Jul. 09, 2018 in Application No. 104107876.
Tipo; Office Action dated Aug. 07, 2018 Application No. 104107888.
Tipo; Notice of Allowance dated Apr. 26, 2019 in Application No. 104107888.
Tipo; Office Action dated May 06, 2019 in Application No. 104108277.
Tipo; Office Action dated Jan. 17, 2020 in Application No. 104108277.
Tipo; Office Action dated Jul. 09, 2018 in Application No. 104110326.
Tipo; Office Action dated Jun. 13, 2018 in Application No. 104111910.
Tipo; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Office Action dated Jan. 07, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Office Action dated Apr. 25, 2019 in Application No. 105101536.
TIPO; Office Action dated Dec. 13, 2019 in Application No. 105101536.
TIPO; Office Action dated Nov. 6, 2019 in Application No. 105101537.
TIPO; Office Action dated Dec. 13, 2019 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.
TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Jan. 17, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Dec. 26, 2018 in Application No. 106127690.
TIPO; Office Action dated Aug. 31, 2018 in Application No. 106138119.
TIPO; Office Action dated Jun. 25, 2018 in Application No. 106138800.
Tipo; Office Action dated Jan. 07, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated May 31, 2019 in Application No. 108102146.
TIPO; Office Action dated Jun. 28, 2019 in Application No. 108102948.
TIPO; Office Action dated Feb. 3, 2020 in Application No. 108114221.
TIPO; Office Action dated Nov. 13, 2019 in Application No. 108115406.
TIPO; Notice of Allowance dated Mar. 12, 2020 in Application No. 108129100.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated Oct. 22, 2003 in U.S. Appl. No. 10/222,229.

(56) References Cited

OTHER PUBLICATIONS

USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.

(56) References Cited

OTHER PUBLICATIONS

USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.

(56) References Cited

OTHER PUBLICATIONS

USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
Uspto; Advisory Action dated Mar. 28, 2016 in Application No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.

(56) References Cited

OTHER PUBLICATIONS

USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.

(56) References Cited

OTHER PUBLICATIONS

USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.

(56) References Cited

OTHER PUBLICATIONS

USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.

(56) References Cited

OTHER PUBLICATIONS

USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl.No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.

(56) References Cited

OTHER PUBLICATIONS

USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.

(56) References Cited

OTHER PUBLICATIONS

USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.

(56) References Cited

OTHER PUBLICATIONS

USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.

(56) References Cited

OTHER PUBLICATIONS

USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Non-Final Office Action dated Jan. 9, 2018 in U.S. Appl. No. 15/135,333.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Aug. 3, 2018 in U.S. Appl. No. 15/273,488.

(56) References Cited

OTHER PUBLICATIONS

USPTO; Final Office Action dated Jan. 11, 2019 in U.S. Appl. No. 15/273,488.
USPTO; Notice of Allowance dated Apr. 19, 2019 in U.S. Appl. No. 15/273,488.
USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Non-Final Office Action dated Jan. 16, 2018 in U.S. Appl. No. 15/499,647.

(56) References Cited

OTHER PUBLICATIONS

USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.

(56) References Cited

OTHER PUBLICATIONS

USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Non-Final Office Action dated Feb. 20, 2020 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Non-Final Office Action dated Mar. 20, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.

(56) References Cited

OTHER PUBLICATIONS

USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Non-Final Office Action dated Apr. 2, 2020 in U.S. Appl. No. 15/974,948.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Apr. 1, 2020 in U.S. Appl. No. 15/997,445.
USPTO; Non-Final Office Action dated Mar. 3, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Notice of Allowance dated Jul. 10, 2019 in U.S. Appl. No. 16/046,218.
USPTO; Non-Final Office Action dated Feb. 20, 2020 in U.S. Appl. No. 16/105,745.
USPTO; Non-Final Office Action dated Feb. 24, 2020 in U.S. Appl. No. 16/105,761.
USPTO; Non-Final Office Action dated Mar. 19, 2020 in U.S. Appl. No. 16/105,802.
USPTO; Non-Final Office Action dated Mar. 16, 2020 in U.S. Appl. No. 16/116,708.
USPTO; Non-Final Office Action dated Feb. 6, 2020 in U.S. Appl. No. 16/117,530.
USPTO; Non-Final Office Action dated Jan. 6, 2020 in U.S. Appl. No. 16/132,142.
USPTO; Non-Final Office Action dated Feb. 28, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Nov. 5, 2019 in U.S. Appl. No. 16/152,260.

(56) References Cited

OTHER PUBLICATIONS

USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Oct. 3, 2019 in U.S. Appl. No. 16/200,100.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Non-Final Office Action dated Feb. 19, 2020 in U.S. Appl. No. 16/242,829.
USPTO; Non-Final Office Action dated Jan. 30, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Dec. 18, 2019 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Notice of Allowance dated Jun. 13, 2019 in U.S. Appl. No. 16/396,475.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Non-Final Office Action dated Dec. 31, 2019 in U.S. Appl. No. 16/455,406.
USPTO; Final Office Action dated Jan. 10, 2020 in U.S. Appl. No. 16/674,894.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.

(56) References Cited

OTHER PUBLICATIONS

WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.
WIPO; International Search Report and Written Opinion dated Apr. 17, 2019 in Application No. PCT/NL2018/050787.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/U S2012/065343.
WIPO; International Search report and Written Opinion dated Feb. 13, 2013 in Application No. PCT/US2012/065347.
Alen, "Atomic layer deposition of TaN, NbN and MoN films for Cu Metallizations," University of Helsinki Finland, 72 pages, (2005).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Bark et al. "Large-area niobium disulfide thin films as transparent electrodes for devices based on two-dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Basuvalingam et al. "NS-WeA6—Low Temperature ALD for Phase-controlled Synthesis of 2D Transition Metal (M=Ti, Nb) di—(MX2) and Tri—(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Closser et al., "Molecular Layer Deposition of a Highly Stable Silicon Oxycarbide Thin Film Using an Organic Chlorosilane and Water," ACS Applied Materials & Interfaces 10, pp. 24266-24274.
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
De Silva et al., "Inorganic Hardmask Development for Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma. Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3]. pp. 287-300. (1999).

(56) References Cited

OTHER PUBLICATIONS

"Fiji F200 200mm Thermal/Plasma ALD Systems: Installation and Use Manual." CAW-02635 Rev. 0.6 (Mar. 13, 2012). Cambridge NanoTech Inc. pp. 1-164 (2012).
Fu et al., "Controlled Synthesis of Atomically Thin 1T-TaS2 for Tunable Charge Density Wave Phase Transitions" Chem. Mater. 28, pp. 7613-7618 (2016).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Microstructure of Black Molybdenum Photothermal Converter Layers Deposited by the Pyrolytic Hydrogen Reduction of $MoO_2 Cl_2$ " Thin Solid Films, 79, pp. 39-49 (1981).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2]. pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c-Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E =50-30,000 eV, Z = 1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hossain et al., "Recent Advances in Two-Dimensional Materials with Charge Density Waves: Synthesis, Characterization and Applications" Crystals 7, 298, 19 pages (2017).
Hubert et al., "A Stacked SONOS Technology, up to 4 Levels and 6nm Crystalline Nanowires, With Gate-All-Around or Independent Gates (−Flash), Suitable for Full 3D Integration," Minatec, IEDM09-637.
Hudis, "Surface Crosslinking of Polyethylene Using a Hydrogen Glow Discharge," J. Appl. Polym. Sci., 16 (1972) 2397.
Johansson et al. "Towards absolute asymmetric synthesis. Synthesis and crystal structure of stereochemically labile MC12 (M=Co, Ni, Cu, Zn) complexes with diamine ligands," Inorganica Chimica Acta 358, pp. 3293-3302 (2005).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Katamreddy et al., "ALD and Characterization of Aluminum Oxide Deposited on Si(100) using Tris(diethylamino) Aluminum and Water Vapor," Journal of the Electrochemical Society, 153 (10).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al., "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
King, Plasma Enhanced Atomic Layer Deposition of SiNx: H and SiO2, J. Vac. Sci. Technol., A29(4) (2011).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kogelschatz et al. "Ozone Generation from Oxygen and Air: Discharge Physics and Reaction Mechanisms" Ozone Science & Engineering, 10, pp. 367-378 (1998).
Koo et al., "Characteristics of A12O3 Thin Films Deposited Using Dimethylaluminum Isopropoxide and Trimethylaluminum Precur-

(56) References Cited

OTHER PUBLICATIONS sors by the Plasma-Enhanced Atomic-Layer Deposition Method," Journal of Physical Society, 48, 1, 131-136 (2006).
Koutsokeras et al. "Texture and Microstructure Evolution in Single-Phase TixTal—xN Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kucheyev et al. "Mechanisms of Atomic Layer Deposition on Substrates with Ultrahigh Aspect Ratios." Langmuir. 24 [3]. pp. 943-948 (2008).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kurosawa et al., "Synthesis and Characterization of Plasma-Polymerized Hexamethyldisiloxane Films," Thin Solid Films, 506-507, 176-179 (2006).
Kwon et al., "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al., "Characteristics of Low—K Sioc Films Deposited Via Atomic Layer Deposition," Thin Solid Films 645, pp. 334-339 (2018).
Lee et al., Layer Selection by Multi-Level Permutation in 3-D Stacked NAND Flash Memory, IEEE Electron Device Letters, vol. 37, No. 7, 866-869 (2016).
Levy et al., "Reflow Mechanisms of Contact Vias in VLSI Processing" J. Electrochem. Soc.: Solid-State Science and Technology, 133, 7, pp. 1417-1424 (1986).
Li et al., "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).
Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
MacKenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2A1)2O]n and (RAIO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnC14 Precursor," ECS Transactions, 69 (5), 279-285 (2015).
Mukai et al., "A Study of CD Budget in Spacer Patterning Technology," Proc. of SPIE, 6924, 1-8 (2008).
Naito et al. "Electrical Transport Properties in 2H-NbS2, -NbSe2, -TaS2 and -TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).

(56) References Cited

OTHER PUBLICATIONS

Ohtsu et al. "Influences of Gap Distance on Plasma Characteristics in Narrow Gap Capacitatively Coupled Radio-Frequency Discharge," vol. 43, No. 2, pp. 795-799 (2004).
Okamoto et al., "Luminescent Properties of Pr3+—sensitized LaPO4: Gd3+ Ultraviolet-B Phosphor Under Vacuum-Ultraviolet Light Excitation," J. App. Phys. 106, 013522 (2009).
Park, "Substituted Aluminum Metal Gate on High-K Dielectric for Low Work-Function and Fermi-Level Pinning Free," 4 pages, IEEE 0/7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179.
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plasma Enhanced Atomic Layer Deposited Silicon Nitride," AIP Advances, 6 (2016).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).
Sanders et al., "Crystalline and electronic structure of single-layer TaS2" Phys. Rev. B. 94, 081404, 6 pages (2016).
Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Seshadri et al., "Ultrathin Extreme Ultraviolet Patterning Stack Using Polymer Brush as an Adhesion Promotion Layer," Journal of Micro/Nanolithography, MEMS, and MOEMS 16(3) (2017).
Shamma et al., "PDL Oxide Enabled Doubling," Proc. of SPIE, 6924, 69240D, 1-10 (2008).
Simchi et al., "Sulfidation of 2D transition metals (Mo, W, Re, Nb, Ta): thermodynamics, processing, and characterization" J. Materials Science 52: 17, 9 pages (2017).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/podf/tech_ozonia_feedgas.podf (1999).
Svetin et al., "Three-dimensional resistivity and switching between correlated electronic states in 1T-$TaS_2$ " Nature, Scientific Reports Apr. 12, 2017, 7:46048, 10 pages (2017).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt-Ru Binary Alloy Thin Films for Work Function Tuning," IEEE Electron Device Letters, vol. 27, No. 7, pp. 542-545 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths, et al, "SiGeSn Growth tudies Using Reduced Pressure Chemical Vapor Deposition Towards Optoeleconic Applications," This Soid Films, 557, 183-187 (2014).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," Smic et al. (2016).
Xu et al., "Contacts between Two- and Three- Dimensional Materials: Ochmic, Schottky, and p-n Heterojunctions" ACS Nano 10, pp. 4895-4919 (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).

(56) References Cited

OTHER PUBLICATIONS

Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using 16, 2016 UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References Cited by Examiner dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.
CNIPA; Notice of Allowance dated Dec. 21, 2020 in Application No. 201610982040.X.
CNIPA; Office Action dated Nov. 20, 2020 in Application No. 201710762817.6.
CNIPA; Notice of Allowance dated Dec. 28, 2020 in Application No. 201930704935.1.
CNIPA; Notice of Allowance dated Dec. 10, 2020 in Application No. 202030352604.9.
CNIPA; Office Action dated Jan. 25, 2021 in Application No. 202030579755.8.
JPO; Notice of Allowance dated Nov. 27, 2020 in Application No. 2016-206625.
JPO; Office Action dated Jan. 26, 2021 in Application No. 2017-139817.
JPO; Notice of Allowance dated Nov. 26, 2020 in Application No. 2020-502653.
KIPO; Office Action dated Jan. 25, 2021 in Application No. 10-2014-0011765.
KIPO; Notice of Allowance dated Jan. 4, 2021 in Application No. 10-2014-0060120.
KIPO; Notice of Allowance dated Jan. 4, 2021 in Application No. 10-2014-0071653.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Jan. 25, 2021 in Application No. 10-2014-0145220.
KIPO; Office Action dated Jan. 6, 2021 in Application No. 10-2015-0025314.
KIPO; Office Action dated Dec. 23, 2020 in Application No. 10-2019-0044213.
KIPO; Office Action dated Nov. 14, 2020 in Application No. 10-2020-0101096.
KIPO; Notice of Allowance dated Oct. 20, 2020 in Application No. 30-2019-0054642.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Sep. 30, 2020 in Application No. 106113604.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Office Action dated Dec. 24, 2019 in Application No. 108105002.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in U.S. Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.

(56) References Cited

OTHER PUBLICATIONS

USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Non-Final Office Action dated Nov. 24, 2020 in U.S. Appl. No. 16/039,938.
USPTO; Advisory Action dated Jan. 14, 2021 in U.S. Appl. No. 16/055,532.
Uspto; Final Office Action dated Dec. 15, 2020 in Application No. 16/108,950.
Uspto; Final Office Action dated Jan. 6, 2021 in Application No. 16/117,530.
Uspto; Notice of Allowance dated Feb. 12, 2021 in Application No. 16/128,282.
Uspto; Notice of Allowance dated Feb. 8, 2021 in Application No. 16/132,142.
Uspto; Final Office Action dated Dec. 14, 2020 in Application No. 16/151,074.
Uspto; Advisory Action dated Feb. 16, 2021 in Application No. 16/151,074.
Uspto; Final Office Action dated Dec. 18, 2020 in Application No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.
USPTO; Non-Final Office Action dated Jan. 12, 2021 in U.S. Appl. No. 16/453,249.
USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Notice of Allowance dated Dec. 28, 2021 in U.S. Appl. No. 16/833,279.
USPTO; Notice of Allowance dated Nov. 23, 2020 in U.S. Appl. No. 29/726,623.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages. (1999).
Kim et al. "High Growth Rate in Atomic Layer Deposition of TiO2 Thin Films by UV Irradiation" Electrochemical and Solid-State Letters, 14(4), pp. H146-H148 (2011).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VC14 as Precursor" Coatings, 8, 431, pp. 1-11 (2018).
Lee et al. "Photo-Induced Atomic Layer Deposition of Tantalum Oxide Thin Films from Ta(OC2H5)5 and 02" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of Y2O3 Thin Films from β-Diketonate Precursors" Chemical Vapor Deposition 7(1) pp. 44-50 (2001).
U.S. PPA 62274238 filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).

* cited by examiner

300

300B

300C

SELECTIVE DEPOSITION METHOD TO FORM AIR GAPS

CROSS-REFERENCE TO RELATED APPLICATION

This application is a continuation of, and claims priority to and the benefit of, U.S. patent application Ser. No. 15/836,547, filed on Dec. 8, 2017 and entitled "SELECTIVE DEPOSITION METHOD TO FORM AIR GAPS," which is a continuation of, and claims priority to and the benefit of, U.S. patent application Ser. No. 15/205,890, now U.S. Pat. No. 9,859,151, filed on Jul. 8, 2016 and entitled "SELECTIVE FILM DEPOSITION METHOD TO FORM AIR GAPS," both of which are incorporated herein by reference.

FIELD OF INVENTION

The present disclosure generally relates to processes for manufacturing electronic devices. More particularly, the disclosure relates to selectively forming films through atomic layer deposition (ALD) or chemical vapor deposition (CVD). Specifically, the disclosure discloses methods to form ALD or CVD films that can be used to form an air gap.

BACKGROUND OF THE DISCLOSURE

Generally, deposition of films has taken place in a manner such that layers are grown from the bottom in an upward direction. For example, a film grown on a wafer is often grown in a direction vertical to the wafer's surface. Other films may be grown vertically on a microstructure surface. Some examples of features created in this manner include trench filling, step formation, or FinFET features, for example.

Air gaps are features with applicability in film deposition. U.S. Pat. No. 7,304,388 to Dubin et al. discloses air gaps that are created by first forming a sacrificial interlayer dielectric and decomposing it. The formation may involve an etching step, which may cause problems and decrease the performance of the device. The formation may also involve a deposition step for protecting liners, metal or metallic surfaces, thus decreasing the size of the air gap and the performance of the device. For example, International Publication No. WO 2013/101096 to Fischer discloses air gap formation with a hood layer. The air gap formation may also include an etching step. Air gaps may be used both in back end of line (BEOL) processing or front end of line processing. Two examples of applications for air gaps include air gaps in metallization, such as Cu metallization, or air gaps in NAND memories.

As a result, a method for selectively forming an air gap through ALD or CVD processes resulting in increased performance is desired.

SUMMARY OF THE DISCLOSURE

In accordance with at least one embodiment of the invention, a method of forming an air gap for a semiconductor device through selective deposition is disclosed. The method comprises: providing a substrate for processing in a reaction chamber; providing a first surface for selectively depositing a film, wherein at least a part of the first surface is substantially vertical; and selectively depositing a film through a deposition method on the first surface in at least a horizontal direction, the film not being deposited on a second surface, wherein the second surface differs from the first surface; wherein selectively depositing the film defines in part an air gap.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
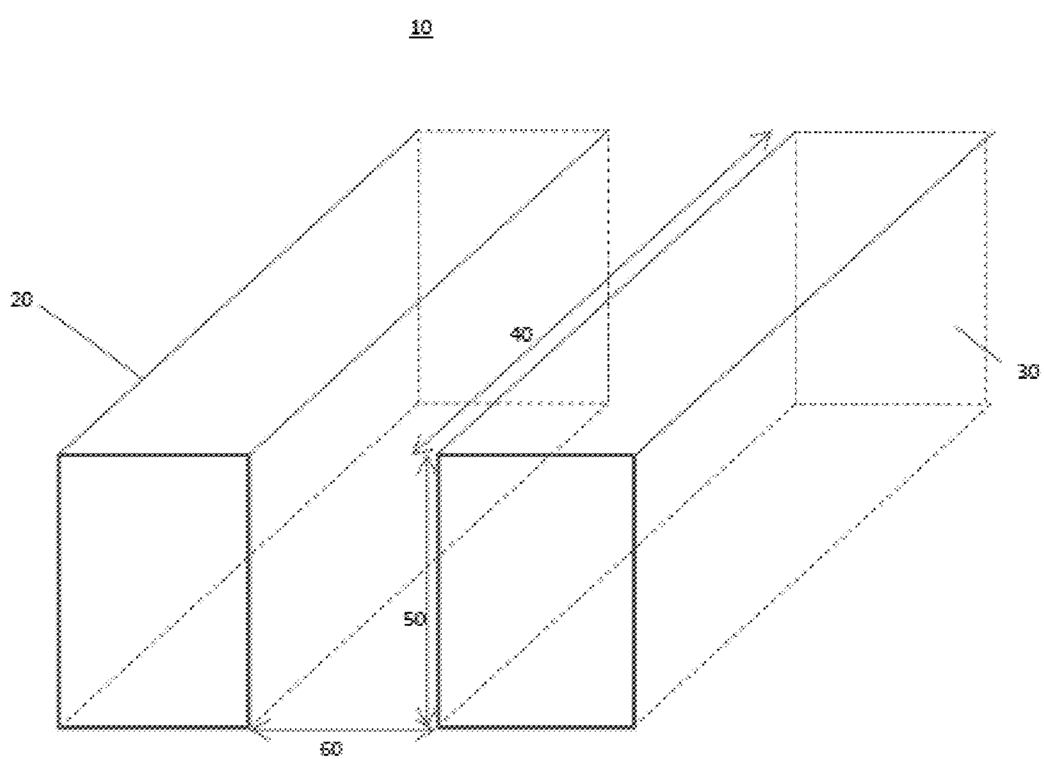
FIG. 1 is a perspective view of a semiconductor device in accordance with at least one embodiment of the invention.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Selective deposition is desirable in order to grow particular features for a variety of applications. One particular feature, air gaps, has been used in 14 nm nodes, which currently is the smallest node size manufactured. Air gaps created in the 14 nm node may have, for example, a height of approximately 140 nm and a width of approximately 50 nm. This gap can be formed in a trench of approximately 180 nm in height, the trench herein meaning the space in between the metallization lines. The area of the air gap may be approximately 6,500 $nm^2$, while the trench can have an area of 19,700 $nm^2$. The volume of the air gap could be in the range of 1,625,000-32,500,000 $nm^3$, while the trench could have a volume of 4,925,000-98,500,000 $nm^3$. The air gap can be approximately 33% of the size of the trench.

Embodiments according to the invention can result in a larger air gap in that it can be a greater percentage of the trench, such as 50-60%, for example. The size of the air gap may be more than about 35%, more than about 45%, more than about 50%, more than about 60%, more than about 70%, or more than about 80% of the size of the trench or the space between the metallization lines.

One of ordinary skill in the art would understand that different sizes for the air gap may be possible. For example, the height of the air gap may range between about 10 to about 500 nm, between about 20 to about 300 nm, between about 30 to about 200 nm. Also, the width of the air gap may range between about 5 to about 250 nm, preferably between about 10 to about 200 nm, or more preferably between about 20 to about 100 nm. Also, the width of the air gap may be less than about 50 nm, less than about 30 nm, less than about 20 nm or in some instances less than to about 10 nm. The width can be considered to be measured to a direction of the smaller dimension between the features, for example, the width between metallization lines, the longest dimension of the metallization lines being cross-sectional to width (i.e., the smaller dimension).

From this, the cross-sectional area of the air gap may range between 50-125,000 $nm^2$, preferably between about 100 to about 50,000 $nm^2$, or more preferably between about 200 to about 20,000 $nm^2$. The cross-sectional area of the air gap herein can be considered to be a cross-sectional area of the air gap between the features of device. The area can be considered to be measured to a direction of the smallest dimension between the features, for example, the area between metallization lines, the longest dimension of the metallization lines being cross-sectional to the area. Furthermore, the size of the air gap in relation to the trench size may range between about 30-80%. Also, the volume of the air gap could be in the range from about 2,500 to about 5,000,000,000 $nm^3$, preferably from about 10,000 to about 500,000,000 $nm^3$, or more preferably from about 50,000 to about 50,000,000 $nm^3$.

FIG. 1 is schematic and simplified for the purpose of illustrating the exemplary dimensions. FIG. 1 illustrates a semiconductor device 10 in accordance with at least one embodiment of the invention. The semiconductor device 10 comprises a first metallization line 20 and a second metallization line 30. The first metallization line 20 and the second metallization line 30 may comprise a material, such as copper or other appropriate metal. A gap may exist between the first metallization line 20 and the second metallization line 30. The gap may have a length 40, a height 50, and a width 60. In some embodiments, the air gap may be formed inside the gap and it may have a length, a height, and a width smaller than the length 40, the height 50, and the width 60 illustrated in the FIG. 1. In some embodiments, the cross-sectional area of the air gap may be measured or calculated by using the height and the width, of which directions are the same than height 50 and width 60 of the air gap formed inside the gap. In some embodiments, the width 60 may be considered to be the smallest or smaller dimension between the features. In some embodiments, the height 50 may be considered to be the smallest or smaller dimension between the features.

Advantages gained from a larger air gap may include improved performance, and reducing the effective k-value of the material in between the lines. For example, the dielectric constant of low-k materials may be approximately 2.52, but the dielectric constant of air is 1. Reduction of the dielectric constant through replacement of the low-k material with air reduces the Resistive-capacitive (RC) delay. In addition, the replacement may result in increased processing speed, use of less current, and reduction of operating temperature and parasitic resistance. In some embodiments, the structure having air gap may have a performance similar to a material with a k-value of less than about 3.9, less than about 3.6, less than about 3.3, less than about 3, less than about 2.7, less than about 2.5, and in some instances, the k-value could be less than about 2.3 or even less than about 2.0 when the material would be considered to replace the air gap.

Figures presented herein are simplified and do not necessarily illustrate all layers, structures or features of the exemplary integrated circuits or structures that can form part on an integrated circuit.

Figure 2A:
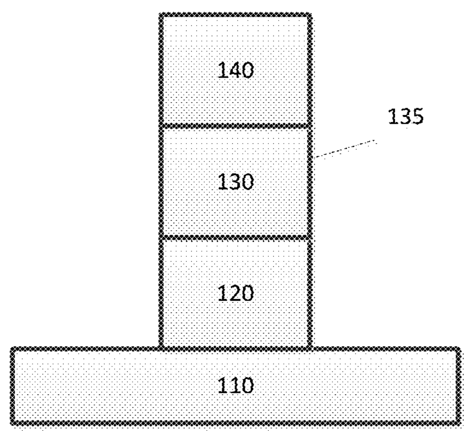
FIGS. 2A and 2B are cross-sectional views of a semiconductor device in accordance with at least one embodiment of the invention.

FIG. 2A illustrates a semiconductor device 100 in accordance with at least one embodiment of the invention. The semiconductor device 100 may include a wafer 110, a first layer 120, a second layer 130, and a capping layer 140. The wafer 110 may comprise semiconductor material, such as silicon, silicon germanium or compound semiconductors such as III-V or II-VI materials. The first layer 120 may be a metal layer on top of the wafer 110, and may comprise metal or metallic materials, such as copper or insulating or dielectric material, such as silicon dioxide based materials or low-k materials. In some embodiments, the first layer 120 may comprise silicon and oxygen, for example, silicon dioxide. In some embodiments, the first layer 120 may not comprise metal. In some embodiments, the first layer 120 may comprise semi-metal material. Additional layers may exist between the first layer 120 and the substrate 110; for example, there may be multiple metallization layers or transistor layers or contact layers disposed between the first layer 120 and the substrate 110. The second layer 130 may be formed on the first layer 120, and may comprise materials comprising metal, such as aluminum nitride tungsten, tungsten oxide or other metallic, metal or insulating material. In some instances, the second layer 130 may be of a different material than the first layer 120. In some embodiments, the second layer 130 may comprise a metal or metallic surface. In some embodiments, the second layer 130 may not comprise a semi-metal. In some embodiments, the second layer 130 may comprise metal and oxygen, such as metal oxide.

The capping layer 140 may be formed on the second layer 130 and may comprise silicon-based material, such as silicon dioxide, silicon nitride or mixtures thereof. The capping layer 140 may cover portions of the second layer 130, leaving a particular portion of the second layer 130 exposed. The capping layer 140 may be made of the same material as the first layer 120. In some embodiments, the capping layer 140 may comprise silicon and oxygen, for example, silicon dioxide. In some embodiments, the capping layer 140 may not comprise metal. In some embodiments, the capping layer 140 may comprise a semi-metal. It is on the exposed portion (e.g., a surface or vertical portion 135) of the second layer 130 on which selective deposition may take place.

Figure 2B:
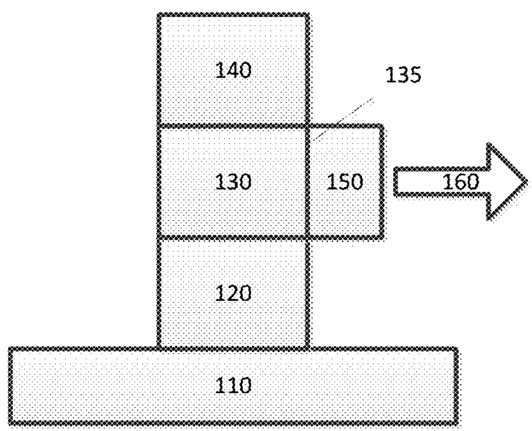

FIG. 2B illustrates the semiconductor device 100 in accordance with at least one embodiment of the invention. Upon an exposed portion of the second layer 130 (e.g., surface 135), a film 150 is deposited substantially horizontally along a direction 160 via deposition method, such as ALD, CVD (e.g., cyclic or sequential CVD), or any other suitable chemical and vapor phase based deposition method resulting in selective deposition. The film 150 deposited may comprise an insulating or dielectric material (for example, silicon oxide ($SiO_2$)), metal oxide materials, transition metal oxides (for example, niobium oxide ($Nb_2O_5$)), or another low-k material.

For a film 150 formed of metal oxide, the following process may be used. First a surface (e.g., surface 135) to deposit the film 150 on may be provided. Second, a pulsing step of a metal precursor such as metal halide, may take place. An example of a metal halide may be a transition metal halide, such as niobium fluoride, niobium chloride, tantalum fluoride, tantalum chloride, molybdenum fluoride, molybdenum chloride, tungsten fluoride, tungsten fluoride, vanadium fluoride, vanadium chloride, chromium fluoride, or chromium chloride. In some embodiments, the metal halide may be $NbCl_5$ or $TaCl_5$. The pulsing step may have a temperature ranging between 20 and 600° C., preferably between 100 and 500° C., preferably between 150 and 400° C., and preferably between 175 and 375° C. The pulsing step may have a duration ranging between 0.01 and 120 seconds, preferably between 0.025 and 20 seconds, preferably between 0.05 and 10 seconds, and preferably between 0.1 and 5 seconds.

Third, a pulsing step of an oxygen source, such as water, may take place for example. Other oxygen sources may include oxygen ($O_2$), ozone ($O_3$), hydrogen peroxide ($H_2O_2$), atomic oxygen (O), oxygen radicals, or oxygen plasma, among others. The pulsing step may have a temperature ranging between 20 and 600° C., preferably between 100 and 500° C., preferably between 150 and 400° C., and preferably between 175 and 375° C. The pulsing step may have a duration ranging between 0.01 and 120 seconds, preferably between 0.025 and 20 seconds, preferably between 0.05 and 10 seconds, and preferably between 0.1 and 5 seconds.

After the pulsing steps, a purging step may take place to expunge any excess precursor. In addition, the pulsing steps may be repeated to form a film of a desired thickness.

Figure 3A:
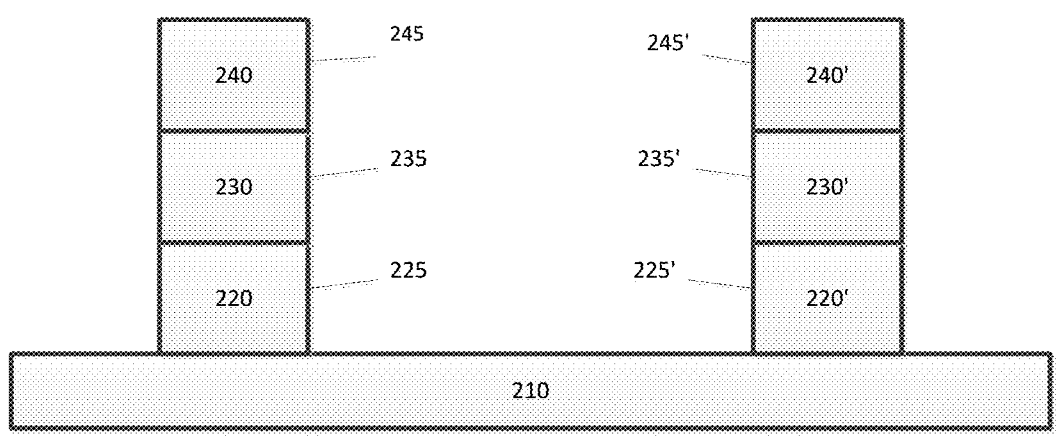
FIGS. 3A, 3B, 3C and 3D are cross-sectional views of a semiconductor device in accordance with at least one embodiment of the invention.

FIG. 3A illustrates a semiconductor device 200 in accordance with at least one embodiment of the invention. The semiconductor device 200 includes a wafer 210 and a first column comprising a first layer 220 comprising a first surface 225, a second layer 230 comprising a second surface 235, and a capping layer 240 comprising a third surface 245. The semiconductor device 200 may also include a second column comprising a first layer 220' comprising a fourth surface 225', a second layer 230' comprising a fifth surface 235', and a capping layer 240' comprising a sixth surface 245'. Surfaces 225, 235, 245, 225', 235', and 245' can be vertical portions or comprise vertical portions. The wafer 210 may comprise silicon, silicon germanium, or another III-V material. The first layer 220 and the first layer 220' may be a metal layer on top of the wafer 210, and may comprise copper or tungsten, for example. Additional layers may exist between the first layers 220 and 220' and the substrate 210; for example, there may be multiple metallization layers disposed between the first layers 220 and 220' and the substrate 210. The second layer 230 and the second layer 230' may be formed on the first layer 220 and the first layer 220', and may comprise aluminum nitride, silicon nitride (SiN), or silicon carbon nitride (SiCN).

The capping layer 240 and the capping layer 240' may be formed on the second layer 230 and the second layer 230'. The capping layer 240 and the capping layer 240' may comprise silicon oxide, niobium oxide ($Nb_2O_5$), or another low-k material. The capping layer 240 and the capping layer 230' may cover portions of the second layer 230 and the second layer 230', leaving a particular portion exposed (e.g., surfaces 235, 235'). It is on the exposed portion (e.g., surface 235, 235') of the second layer 230 and the second layer 230' on which selective deposition may take place.

Figure 3B:
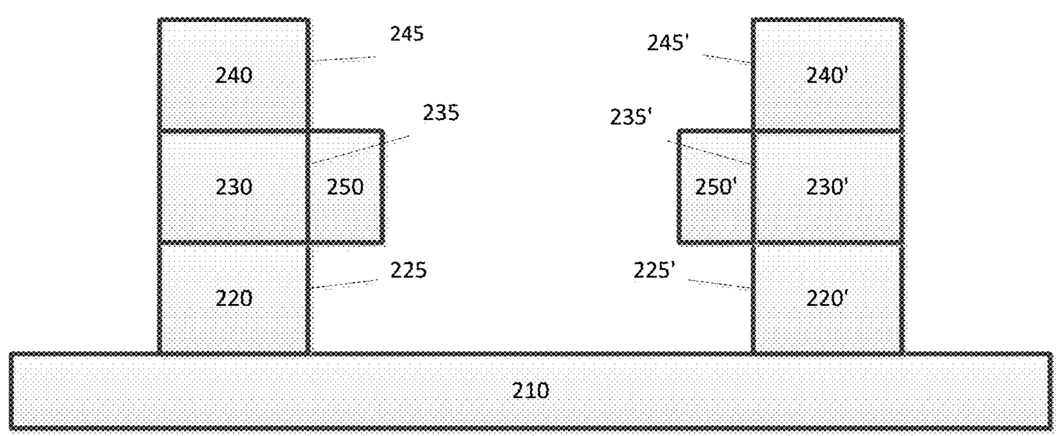

FIG. 3B illustrates the semiconductor device 200A, which includes structure 200, in accordance with at least one embodiment of the invention. Upon an exposed portion (e.g., surfaces 235, 235') of the second layer 230 and the second layer 230', a film 250 and a film 250' are deposited substantially horizontally via deposition method, such as ALD, CVD, or any other suitable deposition method resulting in selective deposition. The film 250 deposited may comprise silicon oxide ($SiO_2$), niobium oxide ($Nb_2O_5$), or another low-k material. The steps to form the film 250, 250' may be similar to those described in relation to FIG. 2B.

Figure 3C:
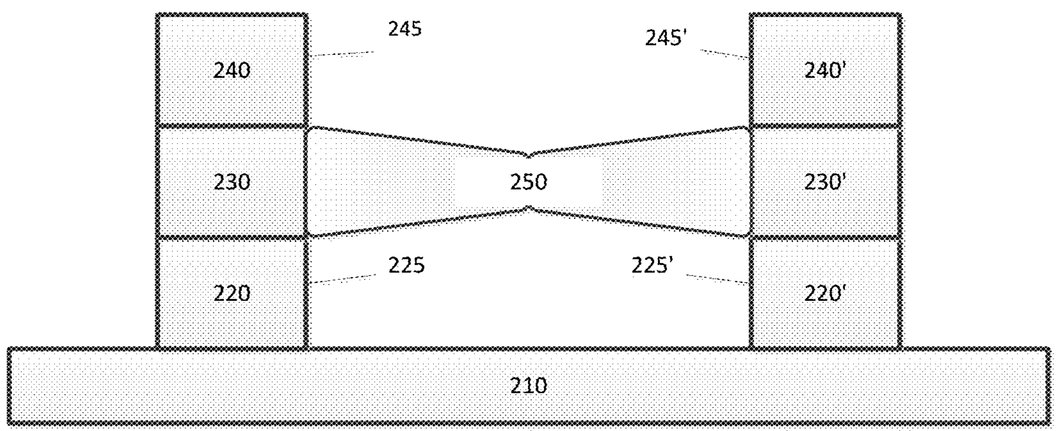

FIG. 3C illustrates a semiconductor device 200B, formed from structure 200A, in accordance with at least one embodiment of the invention. As the substantially horizontal deposition takes place, a film 250 (merged with film 250') may be formed to bridge the first column with the second column. A shape of the film 250 may be narrower in the middle due to crystalline alignment or due to deposition process itself. For example, before closing of the gap 250, there may be only a narrow pathway from the air gap to outside environment, which may be difficult to purge in reasonable time before the next precursor pulse. Without being bound to any theory, it may cause some CVD reactions to take place on and around the narrow pathway and it may cause closing of the gap and affect the shape of the film 250. However, other shapes for the film 250 are possible, including spherical or semispherical.

Figure 3D:
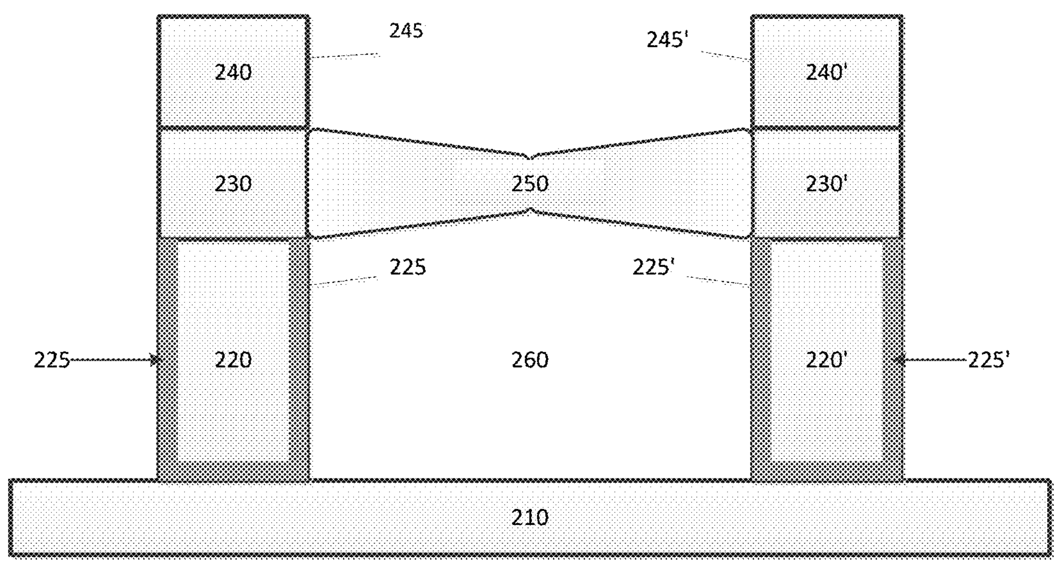

FIG. 3D illustrates a semiconductor device 200C in accordance with at least one embodiment of the invention. The first layer 220 may have a liner 225, while the first layer 220' may have a liner 225'. The liner 225 and the liner 225' may comprise titanium nitride (TiN), tantalum nitride (TaN), tungsten nitride (WN), tungsten (W), tantalum (Ta), titanium (Ti), or other appropriate metallic material. The liner 225 and the liner 225' may generally have the features of good conductivity, effective barrier properties, and good adhesion. Surfaces 225, 225' may comprise the liner material. As a result of the horizontal deposition, an air gap 260 may be formed. The air gap 260 serves as a replacement for a low-k dielectric material that would have been in its place.

Figure 4A:
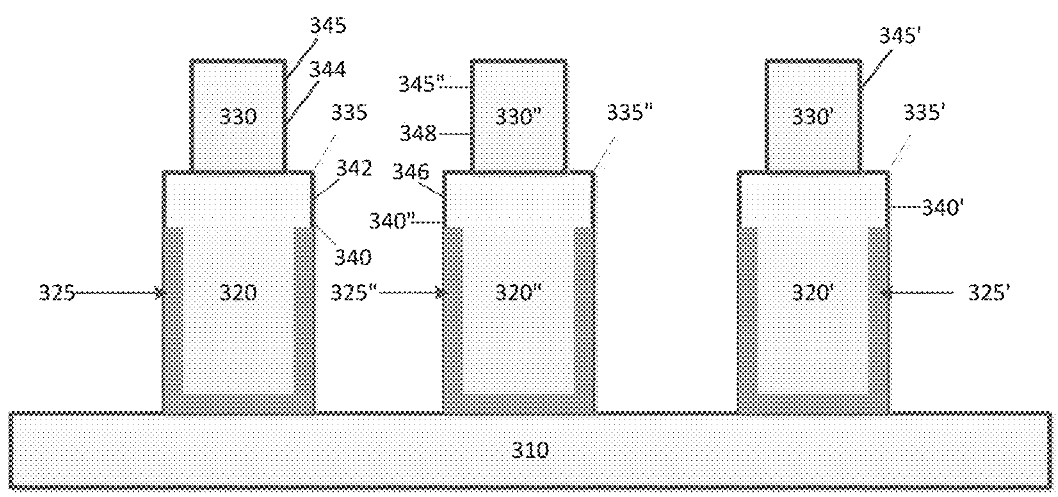
FIGS. 4A, 4B, 4C and 4D are cross-sectional views in accordance with at least one embodiment of the invention.

FIG. 4A illustrates a semiconductor device 300 in accordance with at least one embodiment of the invention. The semiconductor device 300 includes a wafer 310. The wafer 310 may comprise silicon, silicon germanium, or other III-V materials. Disposed on the wafer 310 are a plurality of first layers 320, 320', and 320". The first layers 320, 320', and 320" may comprise copper, tungsten, tantalum, or titanium, for example, and may be metallization lines in an integrated circuit. First layer 320 can include a first surface 340 and a first substantially vertical portion 342, first layer 320" can include a third surface 340" and a third substantially vertical portion 346, and first layer 320' can include a fifth surface 340'. Covering a portion of the first layers 320, 320', and 320" (e.g., a portion of first surface 340, a portion of third surface 340", and a portion of fifth surface 340') are a plurality of liners 325, 325', and 325". The liners 325, 325', and 325" may comprise titanium nitride (TiN), tantalum nitride (TaN), tungsten nitride (WN), tungsten (W), tantalum (Ta), titanium (Ti), or other appropriate metallic material.

A plurality of second layers 330, 330', and 330" may be formed on the first layers 320, 320', and 330". The second layers 330, 330', and 330" may comprise aluminum nitride, silicon nitride (SiN), or silicon carbon nitride (SiCN), for example. Second layer 330 can include a second surface 345 and a second substantially vertical portion 344, second layer 330" can include a fourth surface 345" and a fourth substantially vertical portion 348, and second layer 330' can include a sixth surface 345'.

Figure 4B:
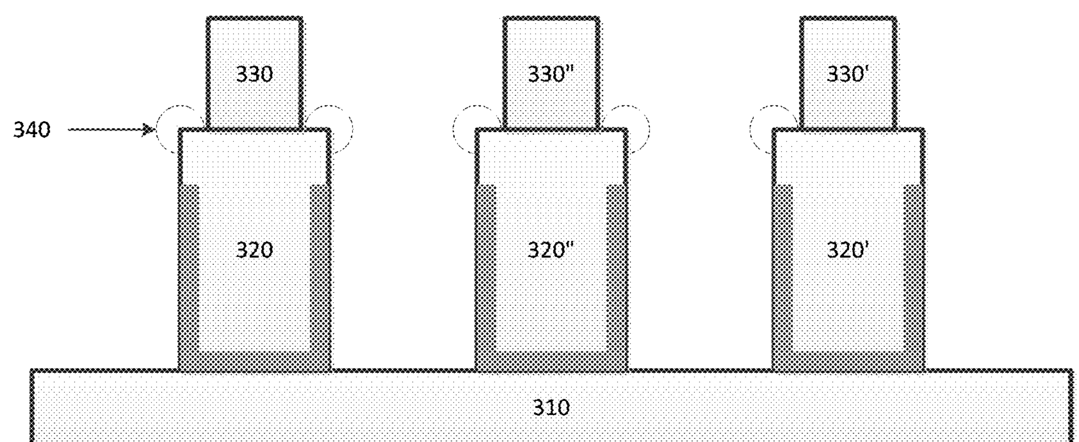

FIG. 4B illustrates the semiconductor device 300A in accordance with at least one embodiment of the invention. A portion (e.g., surfaces 335, 335', and 335', which can comprise vertical portions) of the first layers 320, 320', and 320" is not covered by the liners 325, 325', and 325" and the second layers 330, 330', and 330". It is on this exposed portion of the first layers 320, 320' and 320" that a plurality of films 340 may be formed. The plurality of films 340 may be formed through ALD, CVD, or any other suitable deposition method resulting in selective deposition.

The films 340 may comprise silicon oxide ($SiO_2$), niobium oxide ($Nb_2O_5$), or another low-k material. The steps to form the film 340 may be similar to those described in relation to FIGS. 1B and 2B. The selective deposition takes place such that the film 340 forms on the exposed portions of the first layers 320, and 320', and 320". The film 340 would not form on the liners 325, 325', and 325" or the second layers 330, 330', and 330".

Figure 4C:
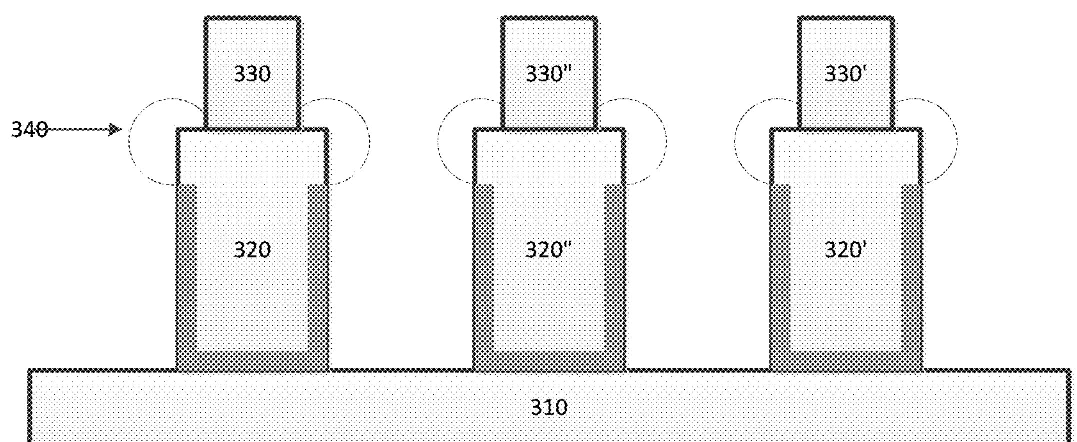

FIG. 4C illustrates the semiconductor device 300B in accordance with at least one embodiment of the invention. The films 340 may grow to a point that it covers all of the exposed portions of the first layers 320, 320', and 320". The film 340 may first be grown in a conformal manner, but then grow in a non-conformal manner close to a surface of an opening of the trench or a space between the column stacks. The trench may be closed by the film 340 by a varying degree. For example, a percentage closure of the trench by the film 340 may be more than about 20%, more than about 40%, more than about 60%, or more than about 80%. Such may be also reflected by the amount of the film 340 deposited. For example, the film 340 may comprise more than about 1 nm of deposition, more than about 3 nm of deposition, more than about 5 nm of deposition, more than about 10 nm of deposition, or more than about 20 nm of deposition.

Figure 4D:
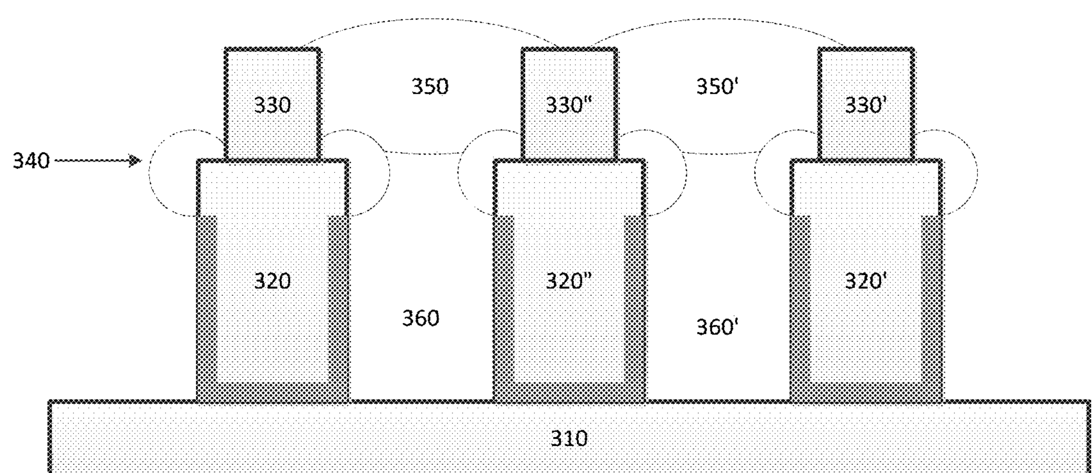

FIG. 4D illustrates the semiconductor device 300C in accordance with at least one embodiment of the invention. After the film 340 is formed, a first dielectric layer 350 and a second dielectric layer 350' may be formed through a CVD process with parameters resulting in a non-conformal film growth, such as non-conformal plasma enhanced chemical vapor deposition (PECVD) of a silicon oxide-based material, for example. The first dielectric layer 350 and the second dielectric layer 350' may comprise silicon based materials such as silicon dioxide ($SiO_2$), silicon carbonitride (SiCN), or a low-k material, for example. The first dielectric layer 350 and the second dielectric layer 350' may be formed to create a first air gap 360 and a second air gap 360'. In addition, the dielectric layers 350 and 350' may be formed on the top of the second layers 330, 330', and 330".

As shown in FIG. 4D, multiple air gaps may be formed between formed stacked layers. Gaps may be less than 200 nm, preferably less than 100 nm, more preferably less than 75 nm, and more preferably less than 50 nm. A smaller gap may be preferred as being better for ALD processing. In some embodiments, CVD processing may also be applied. By increasing the empty space of the air gaps, improved performance of the device may result.

As mentioned above, the selectivity may be expressed as the ratio of material formed on the first surface (A) minus the amount of material formed on the second surface (B) to amount of material formed on the first surface (A) (i.e., selectivity can be given as a percentage calculated by [(deposition on first surface)−(deposition on second surface)]/(deposition on the first surface) or [(A−B)/A]). Preferably, the selectivity may be above about 50%, above about 70%, above about 80%, above about 90%, above about 95%, above about 98%, above about 99% or about 100%. In some cases, selectivity above 80% may be acceptable for certain applications. In some cases, selectivity above 50% may be acceptable for certain applications. In some embodiments, the deposition temperature may be selected such that the selectivity is above about 95%. In some embodiments, the deposition temperature may be selected such that a selectivity of about 100% is achieved.

In some embodiments the thickness of the film that is selectively deposited is less than about 500 nm, less than about 250 nm, less than about 100 nm, less than about 50 nm or less than about 25 nm. In some embodiments, the thickness of the film that is selectively deposited may range from about 3 nm to about 200 nm or from about 5 nm to about 50 nm. However, in some cases a desired level of selectivity, for example more than 80%, or more than 90%, is achieved with the thicknesses of the selectively deposited film being over about 5 nm, over about 10 nm, over about 15 nm or over about 20 nm.

Figure 5:
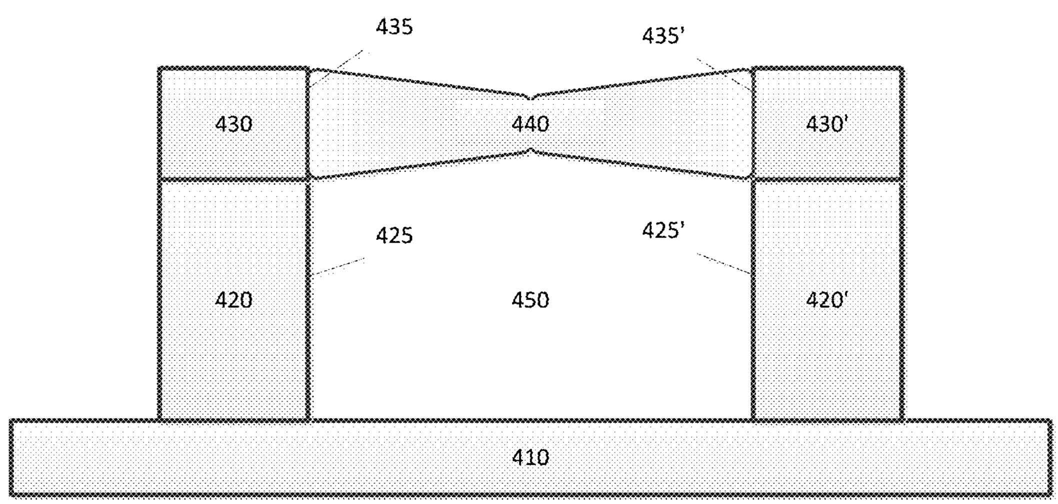
FIG. 5 is a cross-sectional view in accordance with at least one embodiment of the invention.

In some embodiments described above, one or more pretreatment and/or passivation processes or treatments of one or more of the surfaces of the substrate may be performed before selectively depositing the film. Passivation or pretreatments may enhance the selectivity and the growth on the desired surface and may decrease or block, in some instances almost completely block the growth on another surface. FIG. 5 illustrates such a structure in accordance with at least one embodiment of the invention. The structure may comprise a substrate 410, upon which a first column comprising a first layer 420 comprising a first surface comprising a first vertical portion 425 and a second layer 430 comprising a second surface comprising a second vertical portion 430 and a second column comprising a first layer 420' comprising a third surface comprising a third vertical portion and a second layer 430' comprising a fourth surface comprising a fourth vertical portion is formed. The first layer 420 and the first layer 420' may be subject to a pre-treatment or passivation step prior to the formation of a horizontal selective film 440. Once the formation of the horizontal selective film 440 is complete, an air gap 450 may be formed.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A method of forming an air gap for a semiconductor device through selective deposition comprising:

providing a substrate for processing in a reaction chamber;

forming a first surface overlying the substrate for selectively depositing a film, wherein the first surface comprises a first substantially vertical portion;

forming a second surface, wherein the second surface comprises a second substantially vertical portion; and selectively depositing the film at least on the first substantially vertical portion of the first surface relative to the second substantially vertical portion, wherein a portion of the film at least partially defines the air gap.

2. The method of claim 1, further comprising forming a third surface and forming a fourth surface, wherein the third surface comprises the same material as the first surface, wherein the fourth surface comprises the same material as the second surface, and wherein the deposition is selective on third surface relative to the deposition the fourth surface.

3. The method of claim 2, wherein both the third and the fourth surfaces comprise substantially vertical portions and selectively depositing the film comprises deposition on the said first and third vertical surfaces.

4. The method of claim 1, wherein the step of selectively depositing the film substantially closes the air gap.

5. The method of claim 1, further comprising:

forming a dielectric layer at least on top of the film, wherein the dielectric layer defines a portion of the air gap.

6. The method of claim 5, wherein the step of forming the dielectric layer comprises a non-conformal deposition process.

7. The method of claim 2, wherein the step of selectively depositing the film is performed such that the film grows horizontally from the first substantially vertical portion toward the third substantially vertical portion.

8. The method of claim 1, wherein the step of selectively depositing the film comprises chemical vapor deposition.

9. The method of claim 1, wherein the thickness of the film is greater than 10 nm.

10. The method of claim 1, wherein the selectivity of deposition of the film on the first substantially vertical portion of the first surface relative to the second substantially vertical portion is greater than 80%.

11. The method of claim 1, wherein the air gap is part of an integrated circuit and has a performance similar to dielectric material with k-value of less than 3.6.

12. The method of claim 1, wherein the air gap is part of an integrated circuit and size of the air gap is more than 35% of the space between metallization lines.

13. The method of claim 1, wherein the film comprises a low-k material.

14. The method of claim 1, wherein the film comprises an insulating material.

15. The method of claim 1, wherein the first surface comprises metal and the second surface comprises silicon.

16. The method of claim 1, wherein the step of selectively depositing the film comprises:

pulsing a metal halide precursor on the first substantially vertical surface;

pulsing an oxygen precursor on the first substantially vertical surface; and repeating the pulsing steps until the film grows to a desired thickness.

17. The method of claim 16, wherein the metal halide precursor comprises one or more of $NbCl_5$ and $TaCl_5$.

18. The method of claim 16, wherein the oxygen precursor comprises at least one of: water ($H_2O$), oxygen ($O_2$), ozone ($O_3$), hydrogen peroxide ($H_2O_2$), atomic oxygen (O), oxygen radicals, and oxygen plasma.

19. The method of claim 16, wherein a temperature of the reaction chamber ranges between 20 and 600° C.

20. The method of claim 1, wherein a portion of the first surface comprises a liner.

* * * * *